(12) United States Patent
Karagozler et al.

(10) Patent No.: US 10,175,781 B2
(45) Date of Patent: Jan. 8, 2019

(54) INTERACTIVE OBJECT WITH MULTIPLE ELECTRONICS MODULES

(71) Applicant: Google Inc., Mountain View, CA (US)

(72) Inventors: Mustafa Emre Karagozler, Mountain View, CA (US); Ivan Poupyrev, Sunnyvale, CA (US); Carsten C. Schwesig, San Francisco, CA (US); Hakim K. Raja, San Francisco, CA (US); Nan-Wei Gong, Cambridge, MA (US); Shiho Fukuhara, Tokyo (JP); Karen Elizabeth Robinson, Mountain View, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 15/362,359

(22) Filed: Nov. 28, 2016

(65) Prior Publication Data

US 2017/0329425 A1 Nov. 16, 2017

Related U.S. Application Data

(60) Provisional application No. 62/337,081, filed on May 16, 2016.

(51) Int. Cl.
*G09G 1/00* (2006.01)
*G06F 3/0354* (2013.01)
(Continued)

(52) U.S. Cl.
CPC ......... *G06F 3/03547* (2013.01); *A41D 1/002* (2013.01); *A41D 3/00* (2013.01);
(Continued)

(58) Field of Classification Search
CPC ... G06F 3/01; G06F 3/044; G06F 5/00; G06F 3/03547; G06F 3/0383; H03K 17/962
See application file for complete search history.

(56) References Cited

U.S. PATENT DOCUMENTS 3,610,874 A 10/1971 Gagliano
3,752,017 A 8/1973 Lloyd et al.
(Continued)

FOREIGN PATENT DOCUMENTS

CN 202887794 4/2013
CN 103355860 1/2016
(Continued)

OTHER PUBLICATIONS

"Corrected Notice of Allowance", U.S. Appl. No. 14/504,061, dated Dec. 27, 2016, 2 pages.
(Continued)

*Primary Examiner* — Michael Faragalla
(74) *Attorney, Agent, or Firm* — Colby Nipper

(57) ABSTRACT

This document describes an interactive object with multiple electronics modules. An interactive object (e.g., a garment) includes a grid or array of conductive thread woven into the interactive object, and an internal electronics module coupled to the grid of conductive thread. The internal electronics module includes a first subset of electronic components, such as sensing circuitry configured to detect touch-input to the grid of conductive thread. An external electronics module that includes a second subset of electronic components (e.g., a microprocessor, power source, or network interface) is removably coupled to the interactive object via a communication interface. The communication interface enables communication between the internal electronics module and the external electronics module when the external electronics module is coupled to the interactive object.

1 Claim, 7 Drawing Sheets

(51) Int. Cl.

| | | |
|---|---|---|
| *G06F 3/044* | (2006.01) | |
| *A41D 3/00* | (2006.01) | |
| *G06F 3/038* | (2013.01) | |
| *G06F 3/041* | (2006.01) | |
| *H05K 3/40* | (2006.01) | |
| *A41D 1/00* | (2018.01) | |
| *H05K 1/03* | (2006.01) | |
| *H05K 3/32* | (2006.01) | |

(52) U.S. Cl.
CPC ............ *G06F 3/0383* (2013.01); *G06F 3/041* (2013.01); *G06F 3/044* (2013.01); *H05K 3/4015* (2013.01); *A41D 1/005* (2013.01); *G06F 2203/0383* (2013.01); *G06F 2203/04102* (2013.01); *G06F 2203/04103* (2013.01); *H05K 1/038* (2013.01); *H05K 3/323* (2013.01)

(56) References Cited

U.S. PATENT DOCUMENTS

| | | |
|---|---|---|
| 3,953,706 A | 4/1976 | Harris et al. |
| 4,104,012 A | 8/1978 | Ferrante |
| 4,654,967 A | 4/1987 | Thenner |
| 4,700,044 A | 10/1987 | Hokanson et al. |
| 4,795,998 A | 1/1989 | Dunbar et al. |
| 4,838,797 A | 6/1989 | Dodier |
| 5,016,500 A | 5/1991 | Conrad et al. |
| 5,298,715 A | 3/1994 | Chalco et al. |
| 5,341,979 A | 8/1994 | Gupta |
| 5,468,917 A | 11/1995 | Brodsky et al. |
| 5,564,571 A | 10/1996 | Zanotti |
| 5,656,798 A | 8/1997 | Kubo et al. |
| 5,724,707 A | 3/1998 | Kirk et al. |
| 5,798,798 A | 8/1998 | Rector et al. |
| 6,032,450 A | 3/2000 | Blum |
| 6,080,690 A | 6/2000 | Lebby et al. |
| 6,101,431 A | 8/2000 | Niwa et al. |
| 6,210,771 B1 | 4/2001 | Post et al. |
| 6,313,825 B1 | 11/2001 | Gilbert |
| 6,340,979 B1 | 1/2002 | Beaton et al. |
| 6,386,757 B1 | 5/2002 | Konno |
| 6,440,593 B2 | 8/2002 | Ellison et al. |
| 6,492,980 B2 | 12/2002 | Sandbach |
| 6,493,933 B1 | 12/2002 | Post et al. |
| 6,513,970 B1 | 2/2003 | Tabata et al. |
| 6,543,668 B1 | 4/2003 | Fujii et al. |
| 6,711,354 B2 | 3/2004 | Kameyama |
| 6,717,065 B2 | 4/2004 | Hosaka et al. |
| 6,802,720 B2 | 10/2004 | Weiss et al. |
| 6,833,807 B2 | 12/2004 | Flacke et al. |
| 6,835,898 B2 | 12/2004 | Eldridge et al. |
| 6,854,985 B1 | 2/2005 | Weiss |
| 6,929,484 B2 | 8/2005 | Weiss et al. |
| 7,134,879 B2 | 11/2006 | Sugimoto et al. |
| 7,164,820 B2 | 1/2007 | Eves et al. |
| 7,223,105 B2 | 5/2007 | Weiss et al. |
| 7,230,610 B2 | 6/2007 | Jung et al. |
| 7,249,954 B2 | 7/2007 | Weiss |
| 7,299,964 B2 | 11/2007 | Jayaraman et al. |
| 7,310,236 B2 | 12/2007 | Takahashi et al. |
| 7,317,416 B2 | 1/2008 | Flom et al. |
| 7,348,285 B2 | 3/2008 | Dhawan et al. |
| 7,365,031 B2 | 4/2008 | Swallow et al. |
| 7,421,061 B2 | 9/2008 | Boese et al. |
| 7,462,035 B2 | 12/2008 | Lee et al. |
| 7,528,082 B2 | 5/2009 | Krans et al. |
| 7,544,627 B2 | 6/2009 | Tao et al. |
| 7,578,195 B2 | 8/2009 | DeAngelis et al. |
| 7,644,488 B2 | 1/2010 | Aisenbrey |
| 7,670,144 B2 | 3/2010 | Ito et al. |
| 7,677,729 B2 | 3/2010 | Vilser et al. |
| 7,691,067 B2 | 4/2010 | Westbrook et al. |
| 7,698,154 B2 | 4/2010 | Marchosky |
| 7,791,700 B2 | 9/2010 | Bellamy |
| 7,834,276 B2 | 11/2010 | Chou et al. |
| 7,941,676 B2 | 5/2011 | Glaser |
| 7,952,512 B1 | 5/2011 | Delker et al. |
| 8,062,220 B2 | 11/2011 | Kurtz et al. |
| 8,169,404 B1 | 5/2012 | Boillot |
| 8,179,604 B1 | 5/2012 | Prada Gomez et al. |
| 8,282,232 B2 | 10/2012 | Hsu et al. |
| 8,289,185 B2 | 10/2012 | Alonso |
| 8,301,232 B2 | 10/2012 | Albert et al. |
| 8,314,732 B2 | 11/2012 | Oswald et al. |
| 8,334,226 B2 | 12/2012 | Nhan et al. |
| 8,341,762 B2 | 1/2013 | Balzano |
| 8,344,949 B2 | 1/2013 | Moshfeghi |
| 8,367,942 B2 | 2/2013 | Howell et al. |
| 8,475,367 B1 | 7/2013 | Yuen et al. |
| 8,505,474 B2 | 8/2013 | Kang et al. |
| 8,514,221 B2 | 8/2013 | King et al. |
| 8,527,146 B1 | 9/2013 | Jackson et al. |
| 8,549,829 B2 | 10/2013 | Song et al. |
| 8,560,972 B2 | 10/2013 | Wilson |
| 8,569,189 B2 | 10/2013 | Bhattacharya et al. |
| 8,614,689 B2 | 12/2013 | Nishikawa et al. |
| 8,700,137 B2 | 4/2014 | Albert |
| 8,758,020 B2 | 6/2014 | Burdea et al. |
| 8,759,713 B2 | 6/2014 | Sheats |
| 8,764,651 B2 | 7/2014 | Tran |
| 8,785,778 B2 | 7/2014 | Streeter et al. |
| 8,790,257 B2 | 7/2014 | Libbus et al. |
| 8,814,574 B2 | 8/2014 | Selby et al. |
| 8,921,473 B1 | 12/2014 | Hyman |
| 8,948,839 B1 | 2/2015 | Longinotti-Buitoni et al. |
| 9,055,879 B2 | 6/2015 | Selby et al. |
| 9,093,289 B2 | 7/2015 | Vicard et al. |
| 9,125,456 B2 | 9/2015 | Chow |
| 9,141,194 B1 | 9/2015 | Keyes et al. |
| 9,148,949 B2 | 9/2015 | Zhou et al. |
| 9,230,160 B1 | 1/2016 | Kanter |
| 9,235,241 B2 | 1/2016 | Newham et al. |
| 9,331,422 B2 | 5/2016 | Nazzaro et al. |
| 9,335,825 B2 | 5/2016 | Rautiainen et al. |
| 9,354,709 B1 | 5/2016 | Heller et al. |
| 9,569,001 B2 | 2/2017 | Mistry et al. |
| 9,575,560 B2 | 2/2017 | Poupyrev et al. |
| 9,588,625 B2 | 3/2017 | Poupyrev |
| 9,594,443 B2 | 3/2017 | VanBlon et al. |
| 9,600,080 B2 | 3/2017 | Poupyrev |
| 9,693,592 B2 | 7/2017 | Robinson et al. |
| 9,766,742 B2 | 9/2017 | Papakostas |
| 9,778,749 B2 | 10/2017 | Poupyrev |
| 9,811,164 B2 | 11/2017 | Poupyrev |
| 9,817,109 B2 | 11/2017 | Saboo et al. |
| 9,837,760 B2 | 12/2017 | Karagozler et al. |
| 9,921,660 B2 | 3/2018 | Poupyrev |
| 9,933,908 B2 | 4/2018 | Poupyrev |
| 9,971,414 B2 | 5/2018 | Gollakota et al. |
| 9,971,415 B2 | 5/2018 | Poupyrev et al. |
| 9,983,747 B2 | 5/2018 | Poupyrev |
| 10,082,950 B2 | 9/2018 | Lapp |
| 10,088,908 B1 | 10/2018 | Poupyrev et al. |
| 2001/0035836 A1 | 11/2001 | Miceli et al. |
| 2002/0080156 A1 | 6/2002 | Abbott et al. |
| 2002/0170897 A1 | 11/2002 | Hall |
| 2003/0100228 A1 | 5/2003 | Bungo et al. |
| 2003/0119391 A1 | 6/2003 | Swallow et al. |
| 2004/0009729 A1 | 1/2004 | Hill et al. |
| 2004/0259391 A1 | 12/2004 | Jung et al. |
| 2005/0069695 A1 | 3/2005 | Jung et al. |
| 2005/0128124 A1 | 6/2005 | Greneker et al. |
| 2005/0148876 A1 | 7/2005 | Endoh et al. |
| 2006/0035554 A1 | 2/2006 | Glaser et al. |
| 2006/0040739 A1 | 2/2006 | Wells |
| 2006/0047386 A1 | 3/2006 | Kanevsky et al. |
| 2006/0061504 A1 | 3/2006 | Leach, Jr. et al. |
| 2006/0125803 A1 | 6/2006 | Westerman et al. |
| 2006/0136997 A1 | 6/2006 | Telek et al. |
| 2006/0148351 A1 | 7/2006 | Tao et al. |
| 2006/0157734 A1 | 7/2006 | Onodero et al. |
| 2006/0166620 A1 | 7/2006 | Sorensen |
| 2006/0170584 A1 | 8/2006 | Romero et al. |

(56) References Cited

U.S. PATENT DOCUMENTS

| | | |
|---|---|---|
| 2006/0209021 A1 | 9/2006 | Yoo et al. |
| 2006/0258205 A1 | 11/2006 | Locher et al. |
| 2007/0024488 A1 | 2/2007 | Zemany et al. |
| 2007/0026695 A1 | 2/2007 | Lee et al. |
| 2007/0118043 A1 | 5/2007 | Oliver et al. |
| 2007/0161921 A1 | 7/2007 | Rausch |
| 2007/0176821 A1 | 8/2007 | Flom et al. |
| 2007/0192647 A1 | 8/2007 | Glaser |
| 2007/0197115 A1 | 8/2007 | Eves et al. |
| 2007/0197878 A1 | 8/2007 | Shklarski |
| 2007/0210074 A1 | 9/2007 | Maurer et al. |
| 2007/0237423 A1 | 10/2007 | Tico et al. |
| 2008/0002027 A1 | 1/2008 | Kondo et al. |
| 2008/0024438 A1 | 1/2008 | Collins et al. |
| 2008/0065291 A1 | 3/2008 | Breed |
| 2008/0134102 A1 | 6/2008 | Movold et al. |
| 2008/0136775 A1 | 6/2008 | Conant |
| 2008/0168396 A1 | 7/2008 | Matas et al. |
| 2008/0211766 A1 | 9/2008 | Westerman et al. |
| 2008/0233822 A1 | 9/2008 | Swallow et al. |
| 2008/0282665 A1 | 11/2008 | Speleers |
| 2008/0291158 A1 | 11/2008 | Park et al. |
| 2008/0303800 A1 | 12/2008 | Elwell |
| 2008/0316085 A1 | 12/2008 | Rofougaran et al. |
| 2008/0320419 A1 | 12/2008 | Matas et al. |
| 2009/0018428 A1 | 1/2009 | Dias et al. |
| 2009/0033585 A1 | 2/2009 | Lang |
| 2009/0053950 A1 | 2/2009 | Surve |
| 2009/0056300 A1 | 3/2009 | Chung et al. |
| 2009/0058820 A1 | 3/2009 | Hinckley |
| 2009/0113298 A1 | 4/2009 | Jung et al. |
| 2009/0115617 A1 | 5/2009 | Sano et al. |
| 2009/0118648 A1 | 5/2009 | Kandori et al. |
| 2009/0149036 A1 | 6/2009 | Lee et al. |
| 2009/0177068 A1 | 7/2009 | Stivoric et al. |
| 2009/0203244 A1 | 8/2009 | Toonder |
| 2009/0270690 A1 | 10/2009 | Roos et al. |
| 2009/0278915 A1 | 11/2009 | Kramer et al. |
| 2009/0288762 A1 | 11/2009 | Wolfel |
| 2009/0295712 A1 | 12/2009 | Ritzau |
| 2009/0319181 A1 | 12/2009 | Khosravy et al. |
| 2010/0050133 A1 | 2/2010 | Nishihara et al. |
| 2010/0053151 A1 | 3/2010 | Marti et al. |
| 2010/0065320 A1 | 3/2010 | Urano |
| 2010/0071205 A1 | 3/2010 | Graumann et al. |
| 2010/0094141 A1 | 4/2010 | Puswella |
| 2010/0201586 A1 | 8/2010 | Michalk |
| 2010/0205667 A1 | 8/2010 | Anderson et al. |
| 2010/0208035 A1 | 8/2010 | Pinault et al. |
| 2010/0225562 A1 | 9/2010 | Smith |
| 2010/0234094 A1 | 9/2010 | Gagner et al. |
| 2010/0241009 A1 | 9/2010 | Petkie |
| 2010/0281438 A1 | 11/2010 | Latta et al. |
| 2010/0306713 A1 | 12/2010 | Geisner et al. |
| 2010/0313414 A1 | 12/2010 | Sheats |
| 2010/0325770 A1 | 12/2010 | Chung et al. |
| 2011/0003664 A1 | 1/2011 | Richard |
| 2011/0010014 A1 | 1/2011 | Oexman et al. |
| 2011/0073353 A1 | 3/2011 | Lee et al. |
| 2011/0093820 A1 | 4/2011 | Zhang et al. |
| 2011/0166940 A1 | 7/2011 | Bangera et al. |
| 2011/0181509 A1 | 7/2011 | Rautiainen et al. |
| 2011/0181510 A1 | 7/2011 | Hakala et al. |
| 2011/0197263 A1 | 8/2011 | Stinson, III |
| 2011/0213218 A1 | 9/2011 | Weiner et al. |
| 2011/0221666 A1 | 9/2011 | Newton et al. |
| 2011/0234492 A1 | 9/2011 | Ajmera et al. |
| 2011/0279303 A1 | 11/2011 | Smith |
| 2011/0286585 A1 | 11/2011 | Hodge |
| 2011/0303341 A1 | 12/2011 | Meiss et al. |
| 2011/0307842 A1 | 12/2011 | Chiang et al. |
| 2011/0318985 A1 | 12/2011 | McDermid |
| 2012/0001875 A1 | 1/2012 | Li et al. |
| 2012/0019168 A1 | 1/2012 | Noda et al. |
| 2012/0047468 A1 | 2/2012 | Santos et al. |
| 2012/0068876 A1 | 3/2012 | Bangera et al. |
| 2012/0092284 A1 | 4/2012 | Rofougaran et al. |
| 2012/0123232 A1 | 5/2012 | Najarian et al. |
| 2012/0127082 A1 | 5/2012 | Kushler et al. |
| 2012/0144934 A1 | 6/2012 | Russell et al. |
| 2012/0150493 A1 | 6/2012 | Casey et al. |
| 2012/0154313 A1 | 6/2012 | Au et al. |
| 2012/0156926 A1 | 6/2012 | Kato et al. |
| 2012/0174299 A1 | 7/2012 | Balzano |
| 2012/0174736 A1 | 7/2012 | Wang et al. |
| 2012/0193801 A1 | 8/2012 | Gross et al. |
| 2012/0248093 A1 | 10/2012 | Ulrich et al. |
| 2012/0254810 A1 | 10/2012 | Heck et al. |
| 2012/0268416 A1 | 10/2012 | Pirogov et al. |
| 2012/0280900 A1 | 11/2012 | Wang et al. |
| 2012/0298748 A1 | 11/2012 | Factor et al. |
| 2012/0310665 A1 | 12/2012 | Xu et al. |
| 2013/0016070 A1 | 1/2013 | Starner et al. |
| 2013/0027218 A1 | 1/2013 | Schwarz et al. |
| 2013/0046544 A1 | 2/2013 | Kay et al. |
| 2013/0053653 A1 | 2/2013 | Cuddihy et al. |
| 2013/0078624 A1 | 3/2013 | Holmes et al. |
| 2013/0082922 A1 | 4/2013 | Miller |
| 2013/0083173 A1 | 4/2013 | Geisner et al. |
| 2013/0102217 A1 | 4/2013 | Jeon |
| 2013/0104084 A1 | 4/2013 | Mlyniec et al. |
| 2013/0117377 A1 | 5/2013 | Miller |
| 2013/0132931 A1 | 5/2013 | Bruns et al. |
| 2013/0147833 A1 | 6/2013 | Aubauer et al. |
| 2013/0150735 A1 | 6/2013 | Cheng |
| 2013/0161078 A1 | 6/2013 | Li |
| 2013/0169471 A1 | 7/2013 | Lynch |
| 2013/0194173 A1 | 8/2013 | Zhu et al. |
| 2013/0195330 A1 | 8/2013 | Kim et al. |
| 2013/0196716 A1 | 8/2013 | Muhammad |
| 2013/0207962 A1 | 8/2013 | Oberdorfer et al. |
| 2013/0253029 A1 | 9/2013 | Jain et al. |
| 2013/0260630 A1 | 10/2013 | Ito et al. |
| 2013/0278499 A1 | 10/2013 | Anderson |
| 2013/0278501 A1 | 10/2013 | Bulzacki |
| 2013/0332438 A1 | 12/2013 | Li et al. |
| 2013/0345569 A1 | 12/2013 | Mestha et al. |
| 2014/0005809 A1 | 1/2014 | Frei et al. |
| 2014/0028539 A1 | 1/2014 | Newham et al. |
| 2014/0049487 A1 | 2/2014 | Konertz et al. |
| 2014/0050354 A1 | 2/2014 | Heim et al. |
| 2014/0070957 A1 | 3/2014 | Longinotti-Buitoni et al. |
| 2014/0073969 A1 | 3/2014 | Zou et al. |
| 2014/0081100 A1 | 3/2014 | Muhsin et al. |
| 2014/0095480 A1 | 4/2014 | Marantz et al. |
| 2014/0121540 A1 | 5/2014 | Raskin |
| 2014/0135631 A1 | 5/2014 | Brumback et al. |
| 2014/0139422 A1 | 5/2014 | Mistry et al. |
| 2014/0139616 A1 | 5/2014 | Pinter et al. |
| 2014/0143678 A1 | 5/2014 | Mistry et al. |
| 2014/0184496 A1 | 7/2014 | Gribetz et al. |
| 2014/0184499 A1 | 7/2014 | Kim |
| 2014/0191939 A1 | 7/2014 | Penn et al. |
| 2014/0200416 A1 | 7/2014 | Kashef et al. |
| 2014/0201690 A1 | 7/2014 | Holz |
| 2014/0208275 A1 | 7/2014 | Mongia et al. |
| 2014/0215389 A1 | 7/2014 | Walsh et al. |
| 2014/0239065 A1 | 8/2014 | Zhou et al. |
| 2014/0244277 A1 | 8/2014 | Krishna Rao et al. |
| 2014/0246415 A1 | 9/2014 | Wittkowski |
| 2014/0247212 A1 | 9/2014 | Kim et al. |
| 2014/0250515 A1 | 9/2014 | Jakobsson |
| 2014/0253431 A1 | 9/2014 | Gossweiler et al. |
| 2014/0253709 A1 | 9/2014 | Bresch et al. |
| 2014/0262478 A1 | 9/2014 | Harris et al. |
| 2014/0280295 A1 | 9/2014 | Kurochikin et al. |
| 2014/0281975 A1 | 9/2014 | Anderson |
| 2014/0282877 A1 | 9/2014 | Mahaffey et al. |
| 2014/0297006 A1 | 10/2014 | Sadhu |
| 2014/0298266 A1 | 10/2014 | Lapp |
| 2014/0306936 A1 | 10/2014 | Dahl et al. |
| 2014/0316261 A1 | 10/2014 | Lux et al. |
| 2014/0318699 A1 | 10/2014 | Longinotti-Buitoni et al. |
| 2014/0324888 A1 | 10/2014 | Xie et al. |

(56) References Cited

U.S. PATENT DOCUMENTS

| | | |
|---|---|---|
| 2014/0333467 A1 | 11/2014 | Inomata |
| 2014/0343392 A1 | 11/2014 | Yang |
| 2014/0347295 A1 | 11/2014 | Kim et al. |
| 2014/0357369 A1 | 12/2014 | Callens et al. |
| 2014/0368441 A1 | 12/2014 | Touloumtzis |
| 2015/0002391 A1 | 1/2015 | Chen |
| 2015/0009096 A1 | 1/2015 | Lee et al. |
| 2015/0029050 A1 | 1/2015 | Driscoll et al. |
| 2015/0030256 A1 | 1/2015 | Brady et al. |
| 2015/0040040 A1 | 2/2015 | Balan et al. |
| 2015/0062033 A1 | 3/2015 | Ishihara |
| 2015/0068069 A1 | 3/2015 | Tran et al. |
| 2015/0077282 A1 | 3/2015 | Mohamadi |
| 2015/0085060 A1 | 3/2015 | Fish et al. |
| 2015/0091820 A1 | 4/2015 | Rosenberg et al. |
| 2015/0091858 A1 | 4/2015 | Rosenberg et al. |
| 2015/0091859 A1 | 4/2015 | Rosenberg et al. |
| 2015/0112606 A1 | 4/2015 | He et al. |
| 2015/0133017 A1 | 5/2015 | Liao et al. |
| 2015/0143601 A1 | 5/2015 | Longinotti-Buitoni et al. |
| 2015/0145805 A1 | 5/2015 | Liu |
| 2015/0162729 A1 | 6/2015 | Reversat et al. |
| 2015/0177866 A1 | 6/2015 | Hwang et al. |
| 2015/0185314 A1 | 7/2015 | Corcos et al. |
| 2015/0199045 A1 | 7/2015 | Robucci et al. |
| 2015/0226004 A1 | 8/2015 | Thompson |
| 2015/0256763 A1 | 9/2015 | Niemi |
| 2015/0261320 A1 | 9/2015 | Leto |
| 2015/0268027 A1 | 9/2015 | Gerdes |
| 2015/0268799 A1 | 9/2015 | Starner et al. |
| 2015/0277569 A1 | 10/2015 | Sprenger et al. |
| 2015/0280102 A1 | 10/2015 | Tajitsu et al. |
| 2015/0312041 A1 | 10/2015 | Choi |
| 2015/0317518 A1 | 11/2015 | Fujimaki et al. |
| 2015/0323993 A1 | 11/2015 | Levesque et al. |
| 2015/0332075 A1 | 11/2015 | Burch |
| 2015/0341550 A1 | 11/2015 | Lay |
| 2015/0346820 A1 | 12/2015 | Poupyrev et al. |
| 2015/0375339 A1 | 12/2015 | Sterling et al. |
| 2016/0018948 A1 | 1/2016 | Parvarandeh et al. |
| 2016/0026253 A1 | 1/2016 | Bradski et al. |
| 2016/0038083 A1 | 2/2016 | Ding et al. |
| 2016/0041617 A1 | 2/2016 | Poupyrev |
| 2016/0041618 A1 | 2/2016 | Poupyrev |
| 2016/0042169 A1 | 2/2016 | Polehn |
| 2016/0048235 A1 | 2/2016 | Poupyrev |
| 2016/0048236 A1 | 2/2016 | Poupyrev |
| 2016/0048672 A1 | 2/2016 | Lux et al. |
| 2016/0054792 A1 | 2/2016 | Poupyrev |
| 2016/0054803 A1 | 2/2016 | Poupyrev |
| 2016/0054804 A1 | 2/2016 | Gollakata et al. |
| 2016/0055201 A1 | 2/2016 | Poupyrev et al. |
| 2016/0090839 A1 | 3/2016 | Stolarcyzk |
| 2016/0098089 A1 | 4/2016 | Poupyrev |
| 2016/0100166 A1 | 4/2016 | Dragne et al. |
| 2016/0103500 A1 | 4/2016 | Hussey et al. |
| 2016/0106328 A1 | 4/2016 | Mestha et al. |
| 2016/0145776 A1 | 5/2016 | Roh |
| 2016/0170491 A1 | 6/2016 | Jung |
| 2016/0171293 A1 | 6/2016 | Li et al. |
| 2016/0186366 A1 | 6/2016 | McMaster |
| 2016/0216825 A1 | 7/2016 | Forutanpour |
| 2016/0249698 A1 | 9/2016 | Berzowska et al. |
| 2016/0253044 A1 | 9/2016 | Katz |
| 2016/0259037 A1 | 9/2016 | Molchanov et al. |
| 2016/0282988 A1 | 9/2016 | Poupyrev |
| 2016/0283101 A1 | 9/2016 | Schwesig et al. |
| 2016/0284436 A1 | 9/2016 | Fukuhara et al. |
| 2016/0299526 A1 | 10/2016 | Inagaki et al. |
| 2016/0320852 A1 | 11/2016 | Poupyrev |
| 2016/0320853 A1 | 11/2016 | Lien et al. |
| 2016/0320854 A1 | 11/2016 | Lien et al. |
| 2016/0321428 A1 | 11/2016 | Rogers |
| 2016/0345638 A1 | 12/2016 | Robinson et al. |
| 2016/0349790 A1 | 12/2016 | Connor |
| 2016/0349845 A1 | 12/2016 | Poupyrev et al. |
| 2016/0377712 A1 | 12/2016 | Ivu et al. |
| 2017/0052618 A1 | 2/2017 | Lee et al. |
| 2017/0060254 A1 | 3/2017 | Molchanov et al. |
| 2017/0060298 A1* | 3/2017 | Hwang .............. A61B 5/6807 |
| 2017/0075481 A1 | 3/2017 | Chou et al. |
| 2017/0075496 A1 | 3/2017 | Rosenberg et al. |
| 2017/0097413 A1 | 4/2017 | Gillian et al. |
| 2017/0097684 A1 | 4/2017 | Lien |
| 2017/0115777 A1 | 4/2017 | Poupyrev |
| 2017/0125940 A1 | 5/2017 | Karagozler et al. |
| 2017/0192523 A1 | 7/2017 | Poupyrev |
| 2017/0196513 A1 | 7/2017 | Longinotti-Buitoni et al. |
| 2017/0232538 A1 | 8/2017 | Robinson et al. |
| 2017/0233903 A1 | 8/2017 | Jeon |
| 2017/0249033 A1* | 8/2017 | Podhajny .............. G06F 3/044 |
| 2017/0322633 A1 | 11/2017 | Shen et al. |
| 2017/0325337 A1 | 11/2017 | Karagozler et al. |
| 2017/0325518 A1 | 11/2017 | Poupyrev et al. |
| 2018/0004301 A1 | 1/2018 | Poupyrev |
| 2018/0005766 A1 | 1/2018 | Fairbanks et al. |
| 2018/0046258 A1 | 2/2018 | Poupyrev |
| 2018/0157330 A1 | 6/2018 | Gu et al. |
| 2018/0160943 A1 | 6/2018 | Fyfe et al. |
| 2018/0196527 A1 | 7/2018 | Poupyrev et al. |

FOREIGN PATENT DOCUMENTS

| | | |
|---|---|---|
| DE | 102011075725 | 11/2012 |
| DE | 102013201359 | 7/2014 |
| EP | 0161895 | 11/1985 |
| EP | 1815788 | 8/2007 |
| GB | 2070469 | 9/1981 |
| GB | 2443208 | 4/2008 |
| JP | 2003280049 | 10/2003 |
| JP | 2006234716 | 9/2006 |
| JP | 2011102457 | 5/2011 |
| WO | WO-0130123 | 4/2001 |
| WO | WO-2001027855 | 4/2001 |
| WO | WO-0175778 | 10/2001 |
| WO | WO-2002082999 | 10/2002 |
| WO | WO-2005033387 | 4/2005 |
| WO | 2007125298 | 11/2007 |
| WO | WO-2008061385 | 5/2008 |
| WO | WO-2009032073 | 3/2009 |
| WO | 2009083467 | 7/2009 |
| WO | WO-2010032173 | 3/2010 |
| WO | WO-2012026013 | 3/2012 |
| WO | WO-2012152476 | 11/2012 |
| WO | WO-2013082806 | 6/2013 |
| WO | WO-2013084108 | 6/2013 |
| WO | WO-2013186696 | 12/2013 |
| WO | WO-2013191657 | 12/2013 |
| WO | WO-2014019085 | 2/2014 |
| WO | WO-2014116968 | 7/2014 |
| WO | WO-2014136027 | 9/2014 |
| WO | WO-2014138280 | 9/2014 |
| WO | WO-2014160893 | 10/2014 |
| WO | WO-2014165476 | 10/2014 |
| WO | WO-2014204323 | 12/2014 |
| WO | WO-2015017931 | 2/2015 |
| WO | WO-2015022671 | 2/2015 |
| WO | 2016053624 | 4/2016 |
| WO | 2017200570 | 11/2017 |
| WO | 20170200949 | 11/2017 |
| WO | 2018106306 | 6/2018 |

OTHER PUBLICATIONS

"Corrected Notice of Allowance", U.S. Appl. No. 14/582,896, dated Dec. 19, 2016, 2 pages.
"International Search Report and Written Opinion", Application No. PCT/US2016/024289, dated Aug. 25, 2016, 17 pages.
Cheng,"Smart Textiles: From Niche to Mainstream", IEEE Pervasive Computing, Jul. 2013, pp. 81-84.
Farringdon,"Wearable Sensor Badge & Sensor Jacket for Context Awareness", Third International Symposium on Wearable Computers, Oct. 1999, 7 pages.

(56) References Cited

OTHER PUBLICATIONS

Schneegass,"Towards a Garment OS: Supporting Application Development for Smart Garments", Wearable Computers, ACM, Sep. 2014, 6 pages.
"Combined Search and Examination Report", GB Application No. 1620891.0, dated May 31, 2017, 9 pages.
"Final Office Action", U.S. Appl. No. 15/398,147, dated Jun. 30, 2017, 11 pages.
"Final Office Action", U.S. Appl. No. 14/874,955, dated Jun. 30, 2017, 9 pages.
"Final Office Action", U.S. Appl. No. 14/959,799, dated Jul. 19, 2017, 12 pages.
"Final Office Action", U.S. Appl. No. 14/504,121, dated Aug. 8, 2017, 16 pages.
"International Search Report and Written Opinion", Application No. PCT/US2016/063874, dated May 11, 2017, 19 pages.
"Non-Final Office Action", U.S. Appl. No. 14/862,409, dated Jun. 22, 2017, 15 pages.
"Non-Final Office Action", U.S. Appl. No. 14/959,730, dated Jun. 23, 2017, 14 pages.
"Notice of Allowance", U.S. Appl. No. 14/513,875, dated Jun. 28, 2017, 7 pages.
"Notice of Allowance", U.S. Appl. No. 15/343,067, dated Jul. 27, 2017, 9 pages.
"Notice of Allowance", U.S. Appl. No. 14/504,038, dated Aug. 7, 2017, 17 pages.
"Cardiio", Retrieved From: <http://www.cardiio.com/> Apr. 15, 2015 App Information Retrieved From: <https://itunes.apple.com/us/app/cardiio-touchless-camera-pulse/id542891434?Is=1&mt=8> Apr. 15, 2015, Feb. 24, 2015, 6 pages.
"Corrected Notice of Allowance", U.S. Appl. No. 14/312,486, dated Oct. 28, 2016, 4 pages.
"Extended European Search Report", EP Application No. 15170577.9, dated Nov. 5, 2015, 12 pages.
"Final Office Action", U.S. Appl. No. 14/312,486, dated Jun. 3, 2016, 32 pages.
"Final Office Action", U.S. Appl. No. 14/504,038, dated Sep. 27, 2016, 23 pages.
"Final Office Action", U.S. Appl. No. 14/504,061, dated Mar. 9, 2016, 10 pages.
"Frogpad Introduces Wearable Fabric Keyboard with Bluetooth Technology", Retrieved From: <http://www.geekzone.co.nz/content.asp?contentid=3898> Mar. 16, 2015, Jan. 7, 2005, 2 pages.
"International Search Report and Written Opinion", Application No. PCT/US2015/044774, dated Nov. 3, 2015, 12 pages.
"International Search Report and Written Opinion", Application No. PCT/US2016/024267, dated Jun. 20, 2016, 13 pages.
"International Search Report and Written Opinion", Application No. PCT/US2016/024273, dated Jun. 20, 2016, 13 pages.
"International Search Report and Written Opinion", Application No. PCT/US2016/032307, dated Aug. 25, 2016, 13 pages.
"International Search Report and Written Opinion", Application No. PCT/US2016/029820, dated Jul. 15, 2016, 14 pages.
"International Search Report and Written Opinion", Application No. PCT/US2016/030177, dated Aug. 2, 2016, 15 pages.
"International Search Report and Written Opinion", Application No. PCT/US2015/043963, dated Nov. 24, 2015, 16 pages.
"International Search Report and Written Opinion", Application No. PCT/US2015/050903, dated Feb. 19, 2016, 18 pages.
"International Search Report and Written Opinion", Application No. PCT/US2016/030115, dated Aug. 8, 2016, 18 pages.
"International Search Report and Written Opinion", Application No. PCT/US2015/043949, dated Dec. 1, 2015, 18 pages.
"Non-Final Office Action", U.S. Appl. No. 14/312,486, dated Oct. 23, 2015, 25 pages.
"Non-Final Office Action", U.S. Appl. No. 14/504,038, dated Feb. 26, 2016, 22 pages.
"Non-Final Office Action", U.S. Appl. No. 14/504,061, dated Nov. 4, 2015, 8 pages.
"Non-Final Office Action", U.S. Appl. No. 14/518,863, dated Oct. 14, 2016, 16 pages.
"Non-Final Office Action", U.S. Appl. No. 14/582,896, dated Jun. 29, 2016, 9 pages.
"Non-Final Office Action", U.S. Appl. No. 14/666,155, dated Aug. 24, 2016, 9 pages.
"Non-Final Office Action", U.S. Appl. No. 14/681,625, dated Aug. 12, 2016, 9 pages.
"Non-Final Office Action", U.S. Appl. No. 14/930,220, dated Sep. 14, 2016, 15 pages.
"Notice of Allowance", U.S. Appl. No. 14/312,486, dated Oct. 7, 2016, 15 pages.
"Notice of Allowance", U.S. Appl. No. 14/504,061, dated Sep. 12, 2016, 7 pages.
"Notice of Allowance", U.S. Appl. No. 14/582,896, dated Nov. 7, 2016, 5 pages.
"Philips Vital Signs Camera", Retrieved From: <http://www.vitalsignscamera.com/> Apr. 15, 2015, Jul. 17, 2013, 2 pages.
"Pre-Interview Communication", U.S. Appl. No. 14/513,875, dated Oct. 21, 2016, 3 pages.
"Restriction Requirement", U.S. Appl. No. 14/666,155, dated Jul. 22, 2016, 5 pages.
"The Instant Blood Pressure app estimates blood pressure with your smartphone and our algorithm", Retrieved at: http://www.instantbloodpressure.com/—on Jun. 23, 2016, 6 pages.
Arbabian,"A 94GHz mm-Wave to Baseband Pulsed-Radar for Imaging and Gesture Recognition", 2012 IEEE, 2012 Symposium on VLSI Circuits Digest of Technical Papers, 2012, 2 pages.
Balakrishnan,"Detecting Pulse from Head Motions in Video", In Proceedings: CVPR '13 Proceedings of the 2013 IEEE Conference on Computer Vision and Pattern Recognition Available at: <http://people.csail.mit.edu/mrub/vidmag/papers/Balakrishnan_Detecting_Pulse_from_2013_CVPR_paper.pdf>, Jun. 23, 2013, 8 pages.
Couderc,"Detection of Atrial Fibrillation using Contactless Facial Video Monitoring", In Proceedings: Heart Rhythm Society, vol. 12, Issue 1 Available at: <http://www.heartrhythmjournal.com/article/S1547-5271(14)00924-2/pdf>, Jan. 2015, 7 pages.
Espina,"Wireless Body Sensor Network for Continuous Cuff-less Blood Pressure Monitoring", International Summer School on Medical Devices and Biosensors, 2006, Sep. 2006, 5 pages.
Godana,"Human Movement Characterization in Indoor Environment using GNU Radio Based Radar", Retrieved at: http://repository.tudelft.nl/islandora/object/uuid:414e1868-dd00-4113-9989-4c213f1f7094?collection=education, Nov. 30, 2009, 100 pages.
He,"A Continuous, Wearable, and Wireless Heart Monitor Using Head Ballistocardiogram (BCG) and Head Electrocardiogram (ECG) with a Nanowatt ECG Heartbeat Detection Circuit", In Proceedings: Thesis, Department of Electrical Engineering and Computer Science, Massachusetts Institute of Technology Available at: <http://dspace.mit.edu/handle/1721.1/79221>, Feb. 2013, 137 pages.
Holleis,"Evaluating Capacitive Touch Input on Clothes", Proceedings of the 10th International Conference on Human Computer Interaction, Jan. 1, 2008, 10 pages.
Nakajima,"Development of Real-Time Image Sequence Analysis for Evaluating Posture Change and Respiratory Rate of a Subject in Bed", In Proceedings: Physiological Measurement, vol. 22, No. 3 Retrieved From: <http://iopscience.iop.org/0967-3334/22/3/401/pdf/0967-3334_22_3_401.pdf> Feb. 27, 2015, Aug. 2001, 8 pages.
Patel,"Applications of Electrically Conductive Yarns in Technical Textiles", International Conference on Power System Technology (POWECON), Oct. 30, 2012, 6 pages.
Poh,"A Medical Mirror for Non-contact Health Monitoring", In Proceedings: ACM SIGGRAPH Emerging Technologies Available at: <http://affect.media.mit.edu/pdfs/11.Poh-etal-SIGGRAPH.pdf>, 2011, 1 page.
Poh,"Non-contact, Automated Cardiac Pulse Measurements Using Video Imaging and Blind Source Separation.", In Proceedings: Optics Express, vol. 18, No. 10 Available at: <http://www.opticsinfobase.org/view_article.cfm?gotourl=http%3A%2F%2Fwww%2Eopticsinfobase%2Eorg%2FDirectPDFAccess%2 F77B04D55%2DBC95%2D6937%2 D5BAC49A426378C02%5F199381%2Foe%2D18%2D10%2D10762%2EP, May 7, 2010, 13 pages.

(56) References Cited

OTHER PUBLICATIONS

Pu, "Gesture Recognition Using Wireless Signals", Oct. 2014, pp. 15-18.
Pu, "Whole-Home Gesture Recognition Using Wireless Signals", MobiCom '13 Proceedings of the 19th annual international conference on Mobile computing & networking, Aug. 27, 2013, 12 pages.
Wang, "Exploiting Spatial Redundancy of Image Sensor for Motion Robust rPPG", In Proceedings: IEEE Transactions on Biomedical Engineering, vol. 62, Issue 2, Jan. 19, 2015, 11 pages.
Wang, "Micro-Doppler Signatures for Intelligent Human Gait Recognition Using a UWB Impulse Radar", 2011 IEEE International Symposium on Antennas and Propagation (APSURSI), Jul. 3, 2011, pp. 2103-2106.
Wijesiriwardana, "Capacitive Fibre-Meshed Transducer for Touch & Proximity Sensing Applications", IEEE Sensors Journal, IEEE Service Center, Oct. 1, 2005, 5 pages.
Zhadobov, "Millimeter-wave Interactions with the Human Body: State of Knowledge and Recent Advances", International Journal of Microwave and Wireless Technologies, Mar. 1, 2011, 11 pages.
Zhang, "Study of the Structural Design and Capacitance Characteristics of Fabric Sensor", Advanced Materials Research (vols. 194-196), Feb. 21, 2011, 8 pages.
"Final Office Action", U.S. Appl. No. 15/142,619, dated Feb. 8, 2018, 15 pages.
"Final Office Action", U.S. Appl. No. 15/093,533, dated Mar. 21, 2018, 19 pages.
"First Action Interview Office Action", U.S. Appl. No. 15/286,152, dated Mar. 1, 2018, 5 pages.
"Foreign Office Action", Chinese Application No. 201721290290.3, dated Mar. 9, 2018, 2 pages.
"Non-Final Office Action", U.S. Appl. No. 15/267,181, dated Feb. 8, 2018, 29 pages.
"Non-Final Office Action", U.S. Appl. No. 14/874,955, dated Feb. 8, 2018, 7 pages.
"Notice of Allowance", U.S. Appl. No. 14/959,730, dated Feb. 22, 2018, 8 pages.
"Pre-Interview Communication", U.S. Appl. No. 15/166,198, dated Mar. 8, 2018, 8 pages.
"Pre-Interview First Office Action", U.S. Appl. No. 15/286,152, dated Feb. 8, 2018, 4 pages.
"Advisory Action", U.S. Appl. No. 14/504,139, dated Aug. 28, 2017, 3 pages.
"Final Office Action", U.S. Appl. No. 14/959,901, dated Aug. 25, 2017, 19 pages.
"Final Office Action", U.S. Appl. No. 15/403,066, dated Oct. 5, 2017, 31 pages.
"Non-Final Office Action", U.S. Appl. No. 15/093,533, dated Aug. 24, 2017, 18 pages.
"Non-Final Office Action", U.S. Appl. No. 15/142,619, dated Aug. 25, 2017, 16 pages.
"Non-Final Office Action", U.S. Appl. No. 14/959,799, dated Sep. 8, 2017, 16 pages.
"Non-Final Office Action", U.S. Appl. No. 15/398,147, dated Sep. 8, 2017, 7 pages.
"Non-Final Office Action", U.S. Appl. No. 14/518,863, dated Sep. 29, 2017, 20 pages.
"Non-Final Office Action", U.S. Appl. No. 15/142,689, dated Oct. 4, 2017, 18 pages.
"Pre-Interview Office Action", U.S. Appl. No. 14/862,409, dated Sep. 15, 2017, 16 pages.
"Written Opinion", PCT Application No. PCT/US2017/032733, dated Jul. 26, 2017, 5 pages.
"Combined Search and Examination Report", GB Application No. 1620892.8, dated Apr. 6, 2017, 5 pages.
"Corrected Notice of Allowance", U.S. Appl. No. 14/930,220, dated Mar. 20, 2017, 2 pages.
"Corrected Notice of Allowance", U.S. Appl. No. 14/930,220, dated May 11, 2017, 2 pages.
"Final Office Action", U.S. Appl. No. 14/518,863, dated May 5, 2017, 18 pages.
"First Action Interview Office Action", U.S. Appl. No. 14/959,901, dated Apr. 14, 2017, 3 pages.
"International Preliminary Report on Patentability", Application No. PCT/US2015/050903, dated Apr. 13, 2017, 12 pages.
"International Search Report and Written Opinion", Application No. PCT/US2016/060399, dated Jan. 30, 2017, 11 pages.
"Non-Final Office Action", U.S. Appl. No. 14/504,038, dated Mar. 22, 2017, 33 pages.
"Non-Final Office Action", U.S. Appl. No. 15/403,066, dated May 4, 2017, 31 pages.
"Notice of Allowance", U.S. Appl. No. 14/494,863, dated May 30, 2017, 7 pages.
"Pre-Interview Communication", U.S. Appl. No. 15/343,067, dated Apr. 19, 2017, 3 pages.
"Textile Wire Brochure", Retrieved at: http://www.textile-wire.ch/en/home.html, Aug. 7, 2004, 17 pages.
Stoppa, "Wearable Electronics and Smart Textiles: A Critical Review", In Proceedings of Sensors, vol. 14, Issue 7, Jul. 7, 2014, pp. 11957-11992.
"Final Office Action", U.S. Appl. No. 14/959,799, dated Jan. 4, 2018, 17 pages.
"Final Office Action", U.S. Appl. No. 14/959,730, dated Nov. 22, 2017, 16 pages.
"International Search Report and Written Opinion", PCT/US2017/047691, dated Nov. 16, 2017, 13.
"International Search Report and Written Opinion", PCT Application No. PCT/US2017/051663, dated Nov. 29, 2017, 16 pages.
"Non-Final Office Action", U.S. Appl. No. 14/504,121, dated Jan. 2, 2018, 19 pages.
"Non-Final Office Action", U.S. Appl. No. 14/959,901, dated Jan. 8, 2018, 21 pages.
"Non-Final Office Action", U.S. Appl. No. 14/504,139, dated Oct. 18, 2017, 12 pages.
"Non-Final Office Action", U.S. Appl. No. 15/595,649, dated Oct. 31, 2017, 16 pages.
"Non-Final Office Action", U.S. Appl. No. 14/862,409, dated Dec. 14, 2017, 17 pages.
"Notice of Allowance", U.S. Appl. No. 15/403,066, dated Jan. 8, 2018, 18 pages.
"Notice of Allowance", U.S. Appl. No. 14/874,955, dated Oct. 20, 2017, 7 pages.
"Notice of Allowance", U.S. Appl. No. 15/398,147, dated Nov. 15, 2017, 8 pages.
"Notice of Publication", U.S. Appl. No. 15/703,511, dated Jan. 4, 2018, 1 page.
Bondade, et al., "A linear-assisted DC-DC hybrid power converter for envelope tracking RF power amplifiers", 2014 IEEE Energy Conversion Congress and Exposition (ECCE), IEEE, Sep. 14, 2014, pp. 5769-5773, XP032680873, DOI: 10.1109/ECCE.2014.6954193, Sep. 14, 2014, 5 pages.
Fan, et al., "Wireless Hand Gesture Recognition Based on Continuous-Wave Doppler Radar Sensors", IEEE Transactions on Microwave Theory and Techniques, Plenum, USA, vol. 64, No. 11, Nov. 1, 2016 (Nov. 1, 2016), pp. 4012-4012, XP011633246, ISSN: 0018-9480, DOI: 10.1109/TMTT.2016.2610427, Nov. 1, 2016, 9 pages.
Lien, et al., "Soli: Ubiquitous Gesture Sensing with Millimeter Wave Radar", ACM Transactions on Graphics (TOG), ACM, Us, vol. 35, No. 4, Jul. 11, 2016 (Jul. 11, 2016), pp. 1-19, XP058275791, ISSN: 0730-0301, DOI: 10.1145/2897824.2925953, Jul. 11, 2016, 19 pages.
Martinez-Garcia, et al., "Four-quadrant linear-assisted DC/DC voltage regulator", Analog Integrated Circuits and Signal Processing, Springer New York LLC, US, vol. 88, No. 1, Apr. 23, 2016 (Apr. 23, 2016), pp. 151-160, XP035898949, ISSN: 0925-1030, DOI: 10.1007/S10470-016-0747-8, Apr. 23, 2016, 10 pages.
Skolnik, "CW and Frequency-Modulated Radar", In: "Introduction to Radar Systems", Jan. 1, 1981 (Jan. 1, 1981), McGraw Hill, XP055047545, ISBN: 978-0-07-057909-5 pp. 68-100, p. 95-p. 97, Jan. 1, 1981, 18 pages.
Zheng, et al., "Doppler Bio-Signal Detection Based Time-Domain Hand Gesture Recognition", 2013 IEEE MTT-S International Microwave Workshop Series on RF and Wireless Technologies for Biomedical and Healthcare Applications (IMWS-BIO), IEEE, Dec. 9,

(56) References Cited

OTHER PUBLICATIONS 2013 (Dec. 9, 2013), p. 3, XP032574214, DOI: 10.1109/IMWS-BIO.2013.6756200, Dec. 9, 2013, 3 Pages.
"Corrected Notice of Allowance", U.S. Appl. No. 14/312,486, dated Jan. 23, 2017, 4 pages.
"Corrected Notice of Allowance", U.S. Appl. No. 14/582,896, dated Feb. 6, 2017, 2 pages.
"Corrected Notice of Allowance", U.S. Appl. No. 14/582,896, dated Feb. 23, 2017, 2 pages.
"International Preliminary Report on Patentability", Application No. PCT/US2015/043963, dated Feb. 16, 2017, 12 pages.
"International Preliminary Report on Patentability", Application No. PCT/US2015/030388, dated Dec. 15, 2016, 12 pages.
"International Preliminary Report on Patentability", Application No. PCT/US2015/043949, dated Feb. 16, 2017, 13 pages.
"International Preliminary Report on Patentability", Application No. PCT/US2015/044774, dated Mar. 2, 2017, 8 pages.
"International Search Report and Written Opinion", Application No. PCT/US2016/062082, dated Feb. 23, 2017, 12 pages.
"International Search Report and Written Opinion", Application No. PCT/US2016/055671, dated Dec. 1, 2016, 14 pages.
"Non-Final Office Action", U.S. Appl. No. 14/504,121, dated Jan. 9, 2017, 13 pages.
"Non-Final Office Action", U.S. Appl. No. 14/504,139, dated Jan. 27, 2017, 10 pages.
"Non-Final Office Action", U.S. Appl. No. 14/513,875, dated Feb. 21, 2017, 9 pages.
"Non-Final Office Action", U.S. Appl. No. 14/874,955, dated Feb. 27, 2017, 8 pages.
"Non-Final Office Action", U.S. Appl. No. 14/959,799, dated Jan. 27, 2017, 10 pages.
"Non-Final Office Action", U.S. Appl. No. 15/398,147, dated Mar. 9, 2017, 10 pages.
"Notice of Allowance", U.S. Appl. No. 14/930,220, dated Feb. 2, 2017, 8 pages.
"Pre-Interview Communication", U.S. Appl. No. 14/494,863, dated Jan. 27, 2017, 5 pages.
"Pre-Interview Communication", U.S. Appl. No. 14/959,730, dated Feb. 15, 2017, 3 pages.
"Pre-Interview Communication", U.S. Appl. No. 14/959,901, dated Feb. 10, 2017, 3 pages.
"Final Office Action", U.S. Appl. No. 14/518,863, dated Apr. 5, 2018, 21 pages.
"Final Office Action", U.S. Appl. No. 14/504,139, dated May 1, 2018, 14 pages.
"Final Office Action", U.S. Appl. No. 15/595,649, dated May 23, 2018, 13 pages.
"First Action Interview Office Action", U.S. Appl. No. 15/166,198, dated Apr. 25, 2018, 8 pages.
"Non-Final Office Action", U.S. Appl. No. 15/287,253, dated Apr. 5, 2018, 17 pages.
"Written Opinion", PCT Application No. PCT/US2017/032733, dated Jul. 24, 2017, 5 pages.
"Final Office Action", U.S. Appl. No. 15/142,689, dated Jun. 1, 2018, 16 pages.
"Final Office Action", U.S. Appl. No. 14/874,955, dated Jun. 11, 2018, 9 pages.
"Final Office Action", U.S. Appl. No. 14/959,901, dated Jun. 15, 2018, 21 pages.
"Final Office Action", U.S. Appl. No. 15/286,152, dated Jun. 26, 2018, 25 pages.
"Final Office Action", U.S. Appl. No. 15/267,181, dated Jun. 7, 2018, 31 pages.
"Final Office Action", U.S. Appl. No. 14/504,121, dated Jun. 9, 2018, 23 pages.
"Foreign Office Action", Chinese Application No. 201721290290.3, dated Jun. 6, 2018, 3 pages.
"Non-Final Office Action", U.S. Appl. No. 15/586,174, dated Jun. 18, 2018, 7 pages.
"Non-Final Office Action", U.S. Appl. No. 15/286,512, dated Jul. 19, 2018, 15 pages.
"Non-Final Office Action", U.S. Appl. No. 15/142,829, dated Aug. 16, 2018, 15 pages.
"Notice of Allowance", U.S. Appl. No. 14/862,409, dated Jun. 6, 2018, 7 pages.
"Notice of Allowance", U.S. Appl. No. 15/142,619, dated Aug. 13, 2018, 9 pages.
"Pre-Interview Communication", U.S. Appl. No. 15/287,359, dated Jul. 24, 2018, 2 pages.
"Restriction Requirement", U.S. Appl. No. 15/286,537, dated Aug. 27, 2018, 8 pages.
"Final Office Action", U.S. Appl. No. 15/166,198, dated Sep. 27, 2018, 33 pages.
"Non-Final Office Action", U.S. Appl. No. 15/287,253, dated Sep. 7, 2018, 20 pages.
"Non-Final Office Action", U.S. Appl. No. 14/959,901, dated Oct. 11, 2018, 22 pages.
"Non-Final Office Action", U.S. Appl. No. 15/287,308, dated Oct. 15, 2018, 18 pages.
"Non-Final Office Action", U.S. Appl. No. 15/286,152, dated Oct. 19, 2018, 27 pages.
"Non-Final Office Action", U.S. Appl. No. 15/286,837, dated Oct. 26, 2018, 10 pages.
"Non-Final Office Action", U.S. Appl. No. 14/504,139, dated Oct. 5, 2018, 16 pages.
"Notice of Allowance", U.S. Appl. No. 15/142,689, dated Oct. 30, 2018, 9 pages.
"Notice of Allowance", U.S. Appl. No. 14/874,955, dated Oct. 4, 2018, 8 pages.
"Notice of Allowance", U.S. Appl. No. 15/595,649, dated Sep. 14, 2018, 8 pages.
"Notice of Allowance", U.S. Appl. No. 15/586,174, dated Sep. 24, 2018, 5 pages.
"Pre-Interview Communication", U.S. Appl. No. 15/286,495, dated Sep. 10, 2018, 4 pages.
"Written Opinion", PCT Application No. PCT/US2017/051663, dated Oct. 12, 2018, 8 pages.
Gürbüz et al., "Detection and Identification of Human Targets in Radar Data", Proc. SPIE 6567, Signal Processing, Sensor Fusion, and Target Recognition XVI, 656701, May 7, 2007, 12 pages.

* cited by examiner

INTERACTIVE OBJECT WITH MULTIPLE ELECTRONICS MODULES

PRIORITY

This application claims priority to U.S. Provisional Patent Application Ser. No. 62/337,081 filed on May 16, 2016, the disclosure of which is incorporated by reference herein in its entirety.

BACKGROUND

Electronics embedded in garments are becoming increasingly common. Such electronics often need connectivity to external devices for power and/or data transmission. For example, it can be difficult to integrate bulky electronic components (e.g., batteries, microprocessors, wireless units, and sensors) into wearable garments, such as a shirt, coat, or pair of pants. Furthermore, connecting such electronic components to a garment may cause issues with durability since garments are often washed.

SUMMARY

This document describes an interactive object with multiple electronics modules. An interactive object (e.g., a garment) includes a grid or array of conductive thread woven into the interactive object, and an internal electronics module coupled to the grid of conductive thread. The internal electronics module includes a first subset of electronic components, such as sensing circuitry configured to detect touch-input to the grid of conductive thread. An external electronics module that includes a second subset of electronic components (e.g., a microprocessor, power source, or network interface) is removably coupled to the interactive object via a communication interface. The communication interface enables communication between the internal electronics module and the external electronics module when the external electronics module is coupled to the interactive object.

This summary is provided to introduce simplified concepts concerning an interactive object with multiple electronics modules, which is further described below in the Detailed Description. This summary is not intended to identify essential features of the claimed subject matter, nor is it intended for use in determining the scope of the claimed subject matter.

BRIEF DESCRIPTION OF THE DRAWINGS

Embodiments of an interactive object with multiple electronics modules are described with reference to the following drawings. The same numbers are used throughout the drawings to reference like features and components.

DETAILED DESCRIPTION

Overview

Figure 1:
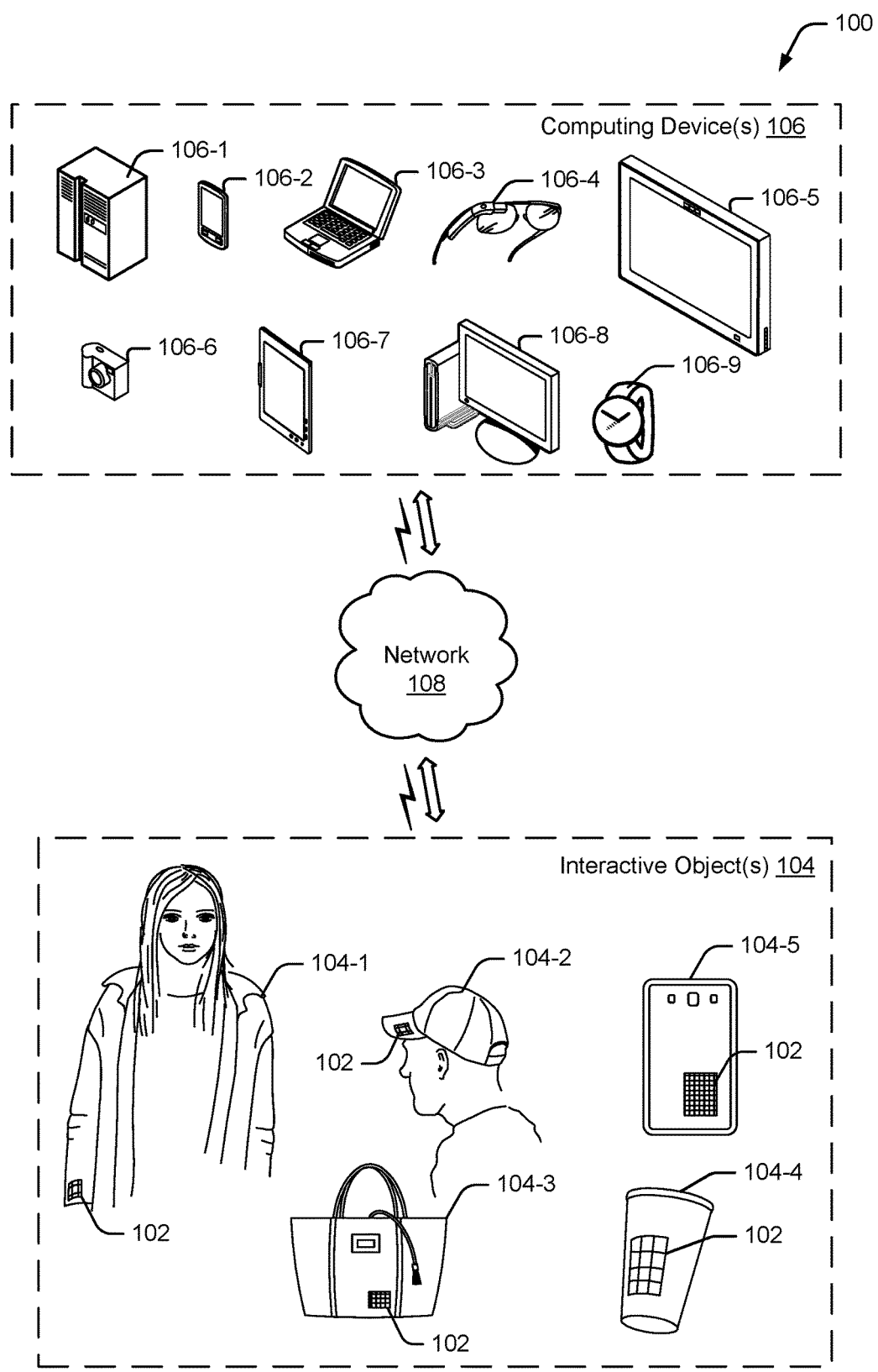
FIG. 1 is an illustration of an example environment in which an interactive textile with multiple electronics modules can be implemented.

Electronics embedded in garments and other flexible objects (e.g., blankets, handbags, and hats) are becoming increasingly common. Such electronics often need connectivity to external devices for power and/or data transmission. For example, it can be difficult to integrate bulky electronic components (e.g., batteries, microprocessors, wireless units, and sensors) into wearable garments, such as a shirt, coat, or pair of pants. Furthermore, connecting such electronic components to a garment may cause issues with durability since garments are often washed. However, some electronic components, such as sensing circuitry, are better equipped to be positioned within the garment.

An interactive object with multiple electronics modules is described. An interactive object (e.g., a garment) includes at least an internal electronics module containing a first subset of electronic components for the interactive object, and an external electronics module containing a second subset of electronic components for the interactive object. As described herein, the internal electronics module may be physically and permanently coupled to the interactive object, whereas the external electronics module may be removably coupled to the interactive object. Thus, instead of integrating all of the electronics within the interactive object, at least some of the electronics are placed in the external electronics module.

In one or more implementations, the interactive object includes an interactive textile with conductive threads woven into the textile to form a flexible touch pad. The internal electronics module contains sensing circuitry that is directly coupled to the conductive threads to enable the detection of touch-input to the interactive textile. The external electronics module contains electronic components that are needed to process and communicate the touch-input data, such as a microprocessor, a power source, a network interface, and so forth.

The interactive object further includes a communication interface configured to enable communication between the internal electronics module and the external electronics module. In some implementations, the communication interface may be implemented as a connector that connects the electronic components in the external electronics module to the electronic components in the internal electronics module to enable the transfer of power and data between the modules. The connector may include a connector plug and a connector receptacle. For example, the connector plug may be implemented at the external electronics module and is configured to connect to the connector receptacle, which may be implemented at the interactive object.

Thus, while the electronic components are separated into multiple different modules, the communication interface enables the system to function as a single unit. For example, the power source contained within the external electronics module may transfer power, via the communication interface, to the sensing circuitry of the internal electronics module to enable the sensing circuitry to detect touch-input to the conductive thread. When touch-input is detected by the sensing circuitry of the internal electronics module, data representative of the touch-input may be communicated, via the communication interface, to the microprocessor contained within the external electronics module. The microprocessor may then analyze the touch-input data to generate one or more control signals, which may then be communicated to a remote computing device (e.g., a smart phone) via the network interface to cause the computing device to initiate a particular functionality.

Separating the electronics of the interactive object into multiple different modules provides a variety of different benefits. For example, the system design enables interoperability and customization because the external electronics module can be detached from the interactive object, and then attached to a different interactive object to carry over some of the functions and properties, such as user specific settings. Additionally, by separating the garment embedded electronics from the external electronics module, users, designers and companies are able to design the external electronics modules in the form factor, mechanical, material and surface finish qualities that are specific to the application or the user. For example, a leather jacket might have an external electronics module that is leather, and in the form of a strap that matches a certain jacket style, or allows a flexible form factor that would have been hard to achieve inside a garment.

Furthermore, separating the electronics enable broken parts to be easily replaced or serviced without the need to access the entire interactive object. For example, the external electronics module can be shipped to a repair service, or a new external electronics module can be purchased without the need to purchase a new interactive object. In addition, separating the electronic components into internal and external modules ensures that parts such as batteries are not exposes to washing cycles that a typical garment would go through. For example, the external electronics module, which may include the battery, can easily be removed from the interactive object before washing the interactive object. Furthermore, by separating parts, the manufacturing challenges are significantly simplified and certification processes (such as FCC certification for RF transmission units) can be handled over the part in question, thereby reducing the complexity.

Example Environment

FIG. 1 is an illustration of an example environment 100 in which an interactive textile with multiple electronics modules can be implemented. Environment 100 includes an interactive textile 102, which is shown as being integrated within various interactive objects 104. Interactive textile 102 is a textile that is configured to sense multi-touch-input. As described herein, a textile corresponds to any type of flexible woven material consisting of a network of natural or artificial fibers, often referred to as thread or yarn. Textiles may be formed by weaving, knitting, crocheting, knotting, or pressing threads together.

In environment 100, interactive objects 104 include "flexible" objects, such as a shirt 104-1, a hat 104-2, and a handbag 104-3. It is to be noted, however, that interactive textile 102 may be integrated within any type of flexible object made from fabric or a similar flexible material, such as garments or articles of clothing, blankets, shower curtains, towels, sheets, bed spreads, or fabric casings of furniture, to name just a few. Interactive textile 102 may be integrated within flexible objects 104 in a variety of different ways, including weaving, sewing, gluing, and so forth.

In this example, objects 104 further include "hard" objects, such as a plastic cup 104-4 and a hard smart phone casing 104-5. It is to be noted, however, that hard objects 104 may include any type of "hard" or "rigid" object made from non-flexible or semi-flexible materials, such as plastic, metal, aluminum, and so on. For example, hard objects 104 may also include plastic chairs, water bottles, plastic balls, or car parts, to name just a few. Interactive textile 102 may be integrated within hard objects 104 using a variety of different manufacturing processes. In one or more implementations, injection molding is used to integrate interactive textiles 102 into hard objects 104.

Interactive textile 102 enables a user to control object 104 that the interactive textile 102 is integrated with, or to control a variety of other computing devices 106 via a network 108. Computing devices 106 are illustrated with various non-limiting example devices: server 106-1, smart phone 106-2, laptop 106-3, computing spectacles 106-4, television 106-5, camera 106-6, tablet 106-7, desktop 106-8, and smart watch 106-9, though other devices may also be used, such as home automation and control systems, sound or entertainment systems, home appliances, security systems, netbooks, and e-readers. Note that computing device 106 can be wearable (e.g., computing spectacles and smart watches), non-wearable but mobile (e.g., laptops and tablets), or relatively immobile (e.g., desktops and servers).

Network 108 includes one or more of many types of wireless or partly wireless communication networks, such as a local-area-network (LAN), a wireless local-area-network (WLAN), a personal-area-network (PAN), a wide-area-network (WAN), an intranet, the Internet, a peer-to-peer network, point-to-point network, a mesh network, and so forth.

Interactive textile 102 can interact with computing devices 106 by transmitting touch data through network 108. Computing device 106 uses the touch data to control computing device 106 or applications at computing device 106. As an example, consider that interactive textile 102 integrated at shirt 104-1 may be configured to control the user's smart phone 106-2 in the user's pocket, television 106-5 in the user's home, smart watch 106-9 on the user's wrist, or various other appliances in the user's house, such as thermostats, lights, music, and so forth. For example, the user may be able to swipe up or down on interactive textile 102 integrated within the user's shirt 104-1 to cause the volume on television 106-5 to go up or down, to cause the temperature controlled by a thermostat in the user's house to increase or decrease, or to turn on and off lights in the user's house. Note that any type of touch, tap, swipe, hold, or stroke gesture may be recognized by interactive textile 102.

Figure 2:
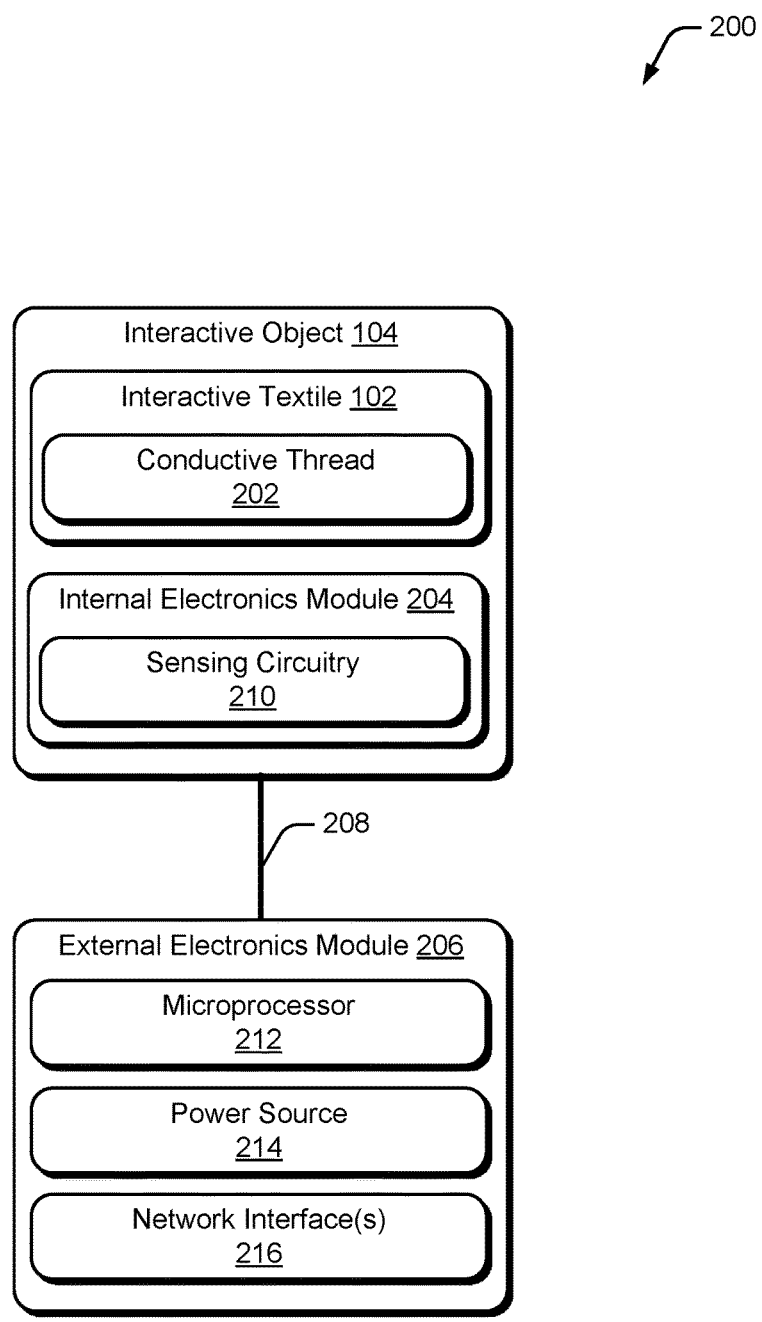
FIG. 2 illustrates an example system that includes an interactive object and multiple electronics modules.

In more detail, consider FIG. 2 which illustrates an example system 200 that includes an interactive object and multiple electronics modules. In system 200, interactive textile 102 is integrated in an object 104, which may be implemented as a flexible object (e.g., shirt 104-1, hat 104-2, or handbag 104-3) or a hard object (e.g., plastic cup 104-4 or smart phone casing 104-5).

Interactive textile 102 is configured to sense multi-touch-input from a user when one or more fingers of the user's hand touch interactive textile 102. Interactive textile 102 may also be configured to sense full-hand touch-input from a user, such as when an entire hand of the user touches or swipes interactive textile 102. To enable the detection of touch-input, interactive textile 102 includes conductive threads 202, which are woven into interactive textile 102 (e.g., in a grid or array pattern). Notably, the conductive threads 202 do not alter the flexibility of interactive textile 102, which enables interactive textile 102 to be easily integrated within interactive objects 104.

Interactive object 104 includes an internal electronics module 204 that is embedded within interactive object 104 and is directly coupled to conductive threads 202. Internal electronics module 204 can be communicatively coupled to an external electronics module 206 via a communication interface 208. Internal electronics module 204 contains a first subset of electronic components for the interactive object 104, and external electronics module 206 contains a second, different, subset of electronics components for the interactive object 104. As described herein, the internal electronics module 204 may be physically and permanently embedded within interactive object 104, whereas the external electronics module 206 may be removably coupled to interactive object 104.

In system 200, the electronic components contained within the internal electronics module 204 includes sensing circuitry 210 that is coupled to conductive thread 202 that is woven into interactive textile 102. For example, wires from the conductive threads 202 may be connected to sensing circuitry 210 using flexible PCB, creping, gluing with conductive glue, soldering, and so forth. Sensing circuitry 210 is configured to detect the location of the touch-input on conductive thread 202, as well as motion of the touch-input. For example, when an object, such as a user's finger, touches conductive thread 202, the position of the touch can be determined by sensing circuitry 210 by detecting a change in capacitance on the grid or array of conductive thread 202. The touch-input may then be used to generate touch data usable to control computing device 106. For example, the touch-input can be used to determine various gestures, such as single-finger touches (e.g., touches, taps, and holds), multi-finger touches (e.g., two-finger touches, two-finger taps, two-finger holds, and pinches), single-finger and multi-finger swipes (e.g., swipe up, swipe down, swipe left, swipe right), and full-hand interactions (e.g., touching the textile with a user's entire hand, covering textile with the user's entire hand, pressing the textile with the user's entire hand, palm touches, and rolling, twisting, or rotating the user's hand while touching the textile).

Communication interface 208 enables the transfer of power and data (e.g., the touch-input detected by sensing circuitry 210) between the internal electronics module 204 and the external electronics module 206. In some implementations, communication interface 208 may be implemented as a connector that includes a connector plug and a connector receptacle. The connector plug may be implemented at the external electronics module 206 and is configured to connect to the connector receptacle, which may be implemented at the interactive object 104. A more-detailed discussion of example connectors is discussed below with regards to FIGS. 4-6.

In system 200, the external electronics module 206 includes a microprocessor 212, power source 214, and network interface 216. Power source 214 may be coupled, via communication interface 208, to sensing circuitry 210 to provide power to sensing circuitry 210 to enable the detection of touch-input, and may be implemented as a small battery. When touch-input is detected by sensing circuitry 210 of the internal electronics module 204, data representative of the touch-input may be communicated, via communication interface 208, to microprocessor 212 of the external electronics module 206. Microprocessor 212 may then analyze the touch-input data to generate one or more control signals, which may then be communicated to computing device 106 (e.g., a smart phone) via the network interface 216 to cause the computing device 106 to initiate a particular functionality. Generally, network interfaces 216 are configured to communicate data, such as touch data, over wired, wireless, or optical networks to computing devices 106. By way of example and not limitation, network interfaces 216 may communicate data over a local-area-network (LAN), a wireless local-area-network (WLAN), a personal-area-network (PAN) (e.g., Bluetooth™), a wide-area-network (WAN), an intranet, the Internet, a peer-to-peer network, point-to-point network, a mesh network, and the like (e.g., through network 108 of FIG. 1).

While internal electronics module 204 and external electronics module 206 are illustrated and described as including specific electronic components, it is to be appreciated that these modules may be configured in a variety of different ways. For example, in some cases, electronic components described as being contained within internal electronics module 204 may be at least partially implemented at the external electronics module 206, and vice versa. Furthermore, internal electronics module 204 and external electronics module 206 may include electronic components other that those illustrated in FIG. 2, such as sensors, light sources (e.g., LED's), displays, speakers, and so forth.

Figure 3:
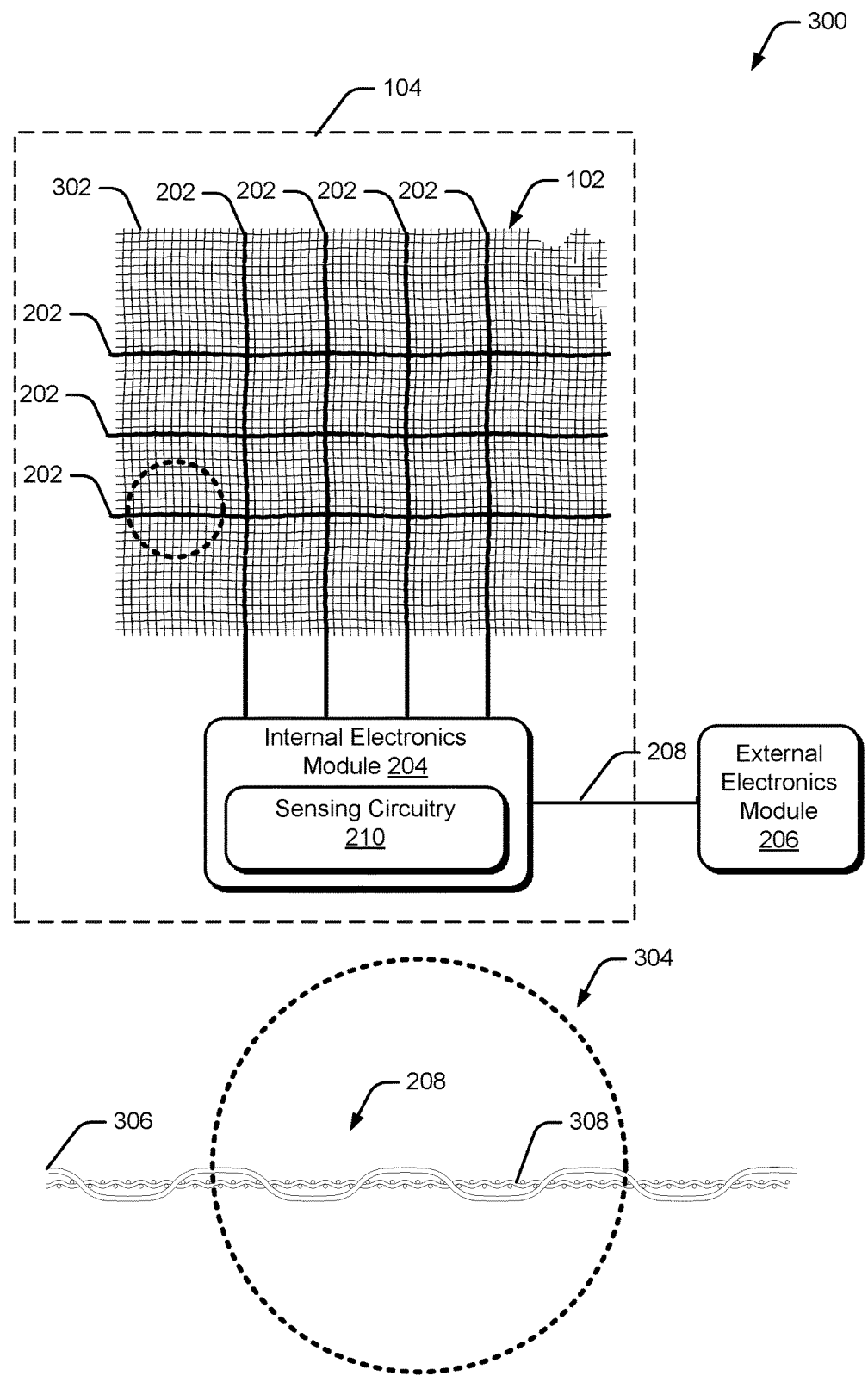
FIG. 3 illustrates an example of an interactive object with multiple electronics modules in accordance with one or more implementations.

FIG. 3 illustrates an example 300 of interactive object 104 with multiple electronics modules in accordance with one or more implementations. In this example, interactive textile 102 of the interactive object 104 includes non-conductive threads 302 woven with conductive threads 202 to form interactive textile 102. Non-conductive threads 302 may correspond to any type of non-conductive thread, fiber, or fabric, such as cotton, wool, silk, nylon, polyester, and so forth.

At 304, a zoomed-in view of conductive thread 202 is illustrated. Conductive thread 202 includes a conductive wire 306 that is twisted, braided, or wrapped with a flexible thread 308. Twisting conductive wire 306 with flexible thread 308 causes conductive thread 202 to be flexible and stretchy, which enables conductive thread 202 to be easily woven with non-conductive threads 302 to form interactive textile 102.

In one or more implementations, conductive wire 306 is a thin copper wire. It is to be noted, however, that conductive wire 306 may also be implemented using other materials, such as silver, gold, or other materials coated with a conductive polymer. Flexible thread 308 may be implemented as any type of flexible thread or fiber, such as cotton, wool, silk, nylon, polyester, and so forth.

Interactive textile 102 can be formed cheaply and efficiently, using any conventional weaving process (e.g., jacquard weaving or 3D-weaving), which involves interlacing a set of longer threads (called the warp) with a set of crossing threads (called the weft). Weaving may be implemented on a frame or machine known as a loom, of which there are a number of types. Thus, a loom can weave non-conductive threads 302 with conductive threads 102 to create interactive textile 102.

In example 300, conductive thread 202 is woven into interactive textile 102 to form a grid that includes a set of substantially parallel conductive threads 202 and a second set of substantially parallel conductive threads 202 that crosses the first set of conductive threads to form the grid. In this example, the first set of conductive threads 202 are oriented horizontally and the second set of conductive threads 202 are oriented vertically, such that the first set of conductive threads 202 are positioned substantially orthogonal to the second set of conductive threads 202. It is to be appreciated, however, that conductive threads 202 may be oriented such that crossing conductive threads 202 are not orthogonal to each other. For example, in some cases crossing conductive threads 202 may form a diamond-shaped grid. While conductive threads 202 are illustrated as being spaced out from each other in FIG. 3, it is to be noted that conductive threads 202 may be weaved very closely together. For example, in some cases two or three conductive threads may be weaved closely together in each direction. Further, in some cases the conductive threads may be oriented as parallel sensing lines that do not cross or intersect with each other.

In example 300, sensing circuitry 210 is shown as being integrated within object 104, and is directly connected to conductive threads 202. During operation, sensing circuitry 210 can determine positions of touch-input on the grid of conductive thread 202 using self-capacitance sensing or projective capacitive sensing.

For example, when configured as a self-capacitance sensor, sensing circuitry 210 charges crossing conductive threads 202 (e.g., horizontal and vertical conductive threads) by applying a control signal (e.g., a sine signal) to each conductive thread 202. When an object, such as the user's finger, touches the grid of conductive thread 202, the conductive threads 202 that are touched are grounded, which changes the capacitance (e.g., increases or decreases the capacitance) on the touched conductive threads 202.

Sensing circuitry 210 uses the change in capacitance to identify the presence of the object. To do so, sensing circuitry 210 detects a position of the touch-input by detecting which horizontal conductive thread 202 is touched, and which vertical conductive thread 202 is touched by detecting changes in capacitance of each respective conductive thread 202. Sensing circuitry 210 uses the intersection of the crossing conductive threads 202 that are touched to determine the position of the touch-input on the grid of conductive threads 202. For example, sensing circuitry 210 can determine touch data by determining the position of each touch as X,Y coordinates on the grid of conductive thread 202.

When implemented as a self-capacitance sensor, "ghosting" may occur when multi-touch-input is received. Consider, for example, that a user touches the grid of conductive thread 202 with two fingers. When this occurs, sensing circuitry 210 determines X and Y coordinates for each of the two touches. However, sensing circuitry 210 may be unable to determine how to match each X coordinate to its corresponding Y coordinate. For example, if a first touch has the coordinates X1, Y1 and a second touch has the coordinates X4,Y4, sensing circuitry 210 may also detect "ghost" coordinates X1, Y4 and X4,Y1.

In one or more implementations, sensing circuitry 210 is configured to detect "areas" of touch-input corresponding to two or more touch-input points on the grid of conductive thread 202. Conductive threads 202 may be weaved closely together such that when an object touches the grid of conductive thread 202, the capacitance will be changed for multiple horizontal conductive threads 202 and/or multiple vertical conductive threads 202. For example, a single touch with a single finger may generate the coordinates X1,Y1 and X2,Y1. Thus, sensing circuitry 210 may be configured to detect touch-input if the capacitance is changed for multiple horizontal conductive threads 202 and/or multiple vertical conductive threads 202. Note that this removes the effect of ghosting because sensing circuitry 210 will not detect touch-input if two single-point touches are detected which are spaced apart.

Alternately, when implemented as a projective capacitance sensor, sensing circuitry 210 charges a single set of conductive threads 202 (e.g., horizontal conductive threads 202) by applying a control signal (e.g., a sine signal) to the single set of conductive threads 202. Then, sensing circuitry 210 senses changes in capacitance in the other set of conductive threads 202 (e.g., vertical conductive threads 202).

In this implementation, vertical conductive threads 202 are not charged and thus act as a virtual ground. However, when horizontal conductive threads 202 are charged, the horizontal conductive threads capacitively couple to vertical conductive threads 202. Thus, when an object, such as the user's finger, touches the grid of conductive thread 202, the capacitance changes on the vertical conductive threads (e.g., increases or decreases). Sensing circuitry 210 uses the change in capacitance on vertical conductive threads 202 to identify the presence of the object. To do so, sensing circuitry 210 detects a position of the touch-input by scanning vertical conductive threads 202 to detect changes in capacitance. Sensing circuitry 210 determines the position of the touch-input as the intersection point between the vertical conductive thread 202 with the changed capacitance, and the horizontal conductive thread 202 on which the control signal was transmitted. For example, sensing circuitry 210 can determine touch data by determining the position of each touch as X,Y coordinates on the grid of conductive thread 202.

Whether implemented as a self-capacitance sensor or a projective capacitance sensor, the conductive thread 202 and sensing circuitry 210 is configured to communicate the touch data that is representative of the detected touch-input to external electronics module 206, which is removably coupled to interactive object 104 via communication interface 208. The microprocessor 212 may then cause communication of the touch data, via network interface 216, to computing device 106 to enable the device to determine gestures based on the touch data, which can be used to control object 104, computing device 106, or applications implemented at computing device 106.

The computing device 106 can be implemented to recognize a variety of different types of gestures, such as touches, taps, swipes, holds, and covers made to interactive textile 102. To recognize the various different types of gestures, the computing device can be configured to determine a duration of the touch, swipe, or hold (e.g., one second or two seconds), a number of the touches, swipes, or holds (e.g., a single tap, a double tap, or a triple tap), a number of fingers of the touch, swipe, or hold (e.g., a one finger-touch or swipe, a two-finger touch or swipe, or a three-finger touch or swipe), a frequency of the touch, and a dynamic direction of a touch or swipe (e.g., up, down, left, right). With regards to holds, the computing device 106 can also determine an area of the grid of conductive thread 202 that is being held (e.g., top, bottom, left, right, or top and bottom. Thus, the computing device 106 can recognize a variety of different types of holds, such as a cover, a cover and hold, a five finger hold, a five finger cover and hold, a three finger pinch and hold, and so forth.

In one or more implementations, communication interface 208 is implemented as a connector that is configured to connect external electronics module 206 to internal electronics module 204 of interactive object 104. Consider, for example, FIG. 4 which illustrates an example 400 of a connector for connecting an external communications module to an interactive object in accordance with one or more implementations. In example 400, interactive object 104 is illustrated as a jacket.

As described above, interactive object 104 includes an internal electronics module 204 which include various types of electronics, such as sensing circuitry 210, sensors (e.g., capacitive touch sensors woven into the garment, microphones, or accelerometers), output devices (e.g., LEDs, speakers, or micro-displays), electrical circuitry, and so forth.

External electronics module 206 includes various electronics that are configured to connect and/or interface with the electronics of internal electronics module 204. Generally, the electronics contained within external electronics module 206 are different than those contained within internal electronics module 204, and may include electronics such as microprocessor 212, power source 214 (e.g., a battery), network interface 216 (e.g., Bluetooth or WiFi), sensors (e.g., accelerometers, heart rate monitors, or pedometers), output devices (e.g., speakers, LEDs), and so forth.

In this example, external electronics module 206 is implemented as a strap that contains the various electronics. The strap, for example, can be formed from a material such as rubber, nylon, or any other type of fabric. Notably, however, external electronics module 206 may take any type of form. For example, rather than being a strap, external electronics module 206 could resemble a circular or square piece of material (e.g., rubber or nylon).

Connector 402 includes a connector plug 404 and a connector receptacle 406. In this example, connector plug 404 is positioned on external electronics module 206 and is configured to attach to connector receptacle 406, which is positioned on interactive object 104, to form an electronic connection between external electronics module 206 and interactive object 104. For example, in FIG. 4, connector receptacle 406 is positioned on a sleeve of interactive object 104, which is illustrated as a jacket.

In various implementations, connector plug 404 may resemble a snap or button, and is configured to connect or attach to connector receptacle 406 via a magnetic or mechanical coupling. For example, in some implementations magnets on connector plug 404 and connector receptacle 406 cause a magnetic connection to form between connector plug 404 and connector receptacle 406. Alternately, a mechanical connection between these two components may cause the components to form a mechanical coupling, such as by "snapping" together.

Connector 402 may be implemented in a variety of different ways. In one or more implementations, connector plug 404 includes an anisotropic conducting polymer which is configured to connect to circular pads of a printed circuit board (PCB) implemented at connector receptacle 406. In another implementation, connector plug 404 may include compliant polyurethane polymers to provide compliance to metal pads implemented at connector receptacle 406 to enable an electromagnetic connection. In another implementation, connector plug 404 and connector receptacle 406 may each include magnetically coupled coils which can be aligned to provide power and data transmission.

Figure 5:
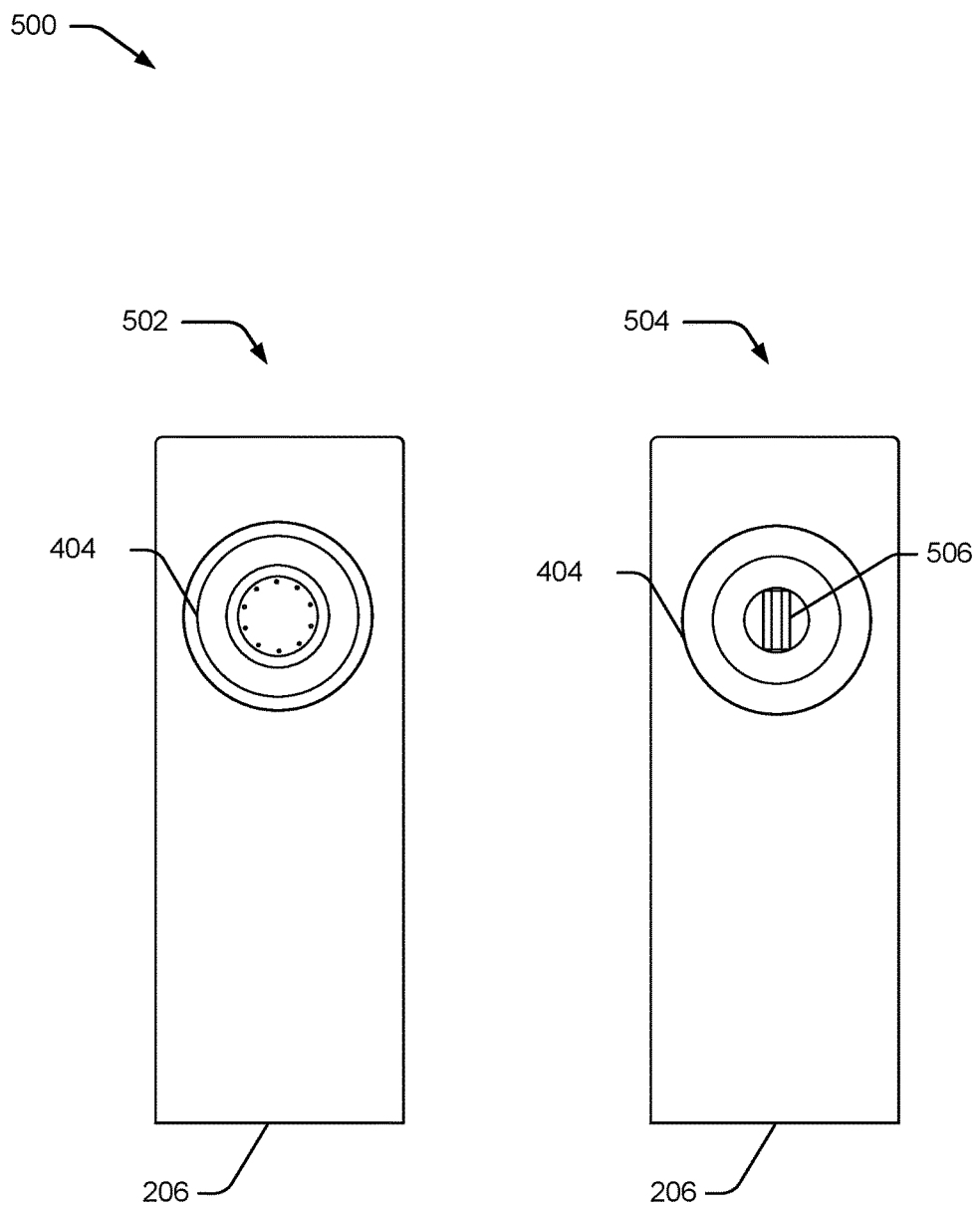
FIG. 5 illustrates an example of a connector when implemented with an anisotropic conducting polymer in accordance with one or more implementations.

FIG. 5 illustrates an example 500 of connector 402 when implemented with an anisotropic conducting polymer in accordance with one or more implementations.

At 502, a top side of connector plug 404 is shown. In this case, the top side of connector plug 404 resembles a round, button-like structure. Notably the top side of connector plug 404 may be implemented with various different shapes (e.g., square or triangular). Further, in some cases the top side of connector plug 404 may resemble something other than a button or snap.

In this example, the top side of connector plug 404 includes tiny holes that enables light from light sources (e.g., LEDs) to shine through. Of course, other types of input or output units could also be positioned here, such as a microphone or a speaker.

At 504, a bottom side of connector plug 404 is shown. The bottom side of connector plug 404 includes an anisotropic conducting polymer 506 to enable electrical connections between the electronics of interactive object 104 and the electronics of external electronics module 206.

Figure 6:
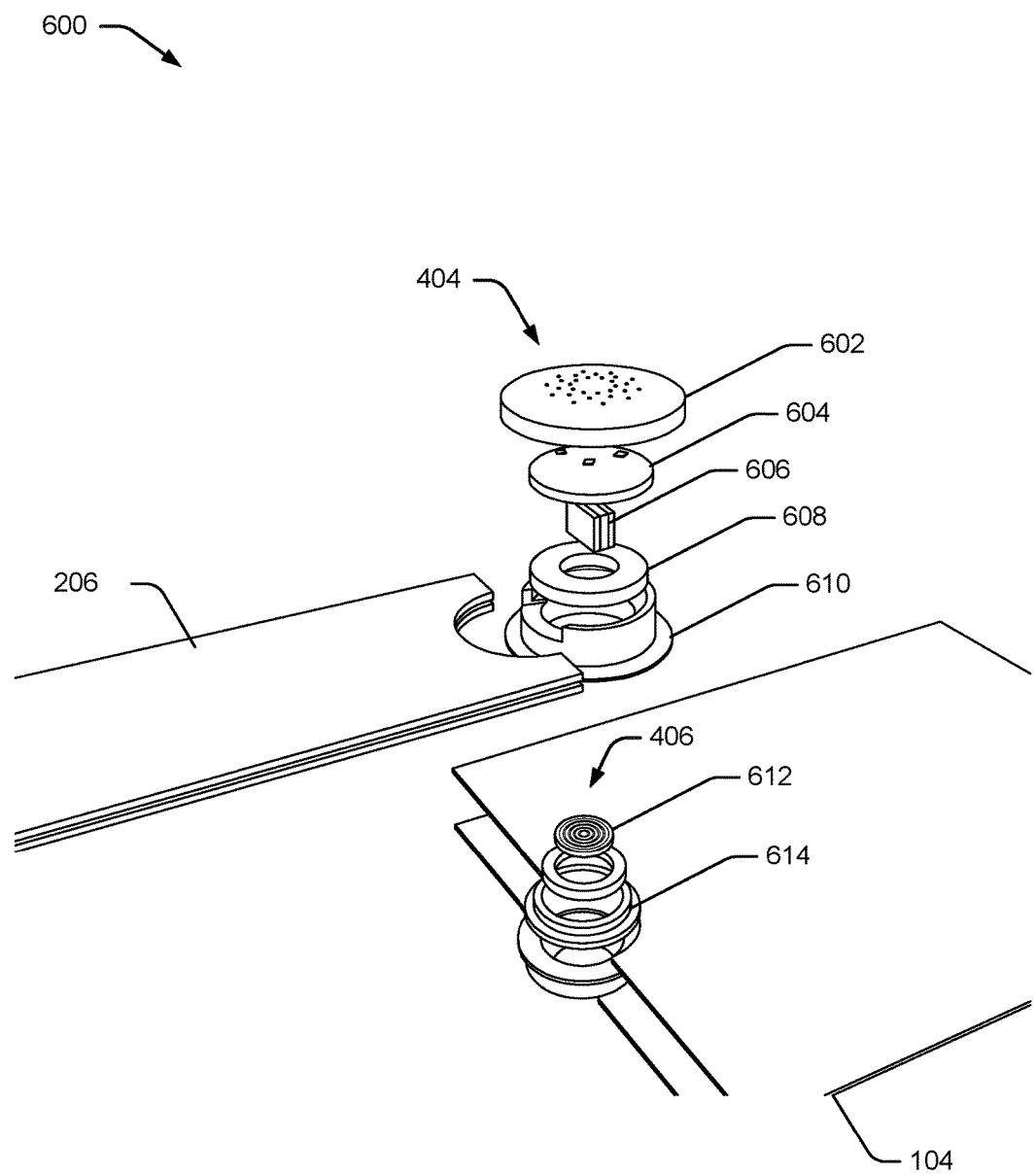
FIG. 6 illustrates an exploded view of a connector when implemented with an anisotropic conducting polymer in accordance with one or more implementations.

In more detail, consider FIG. 6 which illustrates an exploded view 600 of connector 402 when implemented with an anisotropic conducting polymer in accordance with one or more implementations.

In this example, connector plug 404 of connector 402 includes a button cap 602, a printed circuit board (PCB) 604, anisotropic conducting polymer 606, a magnet 608, and a casing 610.

Button cap 602 resembles a typical button, and may be made from a variety of different materials, such as plastic, metal, and so forth. In this example, button cap 602 includes holes which enable light from LEDs to shine through.

PCB 604 is configured to electrically connect electronics of interactive object 104 to anisotropic conducting polymer 606. A top layer of PCB 604 may include the LEDs that shine through the holes in button cap 602. A bottom layer of PCB 604 includes contacts which electrically connect to anisotropic conducting polymer 606 positioned beneath PCB 604.

Anisotropic conducting polymer 606 includes a strip of anisotropic material that is configured to form a connection with connector receptacle 406. The anisotropic material include any type of anisotropic material.

Magnet 608 is configured to enable a magnetic connection to connector receptacle 406. The magnetic connection enables connector plug 404 to attach to connector receptacle 406 without the need to apply force to connect, which reduces the chance of the connection wearing down over time. Alternately, in one or more implementations, connector plug 404 may be implemented without magnet 608. For example, connector plug 404 could be implemented as physical or mechanical snap that snaps to connector receptacle 406. Casing 610 is configured to hold the components of connector plug 404, and can be implemented from a variety of different materials such as plastic, metal, and so forth.

In this example, connector receptacle 406 includes a receptacle PCB 612 which includes circular pads which are configured to connect to anisotropic conducting polymer 606. The bottom layer of receptacle PCB 612 includes connections to the electronics of interactive object 104.

Connector receptacle may also include a metallic component 614 which is configured to generate a magnetic force with magnet 608 of connector plug 404 to form the magnetic connection between connector plug 404 and connector receptacle 406. Metallic component 614 may be implemented as any type of metal or alloy, or as another magnet, that can generate a magnetic force with magnet 608. Connector receptacle 406 may also include other components, such as a housing, a washer, and so forth.

Notably, anisotropic conducting polymer 606 includes various properties which make for a good connector, which include rotational tolerance, mechanical compliance, multi-pin electrical and power transmission, and being waterproof.

For instance, when connector plug 404 attaches to connector receptacle 406, an electrical connection is formed between anisotropic conducting polymer 606 and receptacle PCB 612. The anisotropic conducting polymer 606 provides rotational tolerance because the strip of anisotropic material can be rotated 360 degrees and maintain the same connection to the circular pads of receptacle PCB 612. This is beneficial because when wearing a garment, the strap of external electronics module 206 will naturally move around. Thus, the rotational tolerance enables the connector to be rotated without losing the connection between connector plug 404 and connector receptacle 406. Furthermore, the anisotropic conducting polymer 606 is elastomeric, which causes the strip of material to shrink and conform under mechanical force.

Anisotropic conducting polymer 606 provides multi-pin electrical transmissions and power transfer transmissions simultaneously. For example, the anisotropic material causes conduction to occur in just one direction, which means that the conductive paths can operate completely independently, without interfering with each other. This enables multiple conducting channels, which makes it easy to isolate multiple data lines or power lines from each other using anisotropic conducting polymer 606 and the circular structure of receptacle PCB 612.

Additionally, anisotropic conducting polymer 606 is waterproof which prevents connector 402 from being damaged by water, such as when being worn in the rain or when being washed.

Connector 402 may be implemented in a variety of different ways. In one or more implementations, instead of using anisotropic conducting polymer 606, connector plug 404 may include compliant polyurethane polymers to provide compliance to metal pads implemented at connector receptacle 406 to enable an electromagnetic connection. In another implementation, connector plug 404 and connector receptacle 406 may each include magnetically coupled coils which can be aligned to provide power and data transmission between interactive object 104 and external electronics module 206.

Example Computing System

Figure 7:
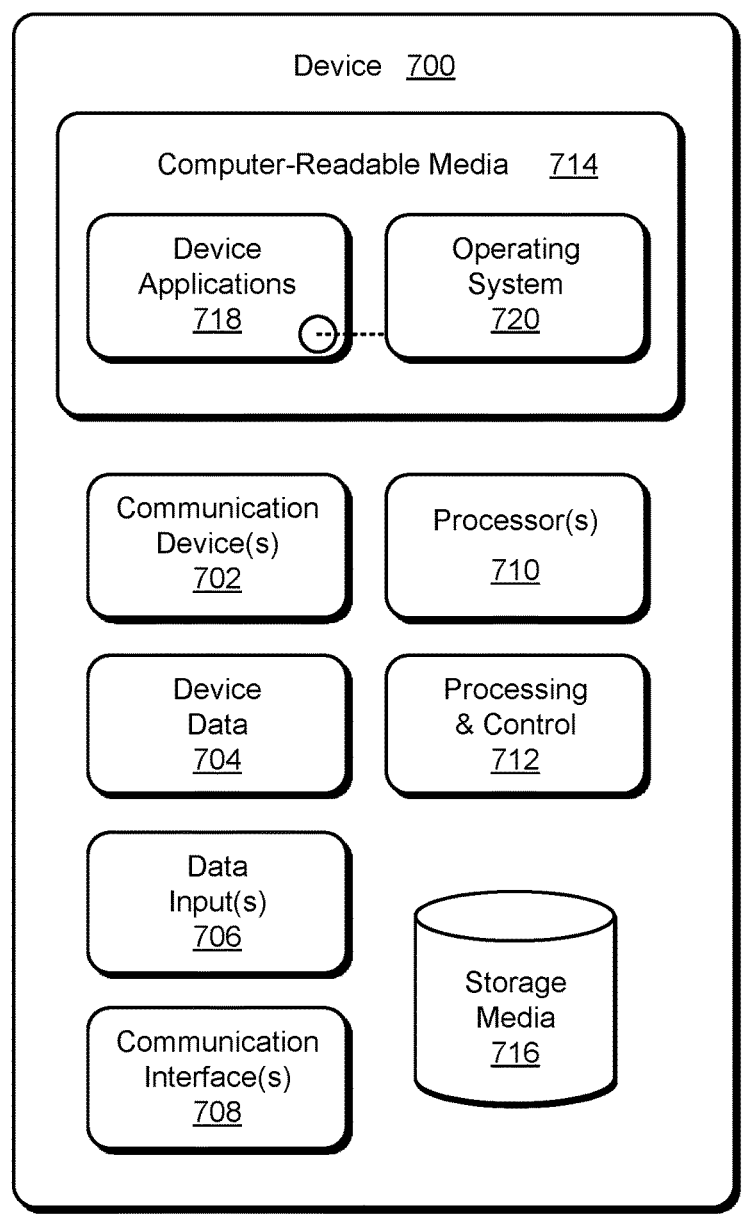
FIG. 7 illustrates various components of an example computing system that can be implemented as any type of client, server, and/or computing device as described with reference to the previous FIGS. 1-6 to implement an interactive object with multiple electronics modules.
Figure 1:
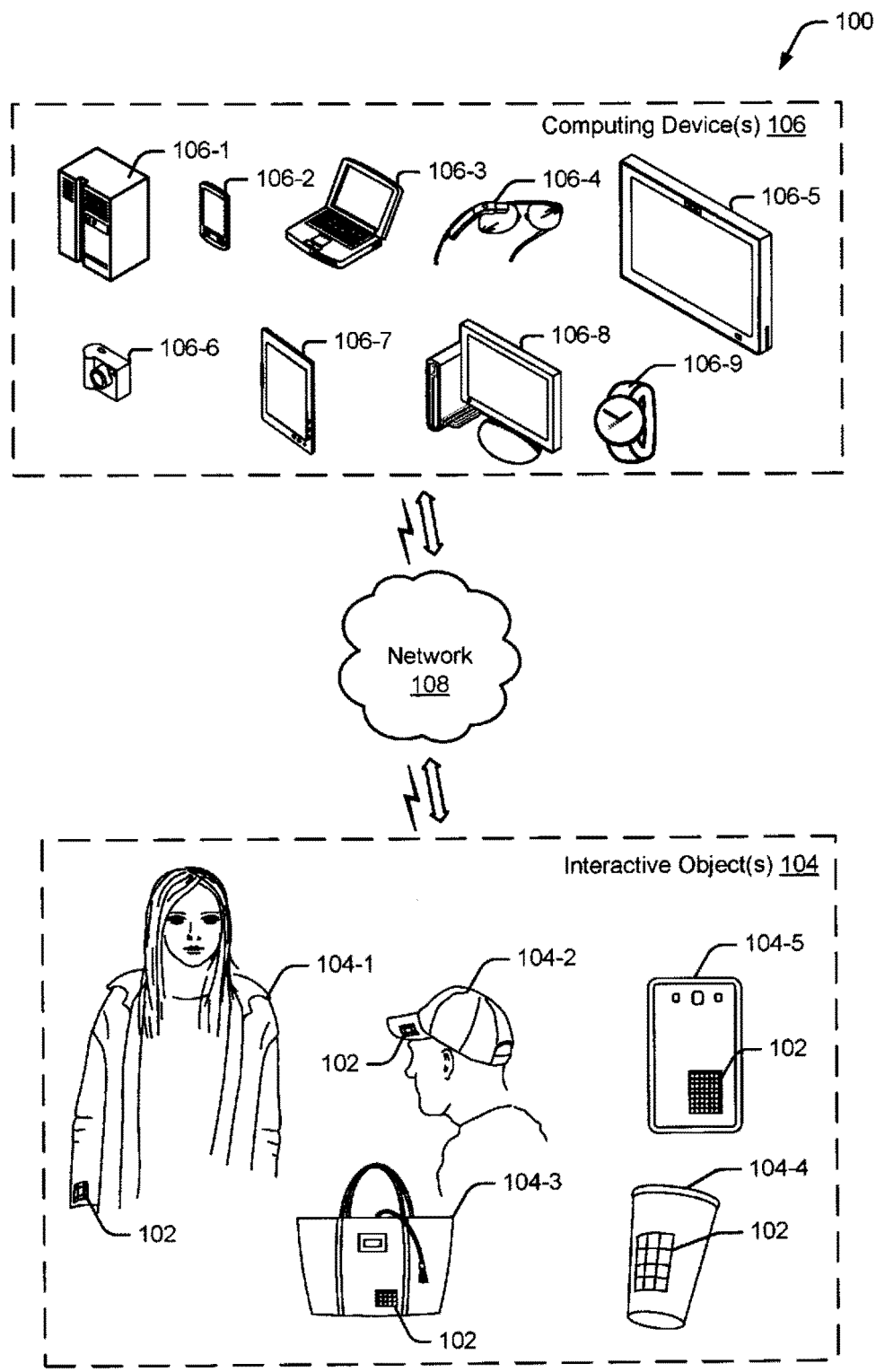
Figure 2:
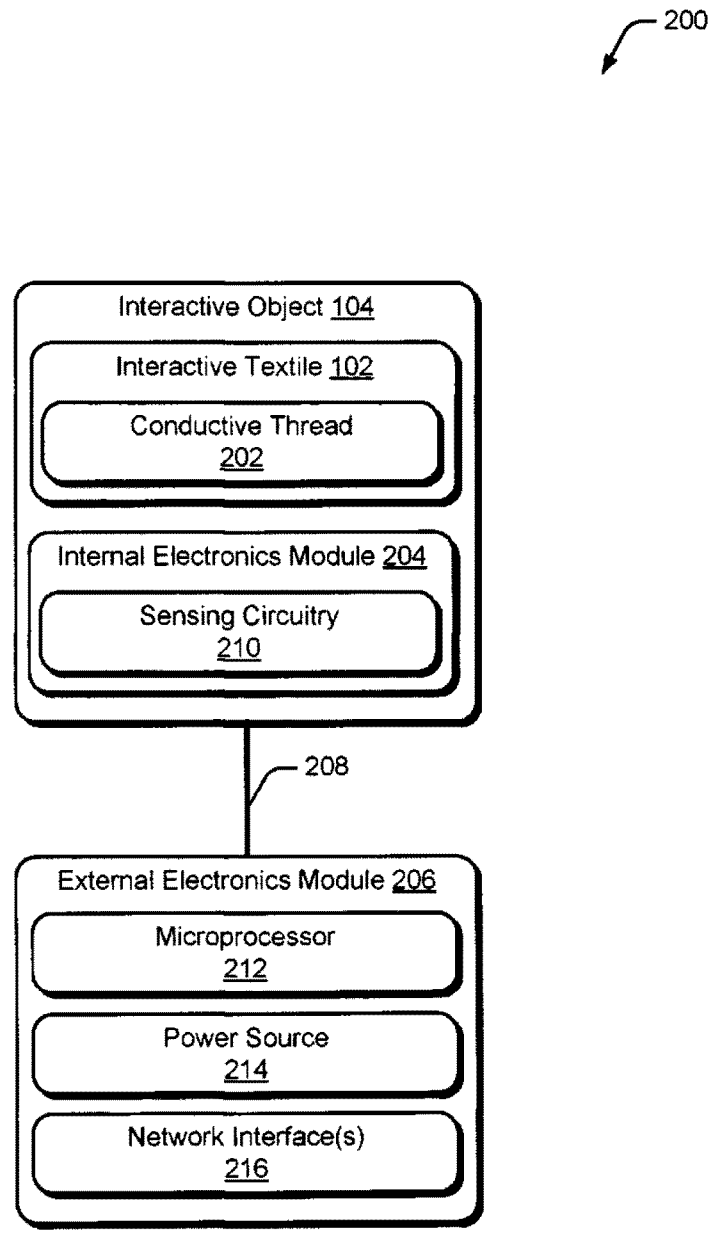
Figure 3:
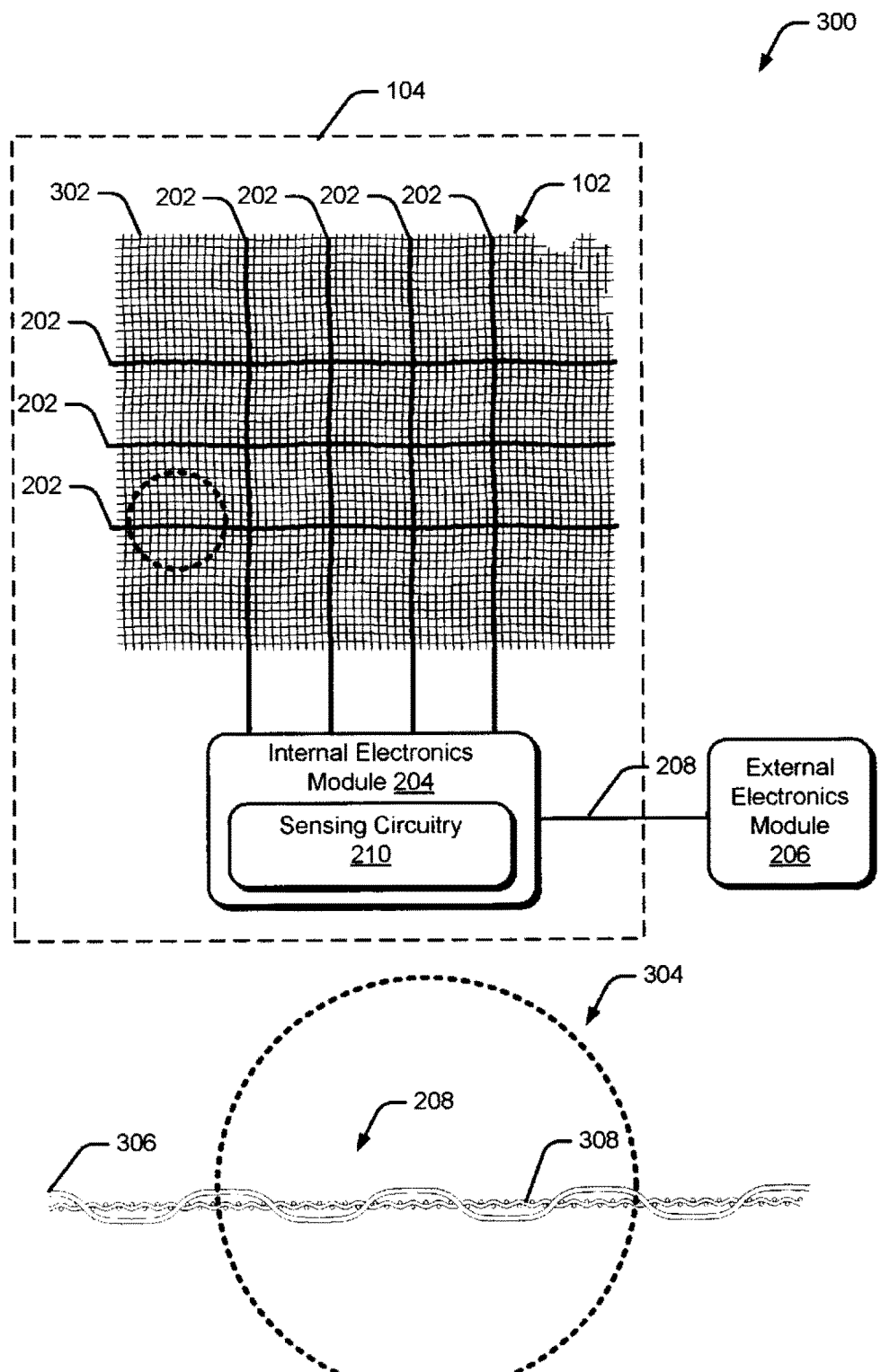
Figure 4:
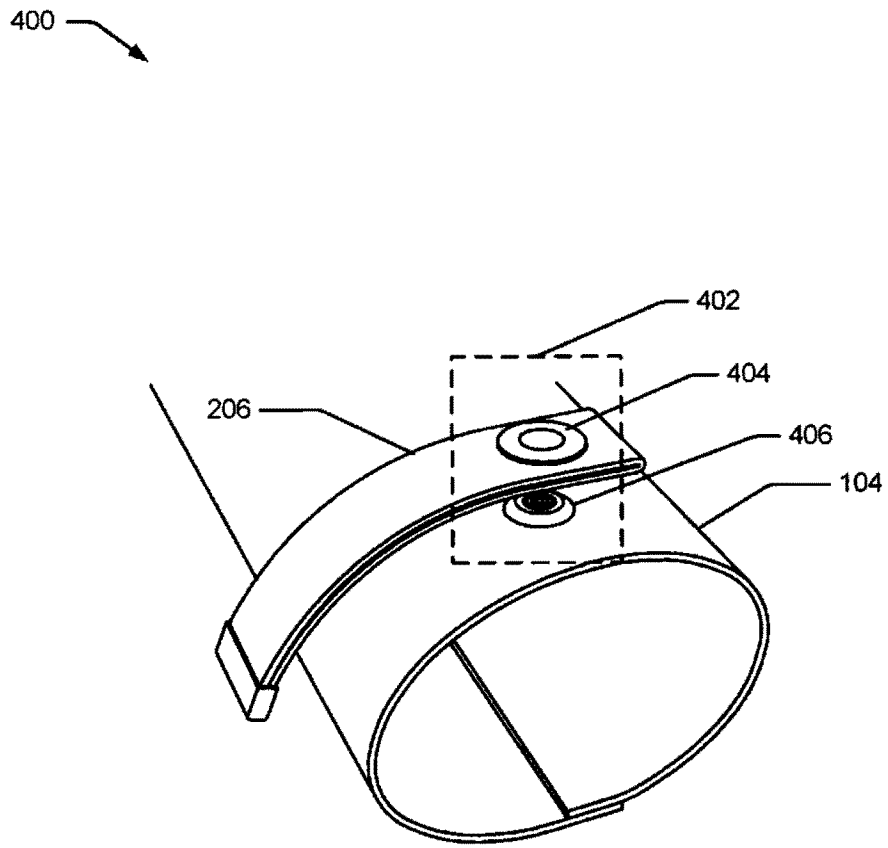
Figure 5:
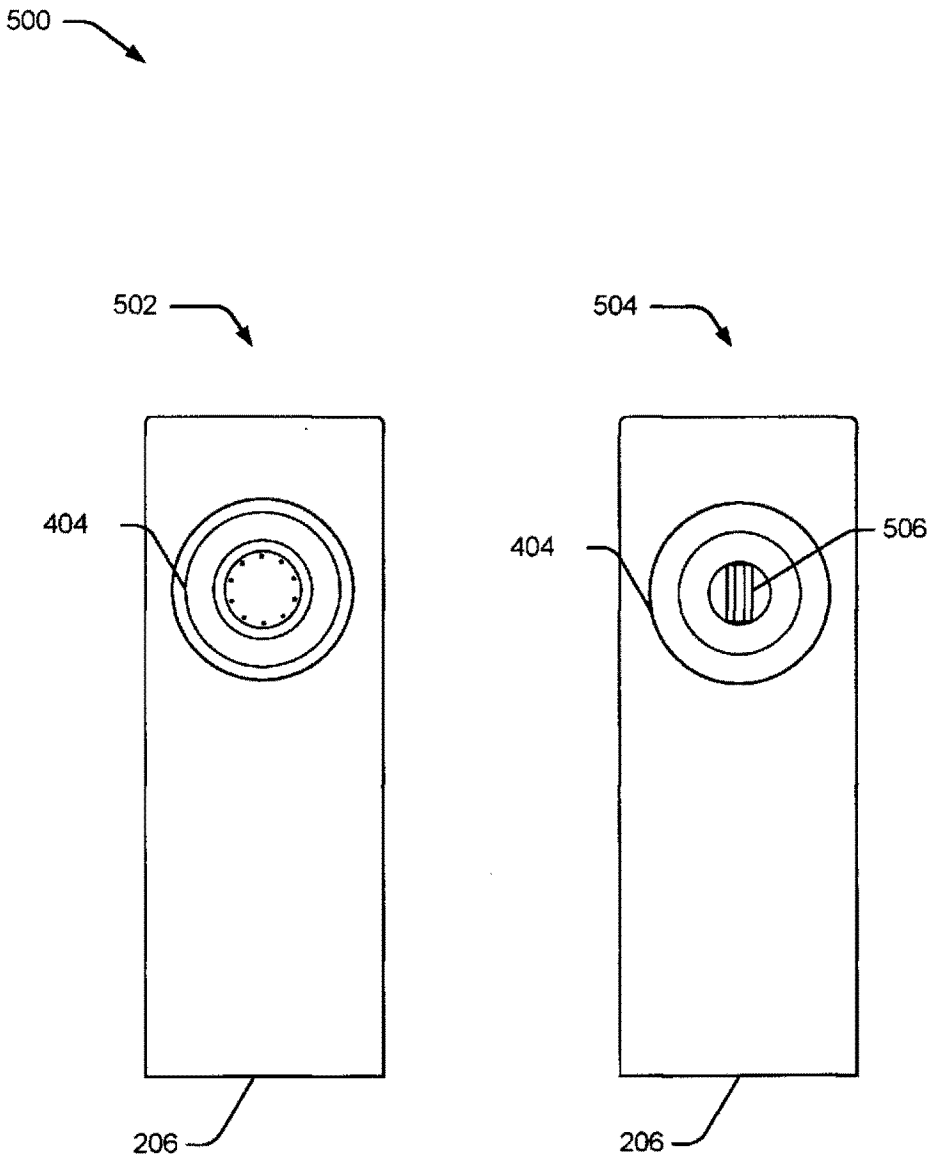
Figure 6:
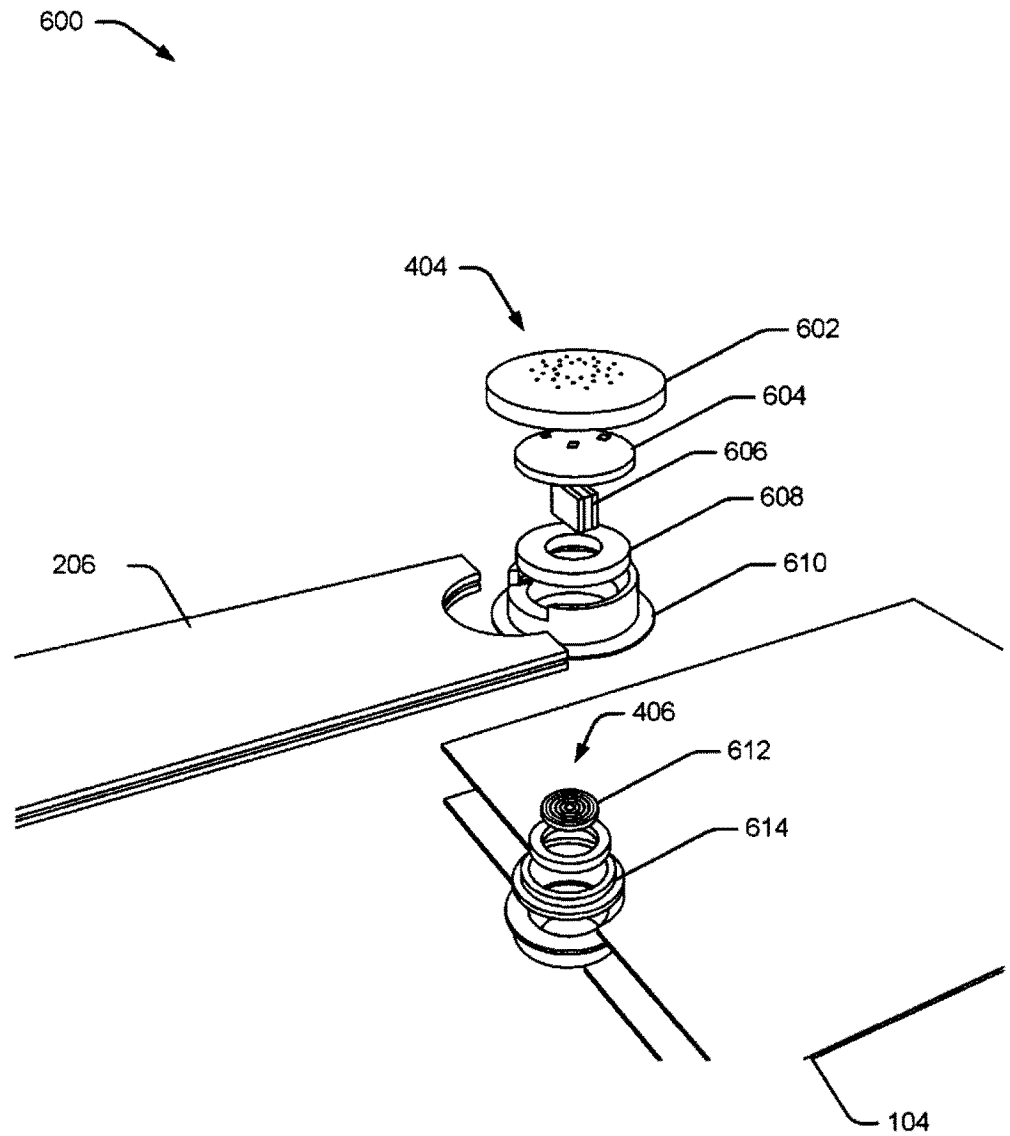
Figure 7:
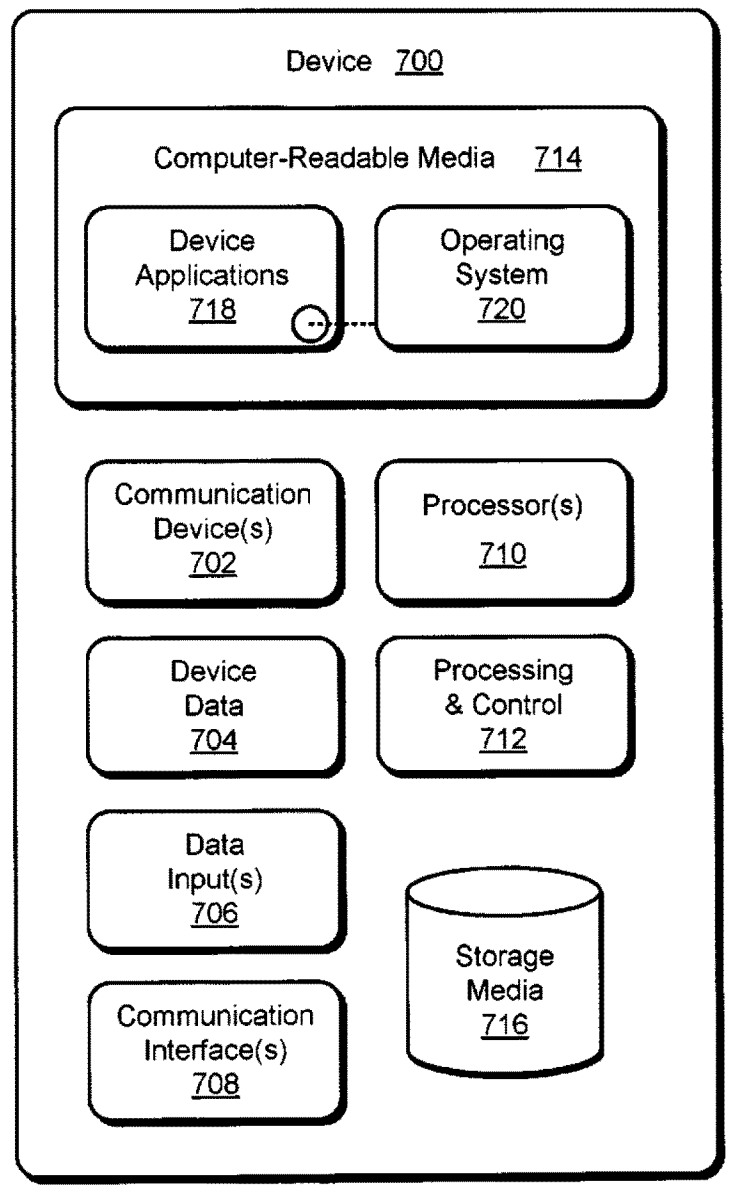

FIG. 7 illustrates various components of an example computing system 700 that can be implemented as any type of client, server, and/or computing device as described with reference to the previous FIGS. 1-6 to implement an interactive object with multiple electronics modules. For example, computing system 700 may correspond to external electronics module 206 and/or embedded in interactive object 104. In embodiments, computing system 700 can be implemented as one or a combination of a wired and/or wireless wearable device, System-on-Chip (SoC), and/or as another type of device or portion thereof. Computing system 700 may also be associated with a user (e.g., a person) and/or an entity that operates the device such that a device describes logical devices that include users, software, firmware, and/or a combination of devices.

Computing system 700 includes communication devices 702 that enable wired and/or wireless communication of device data 704 (e.g., received data, data that is being received, data scheduled for broadcast, data packets of the data, etc.). Device data 704 or other device content can include configuration settings of the device, media content stored on the device, and/or information associated with a user of the device. Media content stored on computing system 700 can include any type of audio, video, and/or image data. Computing system 700 includes one or more data inputs 706 via which any type of data, media content, and/or inputs can be received, such as human utterances, user-selectable inputs (explicit or implicit), messages, music, television media content, recorded video content, and any other type of audio, video, and/or image data received from any content and/or data source.

Computing system 700 also includes communication interfaces 708, which can be implemented as any one or more of a serial and/or parallel interface, a wireless interface, any type of network interface, a modem, and as any other type of communication interface. Communication interfaces 708 provide a connection and/or communication links between computing system 700 and a communication network by which other electronic, computing, and communication devices communicate data with computing system 700.

Computing system 700 includes one or more processors 710 (e.g., any of microprocessors, controllers, and the like), which process various computer-executable instructions to control the operation of computing system 700 and to enable techniques for, or in which can be embodied, interactive textiles. Alternatively or in addition, computing system 700 can be implemented with any one or combination of hardware, firmware, or fixed logic circuitry that is implemented in connection with processing and control circuits which are generally identified at 712. Although not shown, computing system 700 can include a system bus or data transfer system that couples the various components within the device. A system bus can include any one or combination of different bus structures, such as a memory bus or memory controller, a peripheral bus, a universal serial bus, and/or a processor or local bus that utilizes any of a variety of bus architectures.

Computing system 700 also includes computer-readable media 714, such as one or more memory devices that enable persistent and/or non-transitory data storage (i.e., in contrast to mere signal transmission), examples of which include random access memory (RAM), non-volatile memory (e.g., any one or more of a read-only memory (ROM), flash memory, EPROM, EEPROM, etc.), and a disk storage device. A disk storage device may be implemented as any type of magnetic or optical storage device, such as a hard disk drive, a recordable and/or rewriteable compact disc (CD), any type of a digital versatile disc (DVD), and the like. Computing system 700 can also include a mass storage media device 716.

Computer-readable media 714 provides data storage mechanisms to store device data 704, as well as various device applications 718 and any other types of information and/or data related to operational aspects of computing system 700. For example, an operating system 720 can be maintained as a computer application with computer-readable media 714 and executed on processors 710. Device applications 718 may include a device manager, such as any form of a control application, software application, signal-processing and control module, code that is native to a particular device, a hardware abstraction layer for a particular device, and so on. Device applications 718 also include any system components, engines, or managers to implement an interactive object with multiple electronics modules.

CONCLUSION

Although embodiments of techniques using, and objects including, an interactive object with multiple electronics modules has been described in language specific to features and/or methods, it is to be understood that the subject of the appended claims is not necessarily limited to the specific features or methods described. Rather, the specific features and methods are disclosed as example implementations of an interactive object with multiple electronics modules.

What is claimed is:

1. A system comprising:
    an interactive object comprising:
        a grid of conductive thread woven into the interactive object;
        an internal electronics module coupled to the grid of conductive thread, the internal electronics module comprising sensing circuitry configured to detect touch-input to the grid of conductive thread;
        an external electronics module comprising one or more electronic components, the external electronics module removably coupled to the interactive object, the external electronics module including an anisotropic conducting polymer configured to enable electrical connections between the one or more electronic components of the external electronics module and the sensing circuitry of the internal electronics module; and
    a communication interface configured to enable communication between the internal electronics module and the external electronics module when the external electronics module is coupled to the interactive object.

* * * * *

UNITED STATES PATENT AND TRADEMARK OFFICE
CERTIFICATE OF CORRECTION

PATENT NO. : 10,175,781 B2
APPLICATION NO. : 15/362359
DATED : January 8, 2019
INVENTOR(S) : Karagozler et al.

Page 1 of 22

It is certified that error appears in the above-identified patent and that said Letters Patent is hereby corrected as shown below:

Please delete Patent No. 10,175,781 B2 in its entirety and insert Patent No. 10,175,781 B2 in its entirety as shown on the attached pages.

Signed and Sealed this
Twenty-third Day of April, 2019

Andrei Iancu
*Director of the United States Patent and Trademark Office*

(12) United States Patent
Karagozler et al.

(10) Patent No.: US 10,175,781 B2
(45) Date of Patent: Jan. 8, 2019

(54) INTERACTIVE OBJECT WITH MULTIPLE ELECTRONICS MODULES

(71) Applicant: Google Inc., Mountain View, CA (US)

(72) Inventors: Mustafa Emre Karagozler, Mountain View, CA (US); Ivan Poupyrev, Sunnyvale, CA (US); Carsten C. Schwesig, San Francisco, CA (US); Hakim K. Raja, San Francisco, CA (US); Nan-Wei Gong, Cambridge, MA (US); Shiho Fukuhara, Tokyo (JP); Karen Elizabeth Robinson, Mountain View, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 15/362,359

(22) Filed: Nov. 28, 2016

(65) Prior Publication Data

US 2017/0329425 A1    Nov. 16, 2017

Related U.S. Application Data

(60) Provisional application No. 62/337,081, filed on May 16, 2016.

(51) Int. Cl.
*G09G 1/00*  (2006.01)
*G06F 3/0354*  (2013.01)
(Continued)

(52) U.S. Cl.
CPC ......... *G06F 3/03547* (2013.01); *A41D 1/002* (2013.01); *A41D 3/00* (2013.01);
(Continued)

(58) Field of Classification Search
CPC ... G06F 3/01; G06F 3/044; G06F 5/00; G06F 3/03547; G06F 3/0383; H03K 17/962
See application file for complete search history.

(56) References Cited

U.S. PATENT DOCUMENTS 3,610,874 A   10/1971  Gagliano
3,752,017 A   8/1973   Lloyd et al.
(Continued)

FOREIGN PATENT DOCUMENTS

CN   202887794   4/2013
CN   103355860   1/2016
(Continued)

OTHER PUBLICATIONS

"Corrected Notice of Allowance", U.S. Appl. No. 14/504,061, dated Dec. 27, 2016, 2 pages.
(Continued)

*Primary Examiner* — Michael Faragalla
(74) *Attorney, Agent, or Firm* — Colby Nipper

(57) ABSTRACT

This document describes an interactive object with multiple electronics modules. An interactive object (e.g., a garment) includes a grid or array of conductive thread woven into the interactive object, and an internal electronics module coupled to the grid of conductive thread. The internal electronics module includes a first subset of electronic components, such as sensing circuitry configured to detect touch-input to the grid of conductive thread. An external electronics module that includes a second subset of electronic components (e.g., a microprocessor, power source, or network interface) is removably coupled to the interactive object via a communication interface. The communication interface enables communication between the internal electronics module and the external electronics module when the external electronics module is coupled to the interactive object.

20 Claims, 7 Drawing Sheets

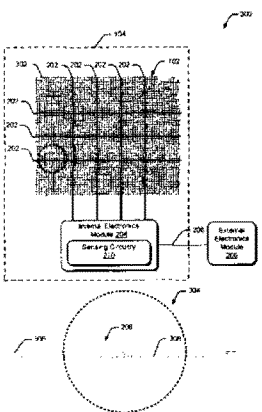

(51) Int. Cl.
*G06F 3/044* (2006.01)
*A41D 3/00* (2006.01)
*G06F 3/038* (2013.01)
*G06F 3/041* (2006.01)
*H05K 3/40* (2006.01)
*A41D 1/00* (2018.01)
*H05K 1/03* (2006.01)
*H05K 3/32* (2006.01)

(52) U.S. Cl.
CPC ............ *G06F 3/0383* (2013.01); *G06F 3/041* (2013.01); *G06F 3/044* (2013.01); *H05K 3/4015* (2013.01); *A41D 1/005* (2013.01); *G06F 2203/0383* (2013.01); *G06F 2203/04102* (2013.01); *G06F 2203/04103* (2013.01); *H05K 1/038* (2013.01); *H05K 3/323* (2013.01)

(56) References Cited

U.S. PATENT DOCUMENTS

| | | |
|---|---|---|
| 3,953,706 A | 4/1976 | Harris et al. |
| 4,104,012 A | 8/1978 | Ferrante |
| 4,654,967 A | 4/1987 | Thenner |
| 4,700,044 A | 10/1987 | Hokanson et al. |
| 4,795,998 A | 1/1989 | Dunbar et al. |
| 4,838,797 A | 6/1989 | Dodier |
| 5,016,500 A | 5/1991 | Conrad et al. |
| 5,298,715 A | 3/1994 | Chalco et al. |
| 5,341,979 A | 8/1994 | Gupta |
| 5,468,917 A | 11/1995 | Brodsky et al. |
| 5,564,571 A | 10/1996 | Zanotti |
| 5,656,798 A | 8/1997 | Kubo et al. |
| 5,724,707 A | 3/1998 | Kirk et al. |
| 5,798,798 A | 8/1998 | Rector et al. |
| 6,032,450 A | 3/2000 | Blum |
| 6,080,690 A | 6/2000 | Lebby et al. |
| 6,101,431 A | 8/2000 | Niwa et al. |
| 6,210,771 B1 | 4/2001 | Post et al. |
| 6,313,825 B1 | 11/2001 | Gilbert |
| 6,340,979 B1 | 1/2002 | Beaton et al. |
| 6,386,757 B1 | 5/2002 | Konno |
| 6,440,593 B2 | 8/2002 | Ellison et al. |
| 6,492,980 B2 | 12/2002 | Sandbach |
| 6,493,933 B1 | 12/2002 | Post et al. |
| 6,513,970 B1 | 2/2003 | Tabata et al. |
| 6,543,668 B1 | 4/2003 | Fujii et al. |
| 6,711,354 B2 | 3/2004 | Kameyama |
| 6,717,065 B2 | 4/2004 | Hosaka et al. |
| 6,802,720 B2 | 10/2004 | Weiss et al. |
| 6,833,807 B2 | 12/2004 | Flacke et al. |
| 6,835,898 B2 | 12/2004 | Eldridge et al. |
| 6,854,985 B1 | 2/2005 | Weiss |
| 6,929,484 B2 | 8/2005 | Weiss et al. |
| 7,134,879 B2 | 11/2006 | Sugimoto et al. |
| 7,164,820 B2 | 1/2007 | Eves et al. |
| 7,223,105 B2 | 5/2007 | Weiss et al. |
| 7,230,610 B2 | 6/2007 | Jung et al. |
| 7,249,954 B2 | 7/2007 | Weiss |
| 7,299,964 B2 | 11/2007 | Jayaraman et al. |
| 7,310,236 B2 | 12/2007 | Takahashi et al. |
| 7,317,416 B2 | 1/2008 | Flom et al. |
| 7,348,285 B2 | 3/2008 | Dhawan et al. |
| 7,365,031 B2 | 4/2008 | Swallow et al. |
| 7,421,061 B2 | 9/2008 | Boese et al. |
| 7,462,035 B2 | 12/2008 | Lee et al. |
| 7,528,082 B2 | 5/2009 | Krans et al. |
| 7,544,627 B2 | 6/2009 | Tao et al. |
| 7,578,195 B2 | 8/2009 | DeAngelis et al. |
| 7,644,488 B2 | 1/2010 | Aisenbrey |
| 7,670,144 B2 | 3/2010 | Ito et al. |
| 7,677,729 B2 | 3/2010 | Vilser et al. |
| 7,691,067 B2 | 4/2010 | Westbrook et al. |
| 7,698,154 B2 | 4/2010 | Marchosky |
| 7,791,700 B2 | 9/2010 | Bellamy |
| 7,834,276 B2 | 11/2010 | Chou et al. |
| 7,941,676 B2 | 5/2011 | Glaser |
| 7,952,512 B1 | 5/2011 | Delker et al. |
| 8,062,220 B2 | 11/2011 | Kurtz et al. |
| 8,169,404 B1 | 5/2012 | Boillot |
| 8,179,604 B1 | 5/2012 | Prada Gomez et al. |
| 8,282,232 B2 | 10/2012 | Hsu et al. |
| 8,289,185 B2 | 10/2012 | Alonso |
| 8,301,232 B2 | 10/2012 | Albert et al. |
| 8,314,732 B2 | 11/2012 | Oswald et al. |
| 8,334,226 B2 | 12/2012 | Nhan et al. |
| 8,341,762 B2 | 1/2013 | Balzano |
| 8,344,949 B2 | 1/2013 | Moshfeghi |
| 8,367,942 B2 | 2/2013 | Howell et al. |
| 8,475,367 B1 | 7/2013 | Yuen et al. |
| 8,505,474 B2 | 8/2013 | Kang et al. |
| 8,514,221 B2 | 8/2013 | King et al. |
| 8,527,146 B1 | 9/2013 | Jackson et al. |
| 8,549,829 B2 | 10/2013 | Song et al. |
| 8,560,972 B2 | 10/2013 | Wilson |
| 8,569,189 B2 | 10/2013 | Bhattacharya et al. |
| 8,614,689 B2 | 12/2013 | Nishikawa et al. |
| 8,700,137 B2 | 4/2014 | Albert |
| 8,758,020 B2 | 6/2014 | Burdea et al. |
| 8,759,713 B2 | 6/2014 | Sheats |
| 8,764,651 B2 | 7/2014 | Tran |
| 8,785,778 B2 | 7/2014 | Streeter et al. |
| 8,790,257 B2 | 7/2014 | Libbus et al. |
| 8,814,574 B2 | 8/2014 | Selby et al. |
| 8,921,473 B1 | 12/2014 | Hyman |
| 8,948,839 B1 | 2/2015 | Longinotti-Buitoni et al. |
| 9,055,879 B2 | 6/2015 | Selby et al. |
| 9,093,289 B2 | 7/2015 | Vicard et al. |
| 9,125,456 B2 | 9/2015 | Chow |
| 9,141,194 B1 | 9/2015 | Keyes et al. |
| 9,148,949 B2 | 9/2015 | Zhou et al. |
| 9,230,160 B1 | 1/2016 | Kanter |
| 9,235,241 B2 | 1/2016 | Newham et al. |
| 9,331,422 B2 | 5/2016 | Nazzaro et al. |
| 9,335,825 B2 | 5/2016 | Rautiainen et al. |
| 9,354,709 B2 | 5/2016 | Heller et al. |
| 9,569,001 B2 | 2/2017 | Mistry et al. |
| 9,575,560 B2 | 2/2017 | Poupyrev et al. |
| 9,588,625 B2 | 3/2017 | Poupyrev |
| 9,594,443 B2 | 3/2017 | VanBlon et al. |
| 9,600,080 B2 | 3/2017 | Poupyrev |
| 9,693,592 B2 | 7/2017 | Robinson et al. |
| 9,766,742 B2 | 9/2017 | Papakostas |
| 9,778,749 B2 | 10/2017 | Poupyrev |
| 9,811,164 B2 | 11/2017 | Poupyrev |
| 9,817,109 B2 | 11/2017 | Saboo et al. |
| 9,837,760 B2 | 12/2017 | Karagozler et al. |
| 9,921,660 B2 | 3/2018 | Poupyrev |
| 9,933,908 B2 | 4/2018 | Poupyrev |
| 9,971,414 B2 | 5/2018 | Gollakota et al. |
| 9,971,415 B2 | 5/2018 | Poupyrev et al. |
| 9,983,747 B2 | 5/2018 | Poupyrev |
| 10,082,950 B2 | 9/2018 | Lapp |
| 10,088,908 B1 | 10/2018 | Poupyrev et al. |
| 2001/0035836 A1 | 11/2001 | Miceli et al. |
| 2002/0080156 A1 | 6/2002 | Abbott et al. |
| 2002/0170897 A1 | 11/2002 | Hall |
| 2003/0100228 A1 | 5/2003 | Bungo et al. |
| 2003/0119391 A1 | 6/2003 | Swallow et al. |
| 2004/0009729 A1 | 1/2004 | Hill et al. |
| 2004/0259391 A1 | 12/2004 | Jung et al. |
| 2005/0069695 A1 | 3/2005 | Jung et al. |
| 2005/0128124 A1 | 6/2005 | Greneker et al. |
| 2005/0148876 A1 | 7/2005 | Endoh et al. |
| 2006/0035554 A1 | 2/2006 | Glaser et al. |
| 2006/0040739 A1 | 2/2006 | Wells |
| 2006/0047386 A1 | 3/2006 | Kanevsky et al. |
| 2006/0061504 A1 | 3/2006 | Leach, Jr. et al. |
| 2006/0125803 A1 | 6/2006 | Westerman et al. |
| 2006/0136997 A1 | 6/2006 | Telek et al. |
| 2006/0148351 A1 | 7/2006 | Tao et al. |
| 2006/0157734 A1 | 7/2006 | Onodero et al. |
| 2006/0166620 A1 | 7/2006 | Sorensen |
| 2006/0170584 A1 | 8/2006 | Romero et al. |

(56) References Cited

U.S. PATENT DOCUMENTS

| | | |
|---|---|---|
| 2006/0209021 A1 | 9/2006 | Yoo et al. |
| 2006/0258205 A1 | 11/2006 | Locher et al. |
| 2007/0024488 A1 | 2/2007 | Zemany et al. |
| 2007/0026695 A1 | 2/2007 | Lee et al. |
| 2007/0118043 A1 | 5/2007 | Oliver et al. |
| 2007/0161921 A1 | 7/2007 | Rausch |
| 2007/0176821 A1 | 8/2007 | Flom et al. |
| 2007/0192647 A1 | 8/2007 | Glaser |
| 2007/0197115 A1 | 8/2007 | Eves et al. |
| 2007/0197878 A1 | 8/2007 | Shklarski |
| 2007/0210074 A1 | 9/2007 | Maurer et al. |
| 2007/0237423 A1 | 10/2007 | Tico et al. |
| 2008/0002027 A1 | 1/2008 | Kondo et al. |
| 2008/0024438 A1 | 1/2008 | Collins et al. |
| 2008/0065291 A1 | 3/2008 | Breed |
| 2008/0134102 A1 | 6/2008 | Movold et al. |
| 2008/0136775 A1 | 6/2008 | Conant |
| 2008/0168396 A1 | 7/2008 | Matas et al. |
| 2008/0211766 A1 | 9/2008 | Westerman et al. |
| 2008/0233822 A1 | 9/2008 | Swallow et al. |
| 2008/0282665 A1 | 11/2008 | Speleers |
| 2008/0291158 A1 | 11/2008 | Park et al. |
| 2008/0303800 A1 | 12/2008 | Elwell |
| 2008/0316085 A1 | 12/2008 | Rofougaran et al. |
| 2008/0320419 A1 | 12/2008 | Matas et al. |
| 2009/0018428 A1 | 1/2009 | Dias et al. |
| 2009/0033585 A1 | 2/2009 | Lang |
| 2009/0053950 A1 | 2/2009 | Surve |
| 2009/0056300 A1 | 3/2009 | Chung et al. |
| 2009/0058820 A1 | 3/2009 | Hinckley |
| 2009/0113298 A1 | 4/2009 | Jung et al. |
| 2009/0115617 A1 | 5/2009 | Sano et al. |
| 2009/0118648 A1 | 5/2009 | Kandori et al. |
| 2009/0149036 A1 | 6/2009 | Lee et al. |
| 2009/0177068 A1 | 7/2009 | Stivoric et al. |
| 2009/0203244 A1 | 8/2009 | Toonder |
| 2009/0270690 A1 | 10/2009 | Roos et al. |
| 2009/0278915 A1 | 11/2009 | Kramer et al. |
| 2009/0288762 A1 | 11/2009 | Wolfel |
| 2009/0295712 A1 | 12/2009 | Ritzau |
| 2009/0319181 A1 | 12/2009 | Khosravy et al. |
| 2010/0050133 A1 | 2/2010 | Nishihara et al. |
| 2010/0053151 A1 | 3/2010 | Marti et al. |
| 2010/0065320 A1 | 3/2010 | Urano |
| 2010/0071205 A1 | 3/2010 | Graumann et al. |
| 2010/0094141 A1 | 4/2010 | Puswella |
| 2010/0201586 A1 | 8/2010 | Michalk |
| 2010/0205667 A1 | 8/2010 | Anderson et al. |
| 2010/0208035 A1 | 8/2010 | Pinault et al. |
| 2010/0225562 A1 | 9/2010 | Smith |
| 2010/0234094 A1 | 9/2010 | Gagner et al. |
| 2010/0241009 A1 | 9/2010 | Petkie |
| 2010/0281438 A1 | 11/2010 | Latta et al. |
| 2010/0306713 A1 | 12/2010 | Geisner et al. |
| 2010/0313414 A1 | 12/2010 | Sheats |
| 2010/0325770 A1 | 12/2010 | Chung et al. |
| 2011/0003664 A1 | 1/2011 | Richard |
| 2011/0010014 A1 | 1/2011 | Oexman et al. |
| 2011/0073353 A1 | 3/2011 | Lee et al. |
| 2011/0093820 A1 | 4/2011 | Zhang et al. |
| 2011/0166940 A1 | 7/2011 | Bangera et al. |
| 2011/0181509 A1 | 7/2011 | Rautiainen et al. |
| 2011/0181510 A1 | 7/2011 | Hakala et al. |
| 2011/0197263 A1 | 8/2011 | Stinson, III |
| 2011/0213218 A1 | 9/2011 | Weiner et al. |
| 2011/0221666 A1 | 9/2011 | Newton et al. |
| 2011/0234492 A1 | 9/2011 | Ajmera et al. |
| 2011/0279303 A1 | 11/2011 | Smith |
| 2011/0286585 A1 | 11/2011 | Hodge |
| 2011/0303341 A1 | 12/2011 | Meiss et al. |
| 2011/0307842 A1 | 12/2011 | Chiang et al. |
| 2011/0318985 A1 | 12/2011 | McDermid |
| 2012/0001875 A1 | 1/2012 | Li et al. |
| 2012/0019168 A1 | 1/2012 | Noda et al. |
| 2012/0047468 A1 | 2/2012 | Santos et al. |
| 2012/0068876 A1 | 3/2012 | Bangera et al. |
| 2012/0092284 A1 | 4/2012 | Rofougaran et al. |
| 2012/0123232 A1 | 5/2012 | Najarian et al. |
| 2012/0127082 A1 | 5/2012 | Kushler et al. |
| 2012/0144934 A1 | 6/2012 | Russell et al. |
| 2012/0150493 A1 | 6/2012 | Casey et al. |
| 2012/0154313 A1 | 6/2012 | Au et al. |
| 2012/0156926 A1 | 6/2012 | Kato et al. |
| 2012/0174299 A1 | 7/2012 | Balzano |
| 2012/0174736 A1 | 7/2012 | Wang et al. |
| 2012/0193801 A1 | 8/2012 | Gross et al. |
| 2012/0248093 A1 | 10/2012 | Ulrich et al. |
| 2012/0254810 A1 | 10/2012 | Heck et al. |
| 2012/0268416 A1 | 10/2012 | Pirogov et al. |
| 2012/0280900 A1 | 11/2012 | Wang et al. |
| 2012/0298748 A1 | 11/2012 | Factor et al. |
| 2012/0310665 A1 | 12/2012 | Xu et al. |
| 2013/0016070 A1 | 1/2013 | Starner et al. |
| 2013/0027218 A1 | 1/2013 | Schwarz et al. |
| 2013/0046544 A1 | 2/2013 | Kay et al. |
| 2013/0053653 A1 | 2/2013 | Cuddihy et al. |
| 2013/0078624 A1 | 3/2013 | Holmes et al. |
| 2013/0082922 A1 | 4/2013 | Miller |
| 2013/0083173 A1 | 4/2013 | Geisner et al. |
| 2013/0102217 A1 | 4/2013 | Jeon |
| 2013/0104084 A1 | 4/2013 | Mlyniec et al. |
| 2013/0117377 A1 | 5/2013 | Miller |
| 2013/0132931 A1 | 5/2013 | Bruns et al. |
| 2013/0147833 A1 | 6/2013 | Aubauer et al. |
| 2013/0150735 A1 | 6/2013 | Cheng |
| 2013/0161078 A1 | 6/2013 | Li |
| 2013/0169471 A1 | 7/2013 | Lynch |
| 2013/0194173 A1 | 8/2013 | Zhu et al. |
| 2013/0195330 A1 | 8/2013 | Kim et al. |
| 2013/0196716 A1 | 8/2013 | Muhammad |
| 2013/0207962 A1 | 8/2013 | Oberdorfer et al. |
| 2013/0253029 A1 | 9/2013 | Jain et al. |
| 2013/0260630 A1 | 10/2013 | Ito et al. |
| 2013/0278499 A1 | 10/2013 | Anderson |
| 2013/0278501 A1 | 10/2013 | Bulzacki |
| 2013/0332438 A1 | 12/2013 | Li et al. |
| 2013/0345569 A1 | 12/2013 | Mestha et al. |
| 2014/0005809 A1 | 1/2014 | Frei et al. |
| 2014/0028539 A1 | 1/2014 | Newham et al. |
| 2014/0049487 A1 | 2/2014 | Konertz et al. |
| 2014/0050354 A1 | 2/2014 | Heim et al. |
| 2014/0070957 A1 | 3/2014 | Longinotti-Buitoni et al. |
| 2014/0073969 A1 | 3/2014 | Zou et al. |
| 2014/0081100 A1 | 3/2014 | Muhsin et al. |
| 2014/0095480 A1 | 4/2014 | Marantz et al. |
| 2014/0121540 A1 | 5/2014 | Raskin |
| 2014/0135631 A1 | 5/2014 | Brumback et al. |
| 2014/0139422 A1 | 5/2014 | Mistry et al. |
| 2014/0139616 A1 | 5/2014 | Pinter et al. |
| 2014/0143678 A1 | 5/2014 | Mistry et al. |
| 2014/0184496 A1 | 7/2014 | Gribetz et al. |
| 2014/0184499 A1 | 7/2014 | Kim |
| 2014/0191939 A1 | 7/2014 | Penn et al. |
| 2014/0200416 A1 | 7/2014 | Kashef et al. |
| 2014/0201690 A1 | 7/2014 | Holz |
| 2014/0208275 A1 | 7/2014 | Mongia et al. |
| 2014/0215389 A1 | 7/2014 | Walsh et al. |
| 2014/0239065 A1 | 8/2014 | Zhou et al. |
| 2014/0244277 A1 | 8/2014 | Krishna Rao et al. |
| 2014/0246415 A1 | 9/2014 | Wittkowski |
| 2014/0247212 A1 | 9/2014 | Kim et al. |
| 2014/0250515 A1 | 9/2014 | Jakobsson |
| 2014/0253431 A1 | 9/2014 | Gossweiler et al. |
| 2014/0253709 A1 | 9/2014 | Bresch et al. |
| 2014/0262478 A1 | 9/2014 | Harris et al. |
| 2014/0280295 A1 | 9/2014 | Kurochikin et al. |
| 2014/0281975 A1 | 9/2014 | Anderson |
| 2014/0282877 A1 | 9/2014 | Mahaffey et al. |
| 2014/0297006 A1 | 10/2014 | Sadhu |
| 2014/0298266 A1 | 10/2014 | Lapp |
| 2014/0306936 A1 | 10/2014 | Dahl et al. |
| 2014/0316261 A1 | 10/2014 | Lux et al. |
| 2014/0318699 A1 | 10/2014 | Longinotti-Buitoni et al. |
| 2014/0324888 A1 | 10/2014 | Xie et al. |

(56) References Cited

U.S. PATENT DOCUMENTS

| | | |
|---|---|---|
| 2014/0333467 A1 | 11/2014 | Inomata |
| 2014/0343392 A1 | 11/2014 | Yang |
| 2014/0347295 A1 | 11/2014 | Kim et al. |
| 2014/0357369 A1 | 12/2014 | Callens et al. |
| 2014/0368441 A1 | 12/2014 | Touloumtzis |
| 2015/0002391 A1 | 1/2015 | Chen |
| 2015/0009096 A1 | 1/2015 | Lee et al. |
| 2015/0029050 A1 | 1/2015 | Driscoll et al. |
| 2015/0030256 A1 | 1/2015 | Brady et al. |
| 2015/0040040 A1 | 2/2015 | Balan et al. |
| 2015/0062033 A1 | 3/2015 | Ishihara |
| 2015/0068069 A1 | 3/2015 | Tran et al. |
| 2015/0077282 A1 | 3/2015 | Mohamadi |
| 2015/0085060 A1 | 3/2015 | Fish et al. |
| 2015/0091820 A1 | 4/2015 | Rosenberg et al. |
| 2015/0091858 A1 | 4/2015 | Rosenberg et al. |
| 2015/0091859 A1 | 4/2015 | Rosenberg et al. |
| 2015/0112606 A1 | 4/2015 | He et al. |
| 2015/0133017 A1 | 5/2015 | Liao et al. |
| 2015/0143601 A1 | 5/2015 | Longinotti-Buitoni et al. |
| 2015/0145805 A1 | 5/2015 | Liu |
| 2015/0162729 A1 | 6/2015 | Reversat et al. |
| 2015/0177866 A1 | 6/2015 | Hwang et al. |
| 2015/0185314 A1 | 7/2015 | Corcos et al. |
| 2015/0199045 A1 | 7/2015 | Robucci et al. |
| 2015/0226004 A1 | 8/2015 | Thompson |
| 2015/0256763 A1 | 9/2015 | Niemi |
| 2015/0261320 A1 | 9/2015 | Leto |
| 2015/0268027 A1 | 9/2015 | Gerdes |
| 2015/0268799 A1 | 9/2015 | Starner et al. |
| 2015/0277569 A1 | 10/2015 | Sprenger et al. |
| 2015/0280102 A1 | 10/2015 | Tajitsu et al. |
| 2015/0312041 A1 | 10/2015 | Choi |
| 2015/0317518 A1 | 11/2015 | Fujimaki et al. |
| 2015/0323993 A1 | 11/2015 | Levesque et al. |
| 2015/0332075 A1 | 11/2015 | Burch |
| 2015/0341550 A1 | 11/2015 | Lay |
| 2015/0346820 A1 | 12/2015 | Poupyrev et al. |
| 2015/0375339 A1 | 12/2015 | Sterling et al. |
| 2016/0018948 A1 | 1/2016 | Parvarandeh et al. |
| 2016/0026253 A1 | 1/2016 | Bradski et al. |
| 2016/0038083 A1 | 2/2016 | Ding et al. |
| 2016/0041617 A1 | 2/2016 | Poupyrev |
| 2016/0041618 A1 | 2/2016 | Poupyrev |
| 2016/0042169 A1 | 2/2016 | Polehn |
| 2016/0048235 A1 | 2/2016 | Poupyrev |
| 2016/0048236 A1 | 2/2016 | Poupyrev |
| 2016/0048672 A1 | 2/2016 | Lux et al. |
| 2016/0054792 A1 | 2/2016 | Poupyrev |
| 2016/0054803 A1 | 2/2016 | Poupyrev |
| 2016/0054804 A1 | 2/2016 | Gollakata et al. |
| 2016/0055201 A1 | 2/2016 | Poupyrev et al. |
| 2016/0090839 A1 | 3/2016 | Stolarcyzk |
| 2016/0098089 A1 | 4/2016 | Poupyrev |
| 2016/0100166 A1 | 4/2016 | Dragne et al. |
| 2016/0103500 A1 | 4/2016 | Hussey et al. |
| 2016/0106328 A1 | 4/2016 | Mestha et al. |
| 2016/0145776 A1 | 5/2016 | Roh |
| 2016/0170491 A1 | 6/2016 | Jung |
| 2016/0171293 A1 | 6/2016 | Li et al. |
| 2016/0186366 A1 | 6/2016 | McMaster |
| 2016/0216825 A1 | 7/2016 | Forutanpour |
| 2016/0249698 A1 | 9/2016 | Berzowska et al. |
| 2016/0253044 A1 | 9/2016 | Katz |
| 2016/0259037 A1 | 9/2016 | Molchanov et al. |
| 2016/0282988 A1 | 9/2016 | Poupyrev |
| 2016/0283101 A1 | 9/2016 | Schwesig et al. |
| 2016/0284436 A1 | 9/2016 | Fukuhara et al. |
| 2016/0299526 A1 | 10/2016 | Inagaki et al. |
| 2016/0320852 A1 | 11/2016 | Poupyrev |
| 2016/0320853 A1 | 11/2016 | Lien et al. |
| 2016/0320854 A1 | 11/2016 | Lien et al. |
| 2016/0321428 A1 | 11/2016 | Rogers |
| 2016/0345638 A1 | 12/2016 | Robinson et al. |
| 2016/0349790 A1 | 12/2016 | Connor |
| 2016/0349845 A1 | 12/2016 | Poupyrev et al. |
| 2016/0377712 A1 | 12/2016 | Wu et al. |
| 2017/0052618 A1 | 2/2017 | Lee et al. |
| 2017/0060254 A1 | 3/2017 | Molchanov et al. |
| 2017/0060298 A1 * | 3/2017 | Hwang ............. A61B 5/6807 |
| 2017/0075481 A1 | 3/2017 | Chou et al. |
| 2017/0075496 A1 | 3/2017 | Rosenberg et al. |
| 2017/0097413 A1 | 4/2017 | Gillian et al. |
| 2017/0097684 A1 | 4/2017 | Lien |
| 2017/0115777 A1 | 4/2017 | Poupyrev |
| 2017/0125940 A1 | 5/2017 | Karagozler et al. |
| 2017/0192523 A1 | 7/2017 | Poupyrev |
| 2017/0196513 A1 | 7/2017 | Longinotti-Buitoni et al. |
| 2017/0232538 A1 | 8/2017 | Robinson et al. |
| 2017/0233903 A1 | 8/2017 | Jeon |
| 2017/0249033 A1 * | 8/2017 | Podhajny ............. G06F 3/044 |
| 2017/0322633 A1 | 11/2017 | Shen et al. |
| 2017/0325337 A1 | 11/2017 | Karagozler et al. |
| 2017/0325518 A1 | 11/2017 | Poupyrev et al. |
| 2018/0004301 A1 | 1/2018 | Poupyrev |
| 2018/0005766 A1 | 1/2018 | Fairbanks et al. |
| 2018/0046258 A1 | 2/2018 | Poupyrev |
| 2018/0157330 A1 | 6/2018 | Gu et al. |
| 2018/0160943 A1 | 6/2018 | Fyfe et al. |
| 2018/0196527 A1 | 7/2018 | Poupyrev et al. |

FOREIGN PATENT DOCUMENTS

| | | |
|---|---|---|
| DE | 102011075725 | 11/2012 |
| DE | 102013201359 | 7/2014 |
| EP | 0161895 | 11/1985 |
| EP | 1815788 | 8/2007 |
| GB | 2070469 | 9/1981 |
| GB | 2443208 | 4/2008 |
| JP | 2003280049 | 10/2003 |
| JP | 2006234716 | 9/2006 |
| JP | 2011102457 | 5/2011 |
| WO | WO-0130123 | 4/2001 |
| WO | WO-2001027855 | 4/2001 |
| WO | WO-0175778 | 10/2001 |
| WO | WO-2002082999 | 10/2002 |
| WO | WO-2005033387 | 4/2005 |
| WO | 2007125298 | 11/2007 |
| WO | WO-2008061385 | 5/2008 |
| WO | WO-2009032073 | 3/2009 |
| WO | 2009083467 | 7/2009 |
| WO | WO-2010032173 | 3/2010 |
| WO | WO-2012026013 | 3/2012 |
| WO | WO-2012152476 | 11/2012 |
| WO | WO-2013082806 | 6/2013 |
| WO | WO-2013084108 | 6/2013 |
| WO | WO-2013186696 | 12/2013 |
| WO | WO-2013191657 | 12/2013 |
| WO | WO-2014019085 | 2/2014 |
| WO | WO-2014116968 | 7/2014 |
| WO | WO-2014136027 | 9/2014 |
| WO | WO-2014138280 | 9/2014 |
| WO | WO-2014160893 | 10/2014 |
| WO | WO-2014165476 | 10/2014 |
| WO | WO-2014204323 | 12/2014 |
| WO | WO-2015017931 | 2/2015 |
| WO | WO-2015022671 | 2/2015 |
| WO | 2016053624 | 4/2016 |
| WO | 2017200570 | 11/2017 |
| WO | 20170200949 | 11/2017 |
| WO | 2018106306 | 6/2018 |

OTHER PUBLICATIONS

"Corrected Notice of Allowance", U.S. Appl. No. 14/582,896, dated Dec. 19, 2016, 2 pages.
"International Search Report and Written Opinion", Application No. PCT/US2016/024289, dated Aug. 25, 2016, 17 pages.
Cheng,"Smart Textiles: From Niche to Mainstream", IEEE Pervasive Computing, Jul. 2013, pp. 81-84.
Farringdon,"Wearable Sensor Badge & Sensor Jacket for Context Awareness", Third International Symposium on Wearable Computers, Oct. 1999, 7 pages.

(56) References Cited

OTHER PUBLICATIONS

Schneegass,"Towards a Garment OS: Supporting Application Development for Smart Garments", Wearable Computers, ACM, Sep. 2014, 6 pages.
"Combined Search and Examination Report", GB Application No. 1620891.0, dated May 31, 2017, 9 pages.
"Final Office Action", U.S. Appl. No. 15/398,147, dated Jun. 30, 2017, 11 pages.
"Final Office Action", U.S. Appl. No. 14/874,955, dated Jun. 30, 2017, 9 pages.
"Final Office Action", U.S. Appl. No. 14/959,799, dated Jul. 19, 2017, 12 pages.
"Final Office Action", U.S. Appl. No. 14/504,121, dated Aug. 8, 2017, 16 pages.
"International Search Report and Written Opinion", Application No. PCT/US2016/063874, dated May 11, 2017, 19 pages.
"Non-Final Office Action", U.S. Appl. No. 14/862,409, dated Jun. 22, 2017, 15 pages.
"Non-Final Office Action", U.S. Appl. No. 14/959,730, dated Jun. 23, 2017, 14 pages.
"Notice of Allowance", U.S. Appl. No. 14/513,875, dated Jun. 28, 2017, 7 pages.
"Notice of Allowance", U.S. Appl. No. 15/343,067, dated Jul. 27, 2017, 9 pages.
"Notice of Allowance", U.S. Appl. No. 14/504,038, dated Aug. 7, 2017, 17 pages.
"Cardiio", Retrieved From: <http://www.cardiio.com/> Apr. 15, 2015 App Information Retrieved From: <https://itunes.apple.com/us/app/cardiio-touchless-camera-pulse/id542891434?ls=1&mt=8> Apr. 15, 2015, Feb. 24, 2015, 6 pages.
"Corrected Notice of Allowance", U.S. Appl. No. 14/312,486, dated Oct. 28, 2016, 4 pages.
"Extended European Search Report", EP Application No. 15170577.9, dated Nov. 5, 2015, 12 pages.
"Final Office Action", U.S. Appl. No. 14/312,486, dated Jun. 3, 2016, 32 pages.
"Final Office Action", U.S. Appl. No. 14/504,038, dated Sep. 27, 2016, 23 pages.
"Final Office Action", U.S. Appl. No. 14/504,061, dated Mar. 9, 2016, 10 pages.
"Frogpad Introduces Wearable Fabric Keyboard with Bluetooth Technology", Retrieved From: <http://www.geekzone.co.nz/content.asp?contentid=3898> Mar. 16, 2015, Jan. 7, 2005, 2 pages.
"International Search Report and Written Opinion", Application No. PCT/US2015/044774, dated Nov. 3, 2015, 12 pages.
"International Search Report and Written Opinion", Application No. PCT/US2016/024267, dated Jun. 20, 2016, 13 pages.
"International Search Report and Written Opinion", Application No. PCT/US2016/024273, dated Jun. 20, 2016, 13 pages.
"International Search Report and Written Opinion", Application No. PCT/US2016/032307, dated Aug. 25, 2016, 13 pages.
"International Search Report and Written Opinion", Application No. PCT/US2016/029820, dated Jul. 15, 2016, 14 pages.
"International Search Report and Written Opinion", Application No. PCT/US2016/030177, dated Aug. 2, 2016, 15 pages.
"International Search Report and Written Opinion", Application No. PCT/US2015/043963, dated Nov. 24, 2015, 16 pages.
"International Search Report and Written Opinion", Application No. PCT/US2015/050903, dated Feb. 19, 2016, 18 pages.
"International Search Report and Written Opinion", Application No. PCT/US2016/030115, dated Aug. 8, 2016, 18 pages.
"International Search Report and Written Opinion", Application No. PCT/US2015/043949, dated Dec. 1, 2015, 18 pages.
"Non-Final Office Action", U.S. Appl. No. 14/312,486, dated Oct. 23, 2015, 25 pages.
"Non-Final Office Action", U.S. Appl. No. 14/504,038, dated Feb. 26, 2016, 22 pages.
"Non-Final Office Action", U.S. Appl. No. 14/504,061, dated Nov. 4, 2015, 8 pages.
"Non-Final Office Action", U.S. Appl. No. 14/518,863, dated Oct. 14, 2016, 16 pages.
"Non-Final Office Action", U.S. Appl. No. 14/582,896, dated Jun. 29, 2016, 9 pages.
"Non-Final Office Action", U.S. Appl. No. 14/666,155, dated Aug. 24, 2016, 9 pages.
"Non-Final Office Action", U.S. Appl. No. 14/681,625, dated Aug. 12, 2016, 9 pages.
"Non-Final Office Action", U.S. Appl. No. 14/930,220, dated Sep. 14, 2016, 15 pages.
"Notice of Allowance", U.S. Appl. No. 14/312,486, dated Oct. 7, 2016, 15 pages.
"Notice of Allowance", U.S. Appl. No. 14/504,061, dated Sep. 12, 2016, 7 pages.
"Notice of Allowance", U.S. Appl. No. 14/582,896, dated Nov. 7, 2016, 5 pages.
"Philips Vital Signs Camera", Retrieved From: <http://www.vitalsignscamera.com/> Apr. 15, 2015, Jul. 17, 2013, 2 pages.
"Pre-Interview Communication", U.S. Appl. No. 14/513,875, dated Oct. 21, 2016, 3 pages.
"Restriction Requirement", U.S. Appl. No. 14/666,155, dated Jul. 22, 2016, 5 pages.
"The Instant Blood Pressure app estimates blood pressure with your smartphone and our algorithm", Retrieved at: http://www.instantbloodpressure.com/—on Jun. 23, 2016, 6 pages.
Arbabian,"A 94GHz mm-Wave to Baseband Pulsed-Radar for Imaging and Gesture Recognition", 2012 IEEE, 2012 Symposium on VLSI Circuits Digest of Technical Papers, 2012, 2 pages.
Balakrishnan,"Detecting Pulse from Head Motions in Video", In Proceedings: CVPR '13 Proceedings of the 2013 IEEE Conference on Computer Vision and Pattern Recognition Available at: <http://people.csail.mit.edu/mrub/vidmag/papers/Balakrishnan_Detecting_Pulse_from_2013_CVPR_paper.pdf>, Jun. 23, 2013, 8 pages.
Couderc,"Detection of Atrial Fibrillation using Contactless Facial Video Monitoring", In Proceedings: Heart Rhythm Society, vol. 12, Issue 1 Available at: <http://www.heartrhythmjournal.com/article/S1547-5271(14)00924-2/pdf>, Jan. 2015, 7 pages.
Espina,"Wireless Body Sensor Network for Continuous Cuff-less Blood Pressure Monitoring", International Summer School on Medical Devices and Biosensors, 2006, Sep. 2006, 5 pages.
Godana,"Human Movement Characterization in Indoor Environment using GNU Radio Based Radar", Retrieved at: http://repository.tudelft.nl/islandora/object/uuid:414e1868-dd00-4113-9989-4c213f1f7094?collection=education, Nov. 30, 2009, 100 pages.
He,"A Continuous, Wearable, and Wireless Heart Monitor Using Head Ballistocardiogram (BCG) and Head Electrocardiogram (ECG) with a Nanowatt ECG Heartbeat Detection Circuit", In Proceedings: Thesis, Department of Electrical Engineering and Computer Science, Massachusetts Institute of Technology Available at: <http://dspace.mit.edu/handle/1721.1/79221>, Feb. 2013, 137 pages.
Holleis,"Evaluating Capacitive Touch Input on Clothes", Proceedings of the 10th International Conference on Human Computer Interaction, Jan. 1, 2008, 10 pages.
Nakajima,"Development of Real-Time Image Sequence Analysis for Evaluating Posture Change and Respiratory Rate of a Subject in Bed", In Proceedings: Physiological Measurement, vol. 22, No. 3 Retrieved From: <http://iopscience.iop.org/0967-3334/22/3/401/pdf/0967-3334_22_3_401.pdf> Feb. 27, 2015, Aug. 2001, 8 pages.
Patel,"Applications of Electrically Conductive Yarns in Technical Textiles", International Conference on Power System Technology (POWECON), Oct. 30, 2012, 6 pages.
Poh,"A Medical Mirror for Non-contact Health Monitoring", In Proceedings: ACM SIGGRAPH Emerging Technologies Available at: <http://affect.media.mit.edu/pdfs/11.Poh-etal-SIGGRAPH.pdf>, 2011, 1 page.
Poh,"Non-contact, Automated Cardiac Pulse Measurements Using Video Imaging and Blind Source Separation.", In Proceedings: Optics Express, vol. 18, No. 10 Available at: <http://www.opticsinfobase.org/view_article.cfm?gotourl=http%3A%2F%2Fwww%2Eopticsinfobase%2Eorg%2FDirectPDFAccess%2F77B04D55%2DBC95%2D6937%2D5BAC49A426378C02%5F199381%2Foe%2D18%2D10%2D10762%2EP, May 7, 2010, 13 pages.

(56) References Cited

OTHER PUBLICATIONS

Pu,"Gesture Recognition Using Wireless Signals", Oct. 2014, pp. 15-18.
Pu,"Whole-Home Gesture Recognition Using Wireless Signals", MobiCom '13 Proceedings of the 19th annual international conference on Mobile computing & networking, Aug. 27, 2013, 12 pages.
Wang,"Exploiting Spatial Redundancy of Image Sensor for Motion Robust rPPG", In Proceedings: IEEE Transactions on Biomedical Engineering, vol. 62, Issue 2, Jan. 19, 2015, 11 pages.
Wang,"Micro-Doppler Signatures for Intelligent Human Gait Recognition Using a UWB Impulse Radar", 2011 IEEE International Symposium on Antennas and Propagation (APSURSI), Jul. 3, 2011, pp. 2103-2106.
Wijesiriwardana,"Capacitive Fibre-Meshed Transducer for Touch & Proximity Sensing Applications", IEEE Sensors Journal, IEEE Service Center, Oct. 1, 2005, 5 pages.
Zhadobov,"Millimeter-wave Interactions with the Human Body: State of Knowledge and Recent Advances", International Journal of Microwave and Wireless Technologies, Mar. 1, 2011, 11 pages.
Zhang,"Study of the Structural Design and Capacitance Characteristics of Fabric Sensor", Advanced Materials Research (vols. 194-196), Feb. 21, 2011, 8 pages.
"Final Office Action", U.S. Appl. No. 15/142,619, dated Feb. 8, 2018, 15 pages.
"Final Office Action", U.S. Appl. No. 15/093,533, dated Mar. 21, 2018, 19 pages.
"First Action Interview Office Action", U.S. Appl. No. 15/286,152, dated Mar. 1, 2018, 5 pages.
"Foreign Office Action", Chinese Application No. 201721290290.3, dated Mar. 9, 2018, 2 pages.
"Non-Final Office Action", U.S. Appl. No. 15/267,181, dated Feb. 8, 2018, 29 pages.
"Non-Final Office Action", U.S. Appl. No. 14/874,955, dated Feb. 8, 2018, 7 pages.
"Notice of Allowance", U.S. Appl. No. 14/959,730, dated Feb. 22, 2018, 8 pages.
"Pre-Interview Communication", U.S. Appl. No. 15/166,198, dated Mar. 8, 2018, 8 pages.
"Pre-Interview First Office Action", U.S. Appl. No. 15/286,152, dated Feb. 8, 2018, 4 pages.
"Advisory Action", U.S. Appl. No. 14/504,139, dated Aug. 28, 2017, 3 pages.
"Final Office Action", U.S. Appl. No. 14/959,901, dated Aug. 25, 2017, 19 pages.
"Final Office Action", U.S. Appl. No. 15/403,066, dated Oct. 5, 2017, 31 pages.
"Non-Final Office Action", U.S. Appl. No. 15/093,533, dated Aug. 24, 2017, 18 pages.
"Non-Final Office Action", U.S. Appl. No. 15/142,619, dated Aug. 25, 2017, 16 pages.
"Non-Final Office Action", U.S. Appl. No. 14/959,799, dated Sep. 8, 2017, 16 pages.
"Non-Final Office Action", U.S. Appl. No. 15/398,147, dated Sep. 8, 2017, 7 pages.
"Non-Final Office Action", U.S. Appl. No. 14/518,863, dated Sep. 29, 2017, 20 pages.
"Non-Final Office Action", U.S. Appl. No. 15/142,689, dated Oct. 4, 2017, 18 pages.
"Pre-Interview Office Action", U.S. Appl. No. 14/862,409, dated Sep. 15, 2017, 16 pages.
"Written Opinion", PCT Application No. PCT/US2017/032733, dated Jul. 26, 2017, 13 pages.
"Combined Search and Examination Report", GB Application No. 1620892.8, dated Apr. 6, 2017, 5 pages.
"Corrected Notice of Allowance", U.S. Appl. No. 14/930,220, dated Mar. 20, 2017, 2 pages.
"Corrected Notice of Allowance", U.S. Appl. No. 14/930,220, dated May 11, 2017, 2 pages.
"Final Office Action", U.S. Appl. No. 14/518,863, dated May 5, 2017, 18 pages.
"First Action Interview Office Action", U.S. Appl. No. 14/959,901, dated Apr. 14, 2017, 3 pages.
"International Preliminary Report on Patentability", Application No. PCT/US2015/050903, dated Apr. 13, 2017, 12 pages.
"International Search Report and Written Opinion", Application No. PCT/US2016/060399, dated Jan. 30, 2017, 11 pages.
"Non-Final Office Action", U.S. Appl. No. 14/504,038, dated Mar. 22, 2017, 33 pages.
"Non-Final Office Action", U.S. Appl. No. 15/403,066, dated May 4, 2017, 31 pages.
"Notice of Allowance", U.S. Appl. No. 14/494,863, dated May 30, 2017, 7 pages.
"Pre-Interview Communication", U.S. Appl. No. 15/343,067, dated Apr. 19, 2017, 3 pages.
"Textile Wire Brochure", Retrieved at: http://www.textile-wire.ch/en/home.html, Aug. 7, 2004, 17 pages.
Stoppa,"Wearable Electronics and Smart Textiles: A Critical Review", In Proceedings of Sensors, vol. 14, Issue 7, Jul. 7, 2014, pp. 11957-11992.
"Final Office Action", U.S. Appl. No. 14/959,799, dated Jan. 4, 2018, 17 pages.
"Final Office Action", U.S. Appl. No. 14/959,730, dated Nov. 22, 2017, 16 pages.
"International Search Report and Written Opinion", PCT/US2017/047691, dated Nov. 16, 2017, 13.
"International Search Report and Written Opinion", PCT Application No. PCT/US2017/051663, dated Nov. 29, 2017, 16 pages.
"Non-Final Office Action", U.S. Appl. No. 14/504,121, dated Jun. 2, 2018, 19 pages.
"Non-Final Office Action", U.S. Appl. No. 14/959,901, dated Jan. 8, 2018, 21 pages.
"Non-Final Office Action", U.S. Appl. No. 14/504,139, dated Oct. 18, 2017, 12 pages.
"Non-Final Office Action", U.S. Appl. No. 15/595,649, dated Oct. 31, 2017, 16 pages.
"Non-Final Office Action", U.S. Appl. No. 14/862,409, dated Dec. 14, 2017, 17 pages.
"Notice of Allowance", U.S. Appl. No. 15/403,066, dated Jan. 8, 2018, 18 pages.
"Notice of Allowance", U.S. Appl. No. 14/874,955, dated Oct. 20, 2017, 7 pages.
"Notice of Allowance", U.S. Appl. No. 15/398,147, dated Nov. 15, 2017, 8 pages.
"Notice of Publication", U.S. Appl. No. 15/703,511, dated Jan. 4, 2018, 1 page.
Bondade, et al., "A linear-assisted DC-DC hybrid power converter for envelope tracking RF power amplifiers", 2014 IEEE Energy Conversion Congress and Exposition (ECCE), IEEE, Sep. 14, 2014, pp. 5769-5773, XP032680873, DOI: 10.1109/ECCE.2014.6954193, Sep. 14, 2014, 5 pages.
Fan, et al., "Wireless Hand Gesture Recognition Based on Continuous-Wave Doppler Radar Sensors", IEEE Transactions on Microwave Theory and Techniques, Plenum, USA, vol. 64, No. 11, Nov. 1, 2016 (Nov. 1, 2016), pp. 4012-4012, XP011633246, ISSN: 0018-9480, DOI: 10.1109/TMTT.2016.2610427, Nov. 1, 2016, 9 pages.
Lien, et al., "Soli: Ubiquitous Gesture Sensing with Millimeter Wave Radar", ACM Transactions on Graphics (TOG), ACM, Us, vol. 35, No. 4, Jul. 11, 2016 (Jul. 11, 2016), pp. 1-19, XP058275791, ISSN: 0730-0301, DOI: 10.1145/2897824.2925953, Jul. 11, 2016, 19 pages.
Martinez-Garcia, et al., "Four-quadrant linear-assisted DC/DC voltage regulator", Analog Integrated Circuits and Signal Processing, Springer New York LLC, US, vol. 88, No. 1, Apr. 23, 2016 (Apr. 23, 2016), pp. 151-160, XP035898949, ISSN: 0925-1030, DOI: 10.1007/S10470-016-0747-8, Apr. 23, 2016, 10 pages.
Skolnik, "CW and Frequency-Modulated Radar", In: "Introduction to Radar Systems", Jan. 1, 1981 (Jan. 1, 1981), McGraw Hill, XP055047545, ISBN: 978-0-07-057909-5 pp. 68-100, p. 95-p. 97, Jan. 1, 1981, 18 pages.
Zheng, et al., "Doppler Bio-Signal Detection Based Time-Domain Hand Gesture Recognition", 2013 IEEE MTT-S International Microwave Workshop Series on RF and Wireless Technologies for Biomedical and Healthcare Applications (IMWS-BIO), IEEE, Dec. 9,

(56) References Cited

OTHER PUBLICATIONS 2013 (Dec. 9, 2013), p. 3, XP032574214, DOI: 10.1109/IMWS-BIO.2013.6756200, Dec. 9, 2013, 3 Pages.
"Corrected Notice of Allowance", U.S. Appl. No. 14/312,486, dated Jan. 23, 2017, 4 pages.
"Corrected Notice of Allowance", U.S. Appl. No. 14/582,896, dated Feb. 6, 2017, 2 pages.
"Corrected Notice of Allowance", U.S. Appl. No. 14/582,896, dated Feb. 23, 2017, 2 pages.
"International Preliminary Report on Patentability", Application No. PCT/US2015/043963, dated Feb. 16, 2017, 12 pages.
"International Preliminary Report on Patentability", Application No. PCT/US2015/030388, dated Dec. 15, 2016, 12 pages.
"International Preliminary Report on Patentability", Application No. PCT/US2015/043949, dated Feb. 16, 2017, 13 pages.
"International Preliminary Report on Patentability", Application No. PCT/US2015/044774, dated Mar. 2, 2017, 8 pages.
"International Search Report and Written Opinion", Application No. PCT/US2016/062082, dated Feb. 23, 2017, 12 pages.
"International Search Report and Written Opinion", Application No. PCT/US2016/055671, dated Dec. 1, 2016, 14 pages.
"Non-Final Office Action", U.S. Appl. No. 14/504,121, dated Jan. 9, 2017, 13 pages.
"Non-Final Office Action", U.S. Appl. No. 14/504,139, dated Jan. 27, 2017, 10 pages.
"Non-Final Office Action", U.S. Appl. No. 14/513,875, dated Feb. 21, 2017, 9 pages.
"Non-Final Office Action", U.S. Appl. No. 14/874,955, dated Feb. 27, 2017, 8 pages.
"Non-Final Office Action", U.S. Appl. No. 14/959,799, dated Jan. 27, 2017, 10 pages.
"Non-Final Office Action", U.S. Appl. No. 15/398,147, dated Mar. 9, 2017, 10 pages.
"Notice of Allowance", U.S. Appl. No. 14/930,220, dated Feb. 2, 2017, 8 pages.
"Pre-Interview Communication", U.S. Appl. No. 14/494,863, dated Jan. 27, 2017, 5 pages.
"Pre-Interview Communication", U.S. Appl. No. 14/959,730, dated Feb. 15, 2017, 3 pages.
"Pre-Interview Communication", U.S. Appl. No. 14/959,901, dated Feb. 10, 2017, 3 pages.
"Final Office Action", U.S. Appl. No. 14/518,863, dated Apr. 5, 2018, 21 pages.
"Final Office Action", U.S. Appl. No. 14/504,139, dated May 1, 2018, 14 pages.
"Final Office Action", U.S. Appl. No. 15/595,649, dated May 23, 2018, 13 pages.
"First Action Interview Office Action", U.S. Appl. No. 15/166,198, dated Apr. 25, 2018, 8 pages.
"Non-Final Office Action", U.S. Appl. No. 15/287,253, dated Apr. 5, 2018, 17 pages.
"Written Opinion", PCT Application No. PCT/US2017/032733, dated Jul. 24, 2017, 5 pages.
"Final Office Action", U.S. Appl. No. 15/142,689, dated Jun. 1, 2018, 16 pages.
"Final Office Action", U.S. Appl. No. 14/874,955, dated Jun. 11, 2018, 9 pages.
"Final Office Action", U.S. Appl. No. 14/959,901, dated Jun. 15, 2018, 21 pages.
"Final Office Action", U.S. Appl. No. 15/286,152, dated Jun. 26, 2018, 25 pages.
"Final Office Action", U.S. Appl. No. 15/267,181, dated Jun. 7, 2018, 31 pages.
"Final Office Action", U.S. Appl. No. 14/504,121, dated Jun. 9, 2018, 23 pages.
"Foreign Office Action", Chinese Application No. 201721290290.3, dated Jun. 6, 2018, 3 pages.
"Non-Final Office Action", U.S. Appl. No. 15/586,174, dated Jun. 18, 2018, 7 pages.
"Non-Final Office Action", U.S. Appl. No. 15/286,512, dated Jul. 19, 2018, 15 pages.
"Non-Final Office Action", U.S. Appl. No. 15/142,829, dated Aug. 16, 2018, 15 pages.
"Notice of Allowance", U.S. Appl. No. 14/862,409, dated Jun. 6, 2018, 7 pages.
"Notice of Allowance", U.S. Appl. No. 15/142,619, dated Aug. 13, 2018, 9 pages.
"Pre-Interview Communication", U.S. Appl. No. 15/287,359, dated Jul. 24, 2018, 2 pages.
"Restriction Requirement", U.S. Appl. No. 15/286,537, dated Aug. 27, 2018, 8 pages.
"Final Office Action", U.S. Appl. No. 15/166,198, dated Sep. 27, 2018, 33 pages.
"Non-Final Office Action", U.S. Appl. No. 15/287,253, dated Sep. 7, 2018, 20 pages.
"Non-Final Office Action", U.S. Appl. No. 14/959,901, dated Oct. 11, 2018, 22 pages.
"Non-Final Office Action", U.S. Appl. No. 15/287,308, dated Oct. 15, 2018, 18 pages.
"Non-Final Office Action", U.S. Appl. No. 15/286,152, dated Oct. 19, 2018, 27 pages.
"Non-Final Office Action", U.S. Appl. No. 15/286,837, dated Oct. 26, 2018, 10 pages.
"Non-Final Office Action", U.S. Appl. No. 14/504,139, dated Oct. 5, 2018, 16 pages.
"Notice of Allowance", U.S. Appl. No. 15/142,689, dated Oct. 30, 2018, 9 pages.
"Notice of Allowance", U.S. Appl. No. 14/874,955, dated Oct. 4, 2018, 8 pages.
"Notice of Allowance", U.S. Appl. No. 15/595,649, dated Sep. 14, 2018, 8 pages.
"Notice of Allowance", U.S. Appl. No. 15/586,174, dated Sep. 24, 2018, 5 pages.
"Pre-Interview Communication", U.S. Appl. No. 15/286,495, dated Sep. 10, 2018, 4 pages.
"Written Opinion", PCT Application No. PCT/US2017/051663, dated Oct. 12, 2018, 8 pages.
Gürbüz et al., "Detection and Identification of Human Targets in Radar Data", Proc. SPIE 6567, Signal Processing, Sensor Fusion, and Target Recognition XVI, 656701, May 7, 2007, 12 pages.

\* cited by examiner

US 10,175,781 B2

INTERACTIVE OBJECT WITH MULTIPLE ELECTRONICS MODULES

PRIORITY

This application claims priority to U.S. Provisional Patent Application Ser. No. 62/337,081 filed on May 16, 2016, the disclosure of which is incorporated by reference herein in its entirety.

BACKGROUND

Electronics embedded in garments are becoming increasingly common. Such electronics often need connectivity to external devices for power and/or data transmission. For example, it can be difficult to integrate bulky electronic components (e.g., batteries, microprocessors, wireless units, and sensors) into wearable garments, such as a shirt, coat, or pair of pants. Furthermore, connecting such electronic components to a garment may cause issues with durability since garments are often washed.

SUMMARY

This document describes an interactive object with multiple electronics modules. An interactive object (e.g., a garment) includes a grid or array of conductive thread woven into the interactive object, and an internal electronics module coupled to the grid of conductive thread. The internal electronics module includes a first subset of electronic components, such as sensing circuitry configured to detect touch-input to the grid of conductive thread. An external electronics module that includes a second subset of electronic components (e.g., a microprocessor, power source, or network interface) is removably coupled to the interactive object via a communication interface. The communication interface enables communication between the internal electronics module and the external electronics module when the external electronics module is coupled to the interactive object.

This summary is provided to introduce simplified concepts concerning an interactive object with multiple electronics modules, which is further described below in the Detailed Description. This summary is not intended to identify essential features of the claimed subject matter, nor is it intended for use in determining the scope of the claimed subject matter.

BRIEF DESCRIPTION OF THE DRAWINGS

Embodiments of an interactive object with multiple electronics modules are described with reference to the following drawings. The same numbers are used throughout the drawings to reference like features and components:

FIG. 1 is an illustration of an example environment in which an interactive textile with multiple electronics modules can be implemented.

FIG. 2 illustrates an example system that includes an interactive object and multiple electronics modules.

FIG. 3 illustrates an example of an interactive object with multiple electronics modules in accordance with one or more implementations.

Figure 4:
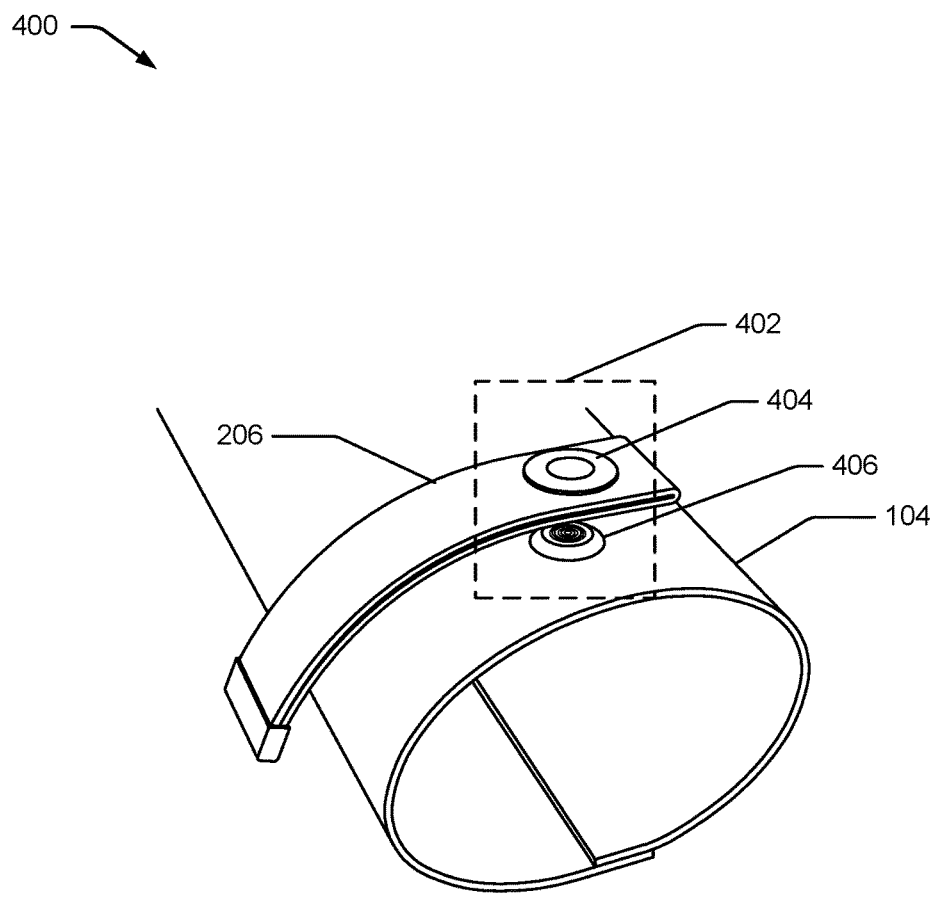
FIG. 4 illustrates an example of a connector for connecting an external communications module to an interactive object in accordance with one or more implementations.

FIG. 4 illustrates an example of a connector for connecting an external communications module to an interactive object in accordance with one or more implementations.

FIG. 5 illustrates an example of a connector when implemented with an anisotropic conducting polymer in accordance with one or more implementations.

FIG. 6 illustrates an exploded view of a connector when implemented with an anisotropic conducting polymer in accordance with one or more implementations.

FIG. 7 illustrates various components of an example computing system that can be implemented as any type of client, server, and/or computing device as described with reference to the previous FIGS. 1-6 to implement an interactive object with multiple electronics modules.

DETAILED DESCRIPTION

Overview

Electronics embedded in garments and other flexible objects (e.g., blankets, handbags, and hats) are becoming increasingly common. Such electronics often need connectivity to external devices for power and/or data transmission. For example, it can be difficult to integrate bulky electronic components (e.g., batteries, microprocessors, wireless units, and sensors) into wearable garments, such as a shirt, coat, or pair of pants. Furthermore, connecting such electronic components to a garment may cause issues with durability since garments are often washed. However, some electronic components, such as sensing circuitry, are better equipped to be positioned within the garment.

An interactive object with multiple electronics modules is described. An interactive object (e.g., a garment) includes at least an internal electronics module containing a first subset of electronic components for the interactive object, and an external electronics module containing a second subset of electronic components for the interactive object. As described herein, the internal electronics module may be physically and permanently coupled to the interactive object, whereas the external electronics module may be removably coupled to the interactive object. Thus, instead of integrating all of the electronics within the interactive object, at least some of the electronics are placed in the external electronics module.

In one or more implementations, the interactive object includes an interactive textile with conductive threads woven into the textile to form a flexible touch pad. The internal electronics module contains sensing circuitry that is directly coupled to the conductive threads to enable the detection of touch-input to the interactive textile. The external electronics module contains electronic components that are needed to process and communicate the touch-input data, such as a microprocessor, a power source, a network interface, and so forth.

The interactive object further includes a communication interface configured to enable communication between the internal electronics module and the external electronics module. In some implementations, the communication interface may be implemented as a connector that connects the electronic components in the external electronics module to the electronic components in the internal electronics module to enable the transfer of power and data between the modules. The connector may include a connector plug and a connector receptacle. For example, the connector plug may be implemented at the external electronics module and is configured to connect to the connector receptacle, which may be implemented at the interactive object.

Thus, while the electronic components are separated into multiple different modules, the communication interface enables the system to function as a single unit. For example, the power source contained within the external electronics module may transfer power, via the communication interface, to the sensing circuitry of the internal electronics module to enable the sensing circuitry to detect touch-input to the conductive thread. When touch-input is detected by the sensing circuitry of the internal electronics module, data representative of the touch-input may be communicated, via the communication interface, to the microprocessor contained within the external electronics module. The microprocessor may then analyze the touch-input data to generate one or more control signals, which may then be communicated to a remote computing device (e.g., a smart phone) via the network interface to cause the computing device to initiate a particular functionality.

Separating the electronics of the interactive object into multiple different modules provides a variety of different benefits. For example, the system design enables interoperability and customization because the external electronics module can be detached from the interactive object, and then attached to a different interactive object to carry over some of the functions and properties, such as user specific settings. Additionally, by separating the garment embedded electronics from the external electronics module, users, designers and companies are able to design the external electronics modules in the form factor, mechanical, material and surface finish qualities that are specific to the application or the user. For example, a leather jacket might have an external electronics module that is leather, and in the form of a strap that matches a certain jacket style, or allows a flexible form factor that would have been hard to achieve inside a garment.

Furthermore, separating the electronics enable broken parts to be easily replaced or serviced without the need to access the entire interactive object. For example, the external electronics module can be shipped to a repair service, or a new external electronics module can be purchased without the need to purchase a new interactive object. In addition, separating the electronic components into internal and external modules ensures that parts such as batteries are not exposes to washing cycles that a typical garment would go through. For example, the external electronics module, which may include the battery, can easily be removed from the interactive object before washing the interactive object. Furthermore, by separating parts, the manufacturing challenges are significantly simplified and certification processes (such as FCC certification for RF transmission units) can be handled over the part in question, thereby reducing the complexity.

Example Environment

FIG. 1 is an illustration of an example environment 100 in which an interactive textile with multiple electronics modules can be implemented. Environment 100 includes an interactive textile 102, which is shown as being integrated within various interactive objects 104. Interactive textile 102 is a textile that is configured to sense multi-touch-input. As described herein, a textile corresponds to any type of flexible woven material consisting of a network of natural or artificial fibers, often referred to as thread or yarn. Textiles may be formed by weaving, knitting, crocheting, knotting, or pressing threads together.

In environment 100, interactive objects 104 include "flexible" objects, such as a shirt 104-1, a hat 104-2, and a handbag 104-3. It is to be noted, however, that interactive textile 102 may be integrated within any type of flexible object made from fabric or a similar flexible material, such as garments or articles of clothing, blankets, shower curtains, towels, sheets, bed spreads, or fabric casings of furniture, to name just a few. Interactive textile 102 may be integrated within flexible objects 104 in a variety of different ways, including weaving, sewing, gluing, and so forth.

In this example, objects 104 further include "hard" objects, such as a plastic cup 104-4 and a hard smart phone casing 104-5. It is to be noted, however, that hard objects 104 may include any type of "hard" or "rigid" object made from non-flexible or semi-flexible materials, such as plastic, metal, aluminum, and so on. For example, hard objects 104 may also include plastic chairs, water bottles, plastic balls, or car parts, to name just a few. Interactive textile 102 may be integrated within hard objects 104 using a variety of different manufacturing processes. In one or more implementations, injection molding is used to integrate interactive textiles 102 into hard objects 104.

Interactive textile 102 enables a user to control object 104 that the interactive textile 102 is integrated with, or to control a variety of other computing devices 106 via a network 108. Computing devices 106 are illustrated with various non-limiting example devices: server 106-1, smart phone 106-2, laptop 106-3, computing spectacles 106-4, television 106-5, camera 106-6, tablet 106-7, desktop 106-8, and smart watch 106-9, though other devices may also be used, such as home automation and control systems, sound or entertainment systems, home appliances, security systems, netbooks, and e-readers. Note that computing device 106 can be wearable (e.g., computing spectacles and smart watches), non-wearable but mobile (e.g., laptops and tablets), or relatively immobile (e.g., desktops and servers).

Network 108 includes one or more of many types of wireless or partly wireless communication networks, such as a local-area-network (LAN), a wireless local-area-network (WLAN), a personal-area-network (PAN), a wide-area-network (WAN), an intranet, the Internet, a peer-to-peer network, point-to-point network, a mesh network, and so forth.

Interactive textile 102 can interact with computing devices 106 by transmitting touch data through network 108. Computing device 106 uses the touch data to control computing device 106 or applications at computing device 106. As an example, consider that interactive textile 102 integrated at shirt 104-1 may be configured to control the user's smart phone 106-2 in the user's pocket, television 106-5 in the user's home, smart watch 106-9 on the user's wrist, or various other appliances in the user's house, such as thermostats, lights, music, and so forth. For example, the user may be able to swipe up or down on interactive textile 102 integrated within the user's shirt 104-1 to cause the volume on television 106-5 to go up or down, to cause the temperature controlled by a thermostat in the user's house to increase or decrease, or to turn on and off lights in the user's house. Note that any type of touch, tap, swipe, hold, or stroke gesture may be recognized by interactive textile 102.

In more detail, consider FIG. 2 which illustrates an example system 200 that includes an interactive object and multiple electronics modules. In system 200, interactive textile 102 is integrated in an object 104, which may be implemented as a flexible object (e.g., shirt 104-1, hat 104-2, or handbag 104-3) or a hard object (e.g., plastic cup 104-4 or smart phone casing 104-5).

Interactive textile 102 is configured to sense multi-touch-input from a user when one or more fingers of the user's hand touch interactive textile 102. Interactive textile 102 may also be configured to sense full-hand touch-input from a user, such as when an entire hand of the user touches or swipes interactive textile 102. To enable the detection of touch-input, interactive textile 102 includes conductive threads 202, which are woven into interactive textile 102 (e.g., in a grid or array pattern). Notably, the conductive threads 202 do not alter the flexibility of interactive textile 102, which enables interactive textile 102 to be easily integrated within interactive objects 104.

Interactive object 104 includes an internal electronics module 204 that is embedded within interactive object 104 and is directly coupled to conductive threads 202. Internal electronics module 204 can be communicatively coupled to an external electronics module 206 via a communication interface 208. Internal electronics module 204 contains a first subset of electronic components for the interactive object 104, and external electronics module 206 contains a second, different, subset of electronics components for the interactive object 104. As described herein, the internal electronics module 204 may be physically and permanently embedded within interactive object 104, whereas the external electronics module 206 may be removably coupled to interactive object 104.

In system 200, the electronic components contained within the internal electronics module 204 includes sensing circuitry 210 that is coupled to conductive thread 202 that is woven into interactive textile 102. For example, wires from the conductive threads 202 may be connected to sensing circuitry 210 using flexible PCB, creping, gluing with conductive glue, soldering, and so forth. Sensing circuitry 210 is configured to detect the location of the touch-input on conductive thread 202, as well as motion of the touch-input. For example, when an object, such as a user's finger, touches conductive thread 202, the position of the touch can be determined by sensing circuitry 210 by detecting a change in capacitance on the grid or array of conductive thread 202. The touch-input may then be used to generate touch data usable to control computing device 106. For example, the touch-input can be used to determine various gestures, such as single-finger touches (e.g., touches, taps, and holds), multi-finger touches (e.g., two-finger touches, two-finger taps, two-finger holds, and pinches), single-finger and multi-finger swipes (e.g., swipe up, swipe down, swipe left, swipe right), and full-hand interactions (e.g., touching the textile with a user's entire hand, covering textile with the user's entire hand, pressing the textile with the user's entire hand, palm touches, and rolling, twisting, or rotating the user's hand while touching the textile).

Communication interface 208 enables the transfer of power and data (e.g., the touch-input detected by sensing circuitry 210) between the internal electronics module 204 and the external electronics module 206. In some implementations, communication interface 208 may be implemented as a connector that includes a connector plug and a connector receptacle. The connector plug may be implemented at the external electronics module 206 and is configured to connect to the connector receptacle, which may be implemented at the interactive object 104. A more-detailed discussion of example connectors is discussed below with regards to FIGS. 4-6.

In system 200, the external electronics module 206 includes a microprocessor 212, power source 214, and network interface 216. Power source 214 may be coupled, via communication interface 208, to sensing circuitry 210 to provide power to sensing circuitry 210 to enable the detection of touch-input, and may be implemented as a small battery. When touch-input is detected by sensing circuitry 210 of the internal electronics module 204, data representative of the touch-input may be communicated, via communication interface 208, to microprocessor 212 of the external electronics module 206. Microprocessor 212 may then analyze the touch-input data to generate one or more control signals, which may then be communicated to computing device 106 (e.g., a smart phone) via the network interface 216 to cause the computing device 106 to initiate a particular functionality. Generally, network interfaces 216 are configured to communicate data, such as touch data, over wired, wireless, or optical networks to computing devices 106. By way of example and not limitation, network interfaces 216 may communicate data over a local-area-network (LAN), a wireless local-area-network (WLAN), a personal-area-network (PAN) (e.g., Bluetooth™), a wide-area-network (WAN), an intranet, the Internet, a peer-to-peer network, point-to-point network, a mesh network, and the like (e.g., through network 108 of FIG. 1).

While internal electronics module 204 and external electronics module 206 are illustrated and described as including specific electronic components, it is to be appreciated that these modules may be configured in a variety of different ways. For example, in some cases, electronic components described as being contained within internal electronics module 204 may be at least partially implemented at the external electronics module 206, and vice versa. Furthermore, internal electronics module 204 and external electronics module 206 may include electronic components other that those illustrated in FIG. 2, such as sensors, light sources (e.g., LED's), displays, speakers, and so forth.

FIG. 3 illustrates an example 300 of interactive object 104 with multiple electronics modules in accordance with one or more implementations. In this example, interactive textile 102 of the interactive object 104 includes non-conductive threads 302 woven with conductive threads 202 to form interactive textile 102. Non-conductive threads 302 may correspond to any type of non-conductive thread, fiber, or fabric, such as cotton, wool, silk, nylon, polyester, and so forth.

At 304, a zoomed-in view of conductive thread 202 is illustrated. Conductive thread 202 includes a conductive wire 306 that is twisted, braided, or wrapped with a flexible thread 308. Twisting conductive wire 306 with flexible thread 308 causes conductive thread 202 to be flexible and stretchy, which enables conductive thread 202 to be easily woven with non-conductive threads 302 to form interactive textile 102.

In one or more implementations, conductive wire 306 is a thin copper wire. It is to be noted, however, that conductive wire 306 may also be implemented using other materials, such as silver, gold, or other materials coated with a conductive polymer. Flexible thread 308 may be implemented as any type of flexible thread or fiber, such as cotton, wool, silk, nylon, polyester, and so forth.

Interactive textile 102 can be formed cheaply and efficiently, using any conventional weaving process (e.g., jacquard weaving or 3D-weaving), which involves interlacing a set of longer threads (called the warp) with a set of crossing threads (called the weft). Weaving may be implemented on a frame or machine known as a loom, of which there are a number of types. Thus, a loom can weave non-conductive threads 302 with conductive threads 102 to create interactive textile 102.

In example 300, conductive thread 202 is woven into interactive textile 102 to form a grid that includes a set of substantially parallel conductive threads 202 and a second set of substantially parallel conductive threads 202 that crosses the first set of conductive threads to form the grid. In this example, the first set of conductive threads 202 are oriented horizontally and the second set of conductive threads 202 are oriented vertically, such that the first set of conductive threads 202 are positioned substantially orthogonal to the second set of conductive threads 202. It is to be appreciated, however, that conductive threads 202 may be oriented such that crossing conductive threads 202 are not orthogonal to each other. For example, in some cases crossing conductive threads 202 may form a diamond-shaped grid. While conductive threads 202 are illustrated as being spaced out from each other in FIG. 3, it is to be noted that conductive threads 202 may be weaved very closely together. For example, in some cases two or three conductive threads may be weaved closely together in each direction. Further, in some cases the conductive threads may be oriented as parallel sensing lines that do not cross or intersect with each other.

In example 300, sensing circuitry 210 is shown as being integrated within object 104, and is directly connected to conductive threads 202. During operation, sensing circuitry 210 can determine positions of touch-input on the grid of conductive thread 202 using self-capacitance sensing or projective capacitive sensing.

For example, when configured as a self-capacitance sensor, sensing circuitry 210 charges crossing conductive threads 202 (e.g., horizontal and vertical conductive threads) by applying a control signal (e.g., a sine signal) to each conductive thread 202. When an object, such as the user's finger, touches the grid of conductive thread 202, the conductive threads 202 that are touched are grounded, which changes the capacitance (e.g., increases or decreases the capacitance) on the touched conductive threads 202.

Sensing circuitry 210 uses the change in capacitance to identify the presence of the object. To do so, sensing circuitry 210 detects a position of the touch-input by detecting which horizontal conductive thread 202 is touched, and which vertical conductive thread 202 is touched by detecting changes in capacitance of each respective conductive thread 202. Sensing circuitry 210 uses the intersection of the crossing conductive threads 202 that are touched to determine the position of the touch-input on the grid of conductive threads 202. For example, sensing circuitry 210 can determine touch data by determining the position of each touch as X,Y coordinates on the grid of conductive thread 202.

When implemented as a self-capacitance sensor, "ghosting" may occur when multi-touch-input is received. Consider, for example, that a user touches the grid of conductive thread 202 with two fingers. When this occurs, sensing circuitry 210 determines X and Y coordinates for each of the two touches. However, sensing circuitry 210 may be unable to determine how to match each X coordinate to its corresponding Y coordinate. For example, if a first touch has the coordinates X1, Y1 and a second touch has the coordinates X4,Y4, sensing circuitry 210 may also detect "ghost" coordinates X1, Y4 and X4,Y1.

In one or more implementations, sensing circuitry 210 is configured to detect "areas" of touch-input corresponding to two or more touch-input points on the grid of conductive thread 202. Conductive threads 202 may be weaved closely together such that when an object touches the grid of conductive thread 202, the capacitance will be changed for multiple horizontal conductive threads 202 and/or multiple vertical conductive threads 202. For example, a single touch with a single finger may generate the coordinates X1,Y1 and X2,Y1. Thus, sensing circuitry 210 may be configured to detect touch-input if the capacitance is changed for multiple horizontal conductive threads 202 and/or multiple vertical conductive threads 202. Note that this removes the effect of ghosting because sensing circuitry 210 will not detect touch-input if two single-point touches are detected which are spaced apart.

Alternately, when implemented as a projective capacitance sensor, sensing circuitry 210 charges a single set of conductive threads 202 (e.g., horizontal conductive threads 202) by applying a control signal (e.g., a sine signal) to the single set of conductive threads 202. Then, sensing circuitry 210 senses changes in capacitance in the other set of conductive threads 202 (e.g., vertical conductive threads 202).

In this implementation, vertical conductive threads 202 are not charged and thus act as a virtual ground. However, when horizontal conductive threads 202 are charged, the horizontal conductive threads capacitively couple to vertical conductive threads 202. Thus, when an object, such as the user's finger, touches the grid of conductive thread 202, the capacitance changes on the vertical conductive threads (e.g., increases or decreases). Sensing circuitry 210 uses the change in capacitance on vertical conductive threads 202 to identify the presence of the object. To do so, sensing circuitry 210 detects a position of the touch-input by scanning vertical conductive threads 202 to detect changes in capacitance. Sensing circuitry 210 determines the position of the touch-input as the intersection point between the vertical conductive thread 202 with the changed capacitance, and the horizontal conductive thread 202 on which the control signal was transmitted. For example, sensing circuitry 210 can determine touch data by determining the position of each touch as X,Y coordinates on the grid of conductive thread 202.

Whether implemented as a self-capacitance sensor or a projective capacitance sensor, the conductive thread 202 and sensing circuitry 210 is configured to communicate the touch data that is representative of the detected touch-input to external electronics module 206, which is removably coupled to interactive object 104 via communication interface 208. The microprocessor 212 may then cause communication of the touch data, via network interface 216, to computing device 106 to enable the device to determine gestures based on the touch data, which can be used to control object 104, computing device 106, or applications implemented at computing device 106.

The computing device 106 can be implemented to recognize a variety of different types of gestures, such as touches, taps, swipes, holds, and covers made to interactive textile 102. To recognize the various different types of gestures, the computing device can be configured to determine a duration of the touch, swipe, or hold (e.g., one second or two seconds), a number of the touches, swipes, or holds (e.g., a single tap, a double tap, or a triple tap), a number of fingers of the touch, swipe, or hold (e.g., a one finger-touch or swipe, a two-finger touch or swipe, or a three-finger touch or swipe), a frequency of the touch, and a dynamic direction of a touch or swipe (e.g., up, down, left, right). With regards to holds, the computing device 106 can also determine an area of the grid of conductive thread 202 that is being held (e.g., top, bottom, left, right, or top and bottom. Thus, the computing device 106 can recognize a variety of different types of holds, such as a cover, a cover and hold, a five finger hold, a five finger cover and hold, a three finger pinch and hold, and so forth.

In one or more implementations, communication interface 208 is implemented as a connector that is configured to connect external electronics module 206 to internal electronics module 204 of interactive object 104. Consider, for example, FIG. 4 which illustrates an example 400 of a connector for connecting an external communications module to an interactive object in accordance with one or more implementations. In example 400, interactive object 104 is illustrated as a jacket.

As described above, interactive object 104 includes an internal electronics module 204 which include various types of electronics, such as sensing circuitry 210, sensors (e.g., capacitive touch sensors woven into the garment, microphones, or accelerometers), output devices (e.g., LEDs, speakers, or micro-displays), electrical circuitry, and so forth.

External electronics module 206 includes various electronics that are configured to connect and/or interface with the electronics of internal electronics module 204. Generally, the electronics contained within external electronics module 206 are different than those contained within internal electronics module 204, and may include electronics such as microprocessor 212, power source 214 (e.g., a battery), network interface 216 (e.g., Bluetooth or WiFi), sensors (e.g., accelerometers, heart rate monitors, or pedometers), output devices (e.g., speakers, LEDs), and so forth.

In this example, external electronics module 206 is implemented as a strap that contains the various electronics. The strap, for example, can be formed from a material such as rubber, nylon, or any other type of fabric. Notably, however, external electronics module 206 may take any type of form. For example, rather than being a strap, external electronics module 206 could resemble a circular or square piece of material (e.g., rubber or nylon).

Connector 402 includes a connector plug 404 and a connector receptacle 406. In this example, connector plug 404 is positioned on external electronics module 206 and is configured to attach to connector receptacle 406, which is positioned on interactive object 104, to form an electronic connection between external electronics module 206 and interactive object 104. For example, in FIG. 4, connector receptacle 406 is positioned on a sleeve of interactive object 104, which is illustrated as a jacket.

In various implementations, connector plug 404 may resemble a snap or button, and is configured to connect or attach to connector receptacle 406 via a magnetic or mechanical coupling. For example, in some implementations magnets on connector plug 404 and connector receptacle 406 cause a magnetic connection to form between connector plug 404 and connector receptacle 406. Alternately, a mechanical connection between these two components may cause the components to form a mechanical coupling, such as by "snapping" together.

Connector 402 may be implemented in a variety of different ways. In one or more implementations, connector plug 404 includes an anisotropic conducting polymer which is configured to connect to circular pads of a printed circuit board (PCB) implemented at connector receptacle 406. In another implementation, connector plug 404 may include compliant polyurethane polymers to provide compliance to metal pads implemented at connector receptacle 406 to enable an electromagnetic connection. In another implementation, connector plug 404 and connector receptacle 406 may each include magnetically coupled coils which can be aligned to provide power and data transmission.

FIG. 5 illustrates an example 500 of connector 402 when implemented with an anisotropic conducting polymer in accordance with one or more implementations.

At 502, a top side of connector plug 404 is shown. In this case, the top side of connector plug 404 resembles a round, button-like structure. Notably the top side of connector plug 404 may be implemented with various different shapes (e.g., square or triangular). Further, in some cases the top side of connector plug 404 may resemble something other than a button or snap.

In this example, the top side of connector plug 404 includes tiny holes that enables light from light sources (e.g., LEDs) to shine through. Of course, other types of input or output units could also be positioned here, such as a microphone or a speaker.

At 504, a bottom side of connector plug 404 is shown. The bottom side of connector plug 404 includes an anisotropic conducting polymer 506 to enable electrical connections between the electronics of interactive object 104 and the electronics of external electronics module 206.

In more detail, consider FIG. 6 which illustrates an exploded view 600 of connector 402 when implemented with an anisotropic conducting polymer in accordance with one or more implementations.

In this example, connector plug 404 of connector 402 includes a button cap 602, a printed circuit board (PCB) 604, anisotropic conducting polymer 606, a magnet 608, and a casing 610.

Button cap 602 resembles a typical button, and may be made from a variety of different materials, such as plastic, metal, and so forth. In this example, button cap 602 includes holes which enable light from LEDs to shine through.

PCB 604 is configured to electrically connect electronics of interactive object 104 to anisotropic conducting polymer 606. A top layer of PCB 604 may include the LEDs that shine through the holes in button cap 602. A bottom layer of PCB 604 includes contacts which electrically connect to anisotropic conducting polymer 606 positioned beneath PCB 604.

Anisotropic conducting polymer 606 includes a strip of anisotropic material that is configured to form a connection with connector receptacle 406. The anisotropic material include any type of anisotropic material.

Magnet 608 is configured to enable a magnetic connection to connector receptacle 406. The magnetic connection enables connector plug 404 to attach to connector receptacle 406 without the need to apply force to connect, which reduces the chance of the connection wearing down over time. Alternately, in one or more implementations, connector plug 404 may be implemented without magnet 608. For example, connector plug 404 could be implemented as physical or mechanical snap that snaps to connector receptacle 406. Casing 610 is configured to hold the components of connector plug 404, and can be implemented from a variety of different materials such as plastic, metal, and so forth.

In this example, connector receptacle 406 includes a receptacle PCB 612 which includes circular pads which are configured to connect to anisotropic conducting polymer 606. The bottom layer of receptacle PCB 612 includes connections to the electronics of interactive object 104.

Connector receptacle may also include a metallic component 614 which is configured to generate a magnetic force with magnet 608 of connector plug 404 to form the magnetic connection between connector plug 404 and connector receptacle 406. Metallic component 614 may be implemented as any type of metal or alloy, or as another magnet, that can generate a magnetic force with magnet 608. Connector receptacle 406 may also include other components, such as a housing, a washer, and so forth.

Notably, anisotropic conducting polymer 606 includes various properties which make for a good connector, which include rotational tolerance, mechanical compliance, multi-pin electrical and power transmission, and being waterproof, For instance, when connector plug 404 attaches to connector receptacle 406, an electrical connection is formed between anisotropic conducting polymer 606 and receptacle PCB 612. The anisotropic conducting polymer 606 provides rotational tolerance because the strip of anisotropic material can be rotated 360 degrees and maintain the same connection to the circular pads of receptacle PCB 612. This is beneficial because when wearing a garment, the strap of external electronics module 206 will naturally move around. Thus, the rotational tolerance enables the connector to be rotated without losing the connection between connector plug 404 and connector receptacle 406. Furthermore, the anisotropic conducting polymer 606 is elastomeric, which causes the strip of material to shrink and conform under mechanical force.

Anisotropic conducting polymer 606 provides multi-pin electrical transmissions and power transfer transmissions simultaneously. For example, the anisotropic material causes conduction to occur in just one direction, which means that the conductive paths can operate completely independently, without interfering with each other. This enables multiple conducting channels, which makes it easy to isolate multiple data lines or power lines from each other using anisotropic conducting polymer 606 and the circular structure of receptacle PCB 612.

Additionally, anisotropic conducting polymer 606 is waterproof which prevents connector 402 from being damaged by water, such as when being worn in the rain or when being washed.

Connector 402 may be implemented in a variety of different ways. In one or more implementations, instead of using anisotropic conducting polymer 606, connector plug 404 may include compliant polyurethane polymers to provide compliance to metal pads implemented at connector receptacle 406 to enable an electromagnetic connection. In another implementation, connector plug 404 and connector receptacle 406 may each include magnetically coupled coils which can be aligned to provide power and data transmission between interactive object 104 and external electronics module 206.

Example Computing System

FIG. 7 illustrates various components of an example computing system 700 that can be implemented as any type of client, server, and/or computing device as described with reference to the previous FIGS. 1-6 to implement an interactive object with multiple electronics modules. For example, computing system 700 may correspond to external electronics module 206 and/or embedded in interactive object 104. In embodiments, computing system 700 can be implemented as one or a combination of a wired and/or wireless wearable device, System-on-Chip (SoC), and/or as another type of device or portion thereof. Computing system 700 may also be associated with a user (e.g., a person) and/or an entity that operates the device such that a device describes logical devices that include users, software, firmware, and/or a combination of devices.

Computing system 700 includes communication devices 702 that enable wired and/or wireless communication of device data 704 (e.g., received data, data that is being received, data scheduled for broadcast, data packets of the data, etc.). Device data 704 or other device content can include configuration settings of the device, media content stored on the device, and/or information associated with a user of the device. Media content stored on computing system 700 can include any type of audio, video, and/or image data. Computing system 700 includes one or more data inputs 706 via which any type of data, media content, and/or inputs can be received, such as human utterances, user-selectable inputs (explicit or implicit), messages, music, television media content, recorded video content, and any other type of audio, video, and/or image data received from any content and/or data source.

Computing system 700 also includes communication interfaces 708, which can be implemented as any one or more of a serial and/or parallel interface, a wireless interface, any type of network interface, a modem, and as any other type of communication interface. Communication interfaces 708 provide a connection and/or communication links between computing system 700 and a communication network by which other electronic, computing, and communication devices communicate data with computing system 700.

Computing system 700 includes one or more processors 710 (e.g., any of microprocessors, controllers, and the like), which process various computer-executable instructions to control the operation of computing system 700 and to enable techniques for, or in which can be embodied, interactive textiles. Alternatively or in addition, computing system 700 can be implemented with any one or combination of hardware, firmware, or fixed logic circuitry that is implemented in connection with processing and control circuits which are generally identified at 712. Although not shown, computing system 700 can include a system bus or data transfer system that couples the various components within the device. A system bus can include any one or combination of different bus structures, such as a memory bus or memory controller, a peripheral bus, a universal serial bus, and/or a processor or local bus that utilizes any of a variety of bus architectures.

Computing system 700 also includes computer-readable media 714, such as one or more memory devices that enable persistent and/or non-transitory data storage (i.e., in contrast to mere signal transmission), examples of which include random access memory (RAM), non-volatile memory (e.g., any one or more of a read-only memory (ROM), flash memory, EPROM, EEPROM, etc.), and a disk storage device. A disk storage device may be implemented as any type of magnetic or optical storage device, such as a hard disk drive, a recordable and/or rewriteable compact disc (CD), any type of a digital versatile disc (DVD), and the like. Computing system 700 can also include a mass storage media device 716.

Computer-readable media 714 provides data storage mechanisms to store device data 704, as well as various device applications 718 and any other types of information and/or data related to operational aspects of computing system 700. For example, an operating system 720 can be maintained as a computer application with computer-readable media 714 and executed on processors 710. Device applications 718 may include a device manager, such as any form of a control application, software application, signal-processing and control module, code that is native to a particular device, a hardware abstraction layer for a particular device, and so on. Device applications 718 also include any system components, engines, or managers to implement an interactive object with multiple electronics modules.

CONCLUSION

Although embodiments of techniques using, and objects including, an interactive object with multiple electronics modules has been described in language specific to features and/or methods, it is to be understood that the subject of the appended claims is not necessarily limited to the specific features or methods described. Rather, the specific features and methods are disclosed as example implementations of an interactive object with multiple electronics modules.

What is claimed is:

1. A system comprising:
   an interactive object comprising:
   a grid of conductive thread woven into the interactive object;
   an internal electronics module coupled to the grid of conductive thread, the internal electronics module comprising sensing circuitry configured to detect touch-input to the grid of conductive thread;
   an external electronics module comprising one or more electronic components, the external electronics module removably coupled to the interactive object, the external electronics module including an anisotropic conducting polymer configured to enable electrical connections between the one or more electronic components of the external electronics module and the sensing circuitry of the internal electronics module; and
   a communication interface configured to enable communication between the internal electronics module and the external electronics module when the external electronics module is coupled to the interactive object.

2. The system of claim 1, wherein the internal electronics module is permanently coupled to the interactive object.

3. The system of claim 1, wherein the interactive object comprises a wearable garment.

4. The system of claim 1, wherein the grid of conductive thread is woven into fabric of the wearable garment.

5. The system of claim 1, wherein the electronic components contained within the external electronics module comprises one or more of a microprocessor, a power source, or a network interface.

6. The system of claim 1, wherein the electronic components contained within the external electronics module comprises:
   a power source configured to provide power to the sensing circuitry, via the communication interface, to enable the sensing circuitry to detect touch-input to the grid of conductive thread;
   a network interface configured to enable communication with a remote computing device; and
   a microprocessor configured to receive data representative of the detected touch-input, via the communication interface, and cause communication of the data to the remote computing device via the network interface.

7. The system of claim 1, wherein the communication interface comprises a connector, the connector comprising:
   a connector plug implemented at the external electronics module; and
   a connector receptacle implemented at the interactive object.

8. The system of claim 7, wherein the connector plug comprises a first printed circuit board coupled to a strip of the anisotropic conducting polymer, wherein the connector receptacle comprises a second printed circuit board comprising circular pads, and wherein the strip of anisotropic conducting polymer is configured to form a connection with the circular pads of the second printed circuit board to enable a connection between the one or more electronic components of the external electronics module and the sensing circuitry of the internal electronics module.

9. The system of claim 7, wherein the connector plug further comprises a magnet configured to form a magnetic connection with the connector receptacle.

10. The system of claim 7, wherein the connector plug is configured to form a snap connection with the connector receptacle.

11. The system of claim 7, wherein the connector plug comprises a snap or a button.

12. An interactive garment, comprising:
    an internal electronics module comprising electronic components configured to detect touch-input to at least a portion of the interactive garment, the electronic components comprising sensing circuitry configured to detect touch-input to the at least a portion of the interactive garment; and
    a communication interface configured to enable communication between the electronic components and additional electronic components contained in an external electronics module that is removably coupled to the interactive garment via the communication interface, the communication enabled based on an electrical connection between the sensing circuitry of the internal electronics module and the additional electronic components of the external electronics module via an anisotropic conducting polymer.

13. The interactive garment of claim 12, wherein the external electronics module comprises a strap that is configured to couple to the interactive garment via a snap or button mechanism.

14. The interactive garment of claim 12, wherein the communication interface comprises a connector, wherein a connector receptacle is implemented at the interactive garment to connect with a connector plug of the external electronics module to enable communication between the electronic components of the interactive garment and the additional electronic components of the external electronics module.

15. The interactive garment of claim 12, wherein the sensing circuitry is configured to detect touch-input to a grid of conductive thread woven into the interactive garment.

16. The interactive garment of claim 15, wherein the additional electronic components contained within the external electronics module comprises:
    a power source configured to provide power to the sensing circuitry, via the communication interface, to enable the sensing circuitry to detect touch-input to the grid of conductive thread;
    a network interface configured to enable communication with a remote computing device; and
    a microprocessor configured to receive data representative of the detected touch-input, via the communication interface, and cause communication of the data to the remote computing device via the network interface.

17. The interactive garment of claim 12, wherein the internal electronics module is permanently coupled to the interactive garment.

18. The interactive garment of claim 12, wherein the interactive garment comprises a jacket.

19. The interactive garment of claim 12, wherein the additional electronic components contained within the external electronics module comprises one or more of a microprocessor, a power source, or a network interface.

20. The interactive garment of claim 12, wherein the internal electronics module includes circular pads that are configured to electrically connect to the anisotropic conducting polymer.

* * * * *